United States Patent
Minakawa et al.

(10) Patent No.: US 9,858,659 B2
(45) Date of Patent: Jan. 2, 2018

(54) PATTERN INSPECTING AND MEASURING DEVICE AND PROGRAM

(71) Applicant: Hitachi High-Technologies Corporation, Minato-ku, Tokyo (JP)

(72) Inventors: Tsuyoshi Minakawa, Tokyo (JP); Takashi Hiroi, Tokyo (JP); Takeyuki Yoshida, Tokyo (JP); Taku Ninomiya, Tokyo (JP); Takuma Yamamoto, Tokyo (JP); Hiroyuki Shindo, Tokyo (JP); Fumihiko Fukunaga, Tokyo (JP); Yasutaka Toyoda, Tokyo (JP); Shinichi Shinoda, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/433,698

(22) PCT Filed: Oct. 11, 2013

(86) PCT No.: PCT/JP2013/077721
§ 371 (c)(1),
(2) Date: Apr. 6, 2015

(87) PCT Pub. No.: WO2014/061575
PCT Pub. Date: Apr. 24, 2014

(65) Prior Publication Data
US 2015/0228063 A1    Aug. 13, 2015

(30) Foreign Application Priority Data
Oct. 15, 2012   (JP) ................................. 2012-227590

(51) Int. Cl.
*G06T 7/00*       (2017.01)
*H01J 37/244*     (2006.01)
(Continued)

(52) U.S. Cl.
CPC ............ *G06T 7/001* (2013.01); *G06K 9/4604* (2013.01); *G06K 9/52* (2013.01); *G06T 7/0002* (2013.01);
(Continued)

(58) Field of Classification Search
CPC . G06T 7/001; G06T 7/12; G06T 2207/30121; G06K 9/52; G06K 9/4604; G06K 9/00; G06K 9/6206; G06K 2209/19
(Continued)

(56) References Cited

U.S. PATENT DOCUMENTS 7,660,455 B2    2/2010   Yamamoto et al.
2004/0081350 A1    4/2004   Kitamura et al.
(Continued)

FOREIGN PATENT DOCUMENTS

JP    9-265931 A    10/1997
JP    2001-147113 A    5/2001
(Continued)

OTHER PUBLICATIONS

International Search Report (PCT/ISA/210) dated Dec. 17, 2013 with English-language translation (Four (4) pages).
(Continued)

*Primary Examiner* — Ruiping Li
(74) *Attorney, Agent, or Firm* — Crowell & Moring LLP

(57) ABSTRACT

Provided is a pattern inspecting and measuring device that decreases the influence of noise and the like and increases the reliability of an inspection or measurement result during inspection or measurement using the position of an edge extracted from image data obtained by imaging a pattern as the object of inspection or measurement. For this purpose, in the pattern inspecting and measuring device in which inspection or measurement of an inspection or measurement object pattern is performed using the position of the edge
(Continued)

extracted, with the use of an edge extraction parameter, from the image data obtained by imaging the inspection or measurement object pattern, the edge extraction parameter is generated using a reference pattern having a shape as an inspection or measurement reference and the image data.

16 Claims, 43 Drawing Sheets

(51) Int. Cl.
*G06K 9/46* (2006.01)
*G06K 9/52* (2006.01)
*G06T 7/13* (2017.01)

(52) U.S. Cl.
CPC .............. *G06T 7/13* (2017.01); H01J 37/244 (2013.01); *G01B 2210/56* (2013.01); *G06T 2207/30168* (2013.01); *H01J 2237/24592* (2013.01); *H01J 2237/2817* (2013.01)

(58) Field of Classification Search
USPC .................................................. 382/151, 149
See application file for complete search history.

(56) References Cited

U.S. PATENT DOCUMENTS

| | | | |
|---|---|---|---|
| 2005/0226494 A1* | 10/2005 | Yamamoto | G06K 9/00 382/149 |
| 2010/0021046 A1 | 1/2010 | Nagahama | |
| 2011/0317924 A1 | 12/2011 | Fukushi et al. | |
| 2013/0120551 A1 | 5/2013 | Yamada et al. | |

FOREIGN PATENT DOCUMENTS

| | | |
|---|---|---|
| JP | 2005-98816 A | 4/2005 |
| JP | 2010-34138 A | 2/2010 |
| JP | 2010-268009 A | 11/2010 |
| JP | 2011-17705 A | 1/2011 |
| JP | 2011-242352 A | 12/2011 |
| JP | 2012-8100 A | 1/2012 |

OTHER PUBLICATIONS

Korean-language Office Action issued in counterpart Korean Application No. 10-2015-7008960 dated Mar. 28, 2016 (six (6) pages).

* cited by examiner

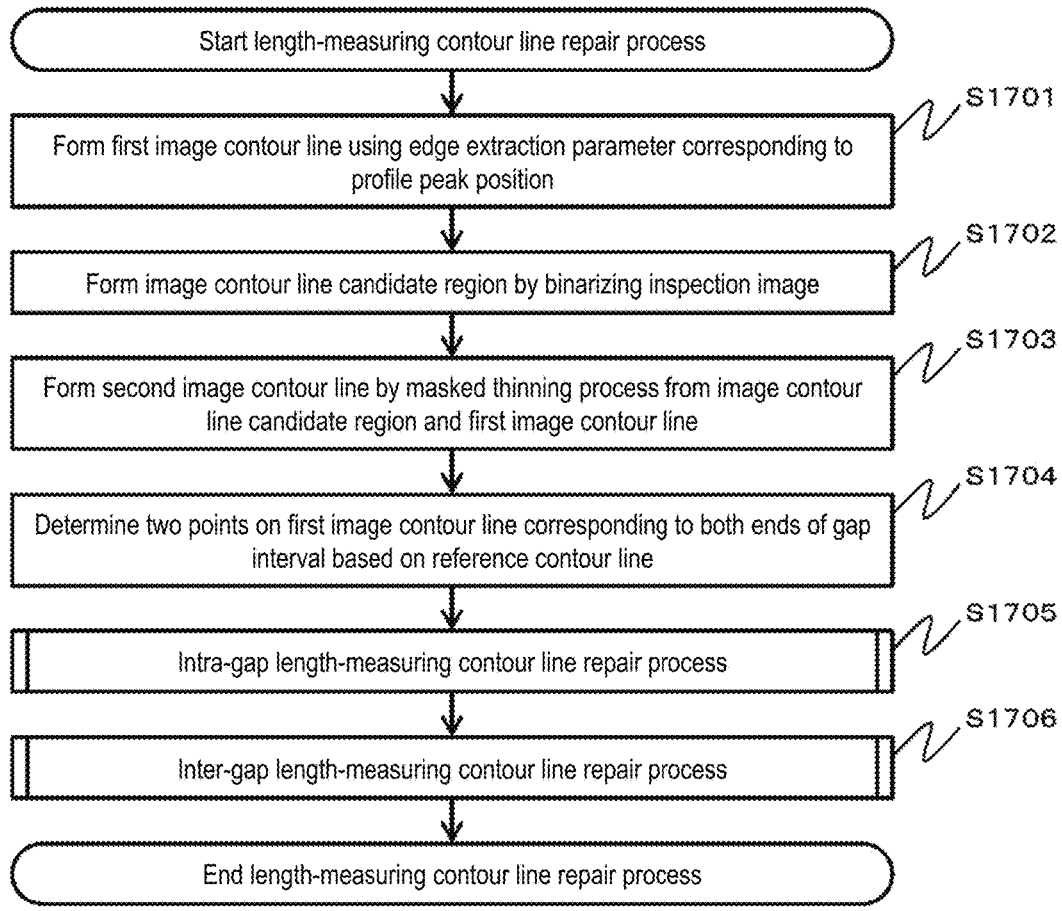
FIG. 17
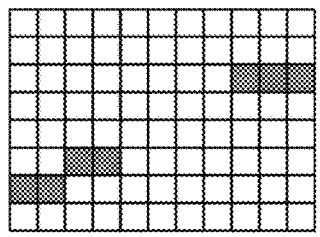
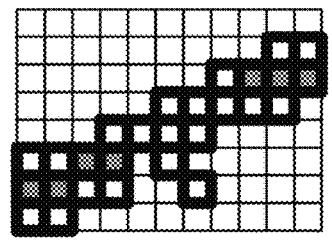
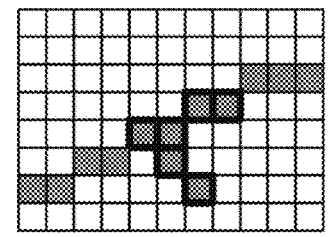
FIG. 18A     FIG. 18B     FIG. 18C

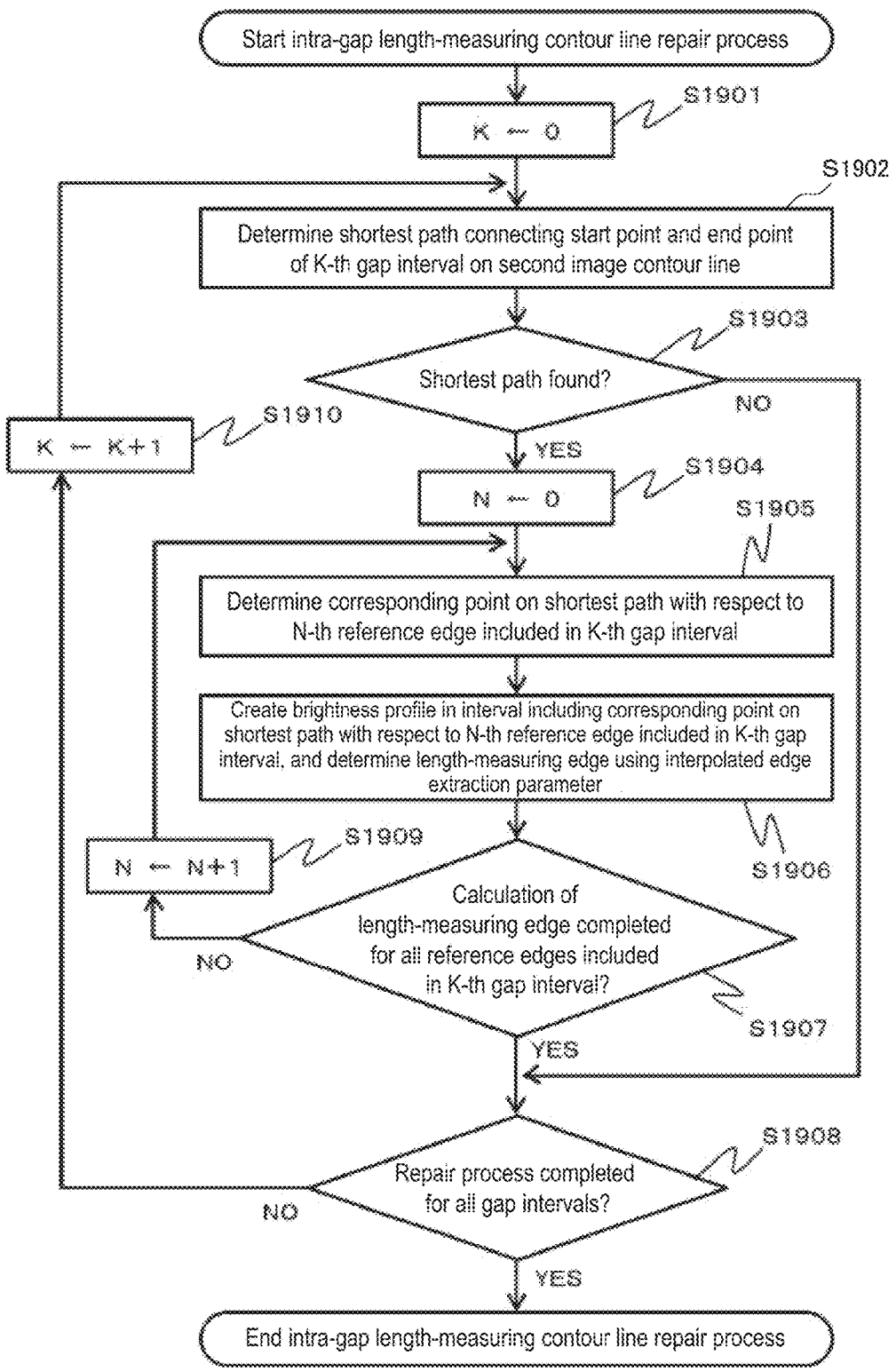

PATTERN INSPECTING AND MEASURING DEVICE AND PROGRAM

TECHNICAL FIELD

The present invention relates to a pattern inspecting and measuring device for inspecting or measuring a pattern using the position of an edge of an inspection or measurement object pattern, and a computer program executed by a computer of the pattern inspecting and measuring device.

BACKGROUND ART

In the field of semiconductor manufacturing, inspecting devices and measuring devices using a scanning electron microscope (SEM) have long been used.

As increasingly finer patterns are transferred on a wafer with the evolution of process rule, the density of patterns formed on the wafer also becomes higher, increasing the number of locations requiring evaluation by dimension measurement. As a result, from the viewpoint of reducing the evaluation time, there is a growing demand for narrowing the locations where the risk of defect development is high, i.e., measurement points that require evaluation with higher magnification ratios, by an inspection involving image acquisition with a relatively large field of view (FOV) (acquisition of a low magnification ratio image) relative to the dimension of the pattern as the object of evaluation. In addition to the trend toward formation of ever finer patterns, the dimension of defects to be detected on an image is on a decreasing trend because of the inspection using the low magnification ratio image.

The measuring device is also used for managing exposure conditions for handling process variations, as well as for evaluating the locations of high risk of defect development using an image acquired at high magnification ratio. As the pattern becomes finer, the measurement value variations permitted for managing the pattern dimension for quality management purpose are in a decreasing trend. The amount of variation permitted for exposure conditions for manufacturing non-defective products is also becoming smaller as the pattern becomes finer. Thus, for the purpose of managing exposure conditions too, the permitted variations in measurement values are in a decreasing trend.

Further, as the shape of the pattern transferred on the wafer becomes more complex, the uses are increasing, for both the inspecting device and the measuring device, where evaluation of shape as a two-dimensional feature rather than evaluation of dimension as a one-dimensional feature is required. In the case of shape evaluation, normally, a given contour shape as an evaluation reference and a contour shape extracted from an image obtained by imaging a pattern as the object of evaluation are compared. The comparison is inherently one of different types of data of geometric information and image information. In addition, there is the factor of process variations and the like. Consequently, a phenomenon often develops in which the two contour shapes are different.

Against such background, Patent Literature 1 discloses an example of a technology for performing inspection by contour shape comparison using design data. According to the technology disclosed in Patent Literature 1, the amount of deformation of a pattern is considered separately in terms of a global amount of deformation and a local amount of deformation, and defect inspection is performed using the local amount of deformation.

CITATION LIST

Patent Literature

Patent Literature 1: JP 2010-268009 A (the specification of U.S. Pat. No. 7,660,455)

SUMMARY OF INVENTION

Technical Problem

When the technology disclosed in Patent Literature 1 is used, there is the possibility of false alert.

According to an analysis by the inventor, one cause for this is that the "second contour line" in the technology described in Patent Literature 1 is formed by using an edge extracted, with the use of a predetermined threshold value, from a profile acquired from an image. According to the technology described in Patent Literature 1, when the shape of the profile is the same regardless of location, the amount of global pattern deformation exhibits a value reflecting an overall thickening of a pattern due to discrepancy of the amount of exposure during pattern formation from an optimum value. Thus, a desired result can be obtained by inspection using a local amount of deformation obtained by subtracting the global amount of pattern deformation from the overall amount of deformation.

However, the shape of the profile obtained from the image may be varied by various factors. For example, there is the influence of various noises during image acquisition. Further, because an edge effect appears in a pronounced manner at a portion with large pattern curvature, the profile shape varies depending on the shape of the side wall including roughness, and also depending on the two-dimensional pattern shape. In addition, the amount of detected secondary electron is influenced by the charge state of the sample during imaging. Thus, in the case of a line pattern perpendicular to the direction of electron beam scan, for example, a profile corresponding to the side wall on the right side and a profile corresponding to the side wall on the left side have different shapes. Conventional technology, such as the technology disclosed in Patent Literature 1, may be strongly subject to such influence, possibly resulting in the generation of false alert.

Furthermore, the shape of the profile may differ depending on imaging conditions, such as acceleration voltage and probe current, in addition to the above-described factors. Also, the shape of the profile may differ depending on individual differences of the imaging device. These factors mainly have a global influence and may appear not to lead to the generation of false alert. However, in the case of inspection based on comparison with design data, a false alert may be generated due to such factors for the following reason. For example, when a contour shape determined using a threshold value method and a contour shape generated from design data are compared, what threshold value should be used to extract the contour shape for the comparison is typically designated by an inspection recipe and the like. However, when the shape of the profile is varied, there is the possibility that a threshold value different from the pre-designated threshold value becomes an appropriate threshold value as a result of the variation. In such a case, namely if the contour shape is determined using an inappropriate threshold value, a false alert could be generated by the conventional technology, such as the technology disclosed in Patent Literature 1.

From the above analysis, the inventor considered the nature of the problem in terms of the fact that, during inspection or measurement using an edge extracted from a profile, which is acquired from an image obtained by imaging a pattern as the object of evaluation, with the use of a certain threshold value (more generally, an edge extraction parameter), the threshold value is not necessarily suitable for the inspection or measurement.

In view of the above analysis, there are proposed below a pattern inspecting and measuring device and a computer program for the purpose of decreasing the influence of noise and the like and increasing the reliability of inspection or measurement result during inspection or measurement using the position of an edge extracted from an image obtained by imaging a pattern as the object of inspection or measurement.

Solution to Problem

In order to solve the problem, the following configurations described in the claims are adopted, for example.

The present application includes a plurality of means for solving the problem. For example, in a pattern inspecting and measuring device that performs inspection or measurement of an inspection or measurement object pattern using the position of an edge extracted, with the use of an edge extraction parameter, from image data obtained by imaging the inspection or measurement object pattern, the edge extraction parameter is generated using a reference pattern having a shape as an inspection or measurement reference and the image data.

Advantageous Effects of Invention

According to the present invention, during inspection or measurement using the position of the edge extracted from the image data obtained by imaging the pattern as the object of inspection or measurement, the influence of noise and the like can be decreased, and the reliability of an inspection or measurement result can be increased.

Other problems, configurations, and effects will become apparent from the following description of embodiments.

BRIEF DESCRIPTION OF DRAWINGS

FIG. 15(a) illustrates an initial state. FIG. 15(b) illustrates a state in which defect candidates have been detected using a first defect determination threshold value. FIG. 15(c) illustrates a state in which the defect candidates have been expanded using a second defect determination threshold value.

FIG. 16(a) shows an image of a drawing of a reference pattern; FIG. 16(b) shows an inspection image; FIG. 16(c) shows an image indicating information concerning a region detected as a defect.

FIG. 17 is a flowchart illustrating an operation concerning a length-measuring contour line repair process as part of the operation of a contour line forming unit included in the operating device according to a first modification of the first embodiment.

FIGS. 18A-18C illustrate an operation concerning a masked thinning process in the length-measuring contour line repair process, as part of the operation of the contour line forming unit included in the operating device according to the first modification of the first embodiment.

FIG. 19 is a flowchart illustrating an operation concerning, as part of the operation of the contour line forming unit included in the operating device according to the first modification of the first embodiment, an intra-gap length-measuring contour line repair process in the length-measuring contour line repair process.

FIG. 44($a$) illustrates a state in which bridging is caused. FIG. 44($b$) illustrates a state in which necking is caused.

FIG. 44($a$) illustrates a sample as the object of inspection. FIG. 44($b$) illustrates an inspection image acquisition method in an inspection object range. FIG. 44($c$) illustrates a conventional inspection image. FIG. 44($d$) illustrates an inspection image in the second modification of the first embodiment. FIG. 44($e$) illustrates an inspection image in a case where longitudinal and lateral directions of a die are inclined relatively to the direction of movement of a stage.

DESCRIPTION OF EMBODIMENTS

Figure 1:
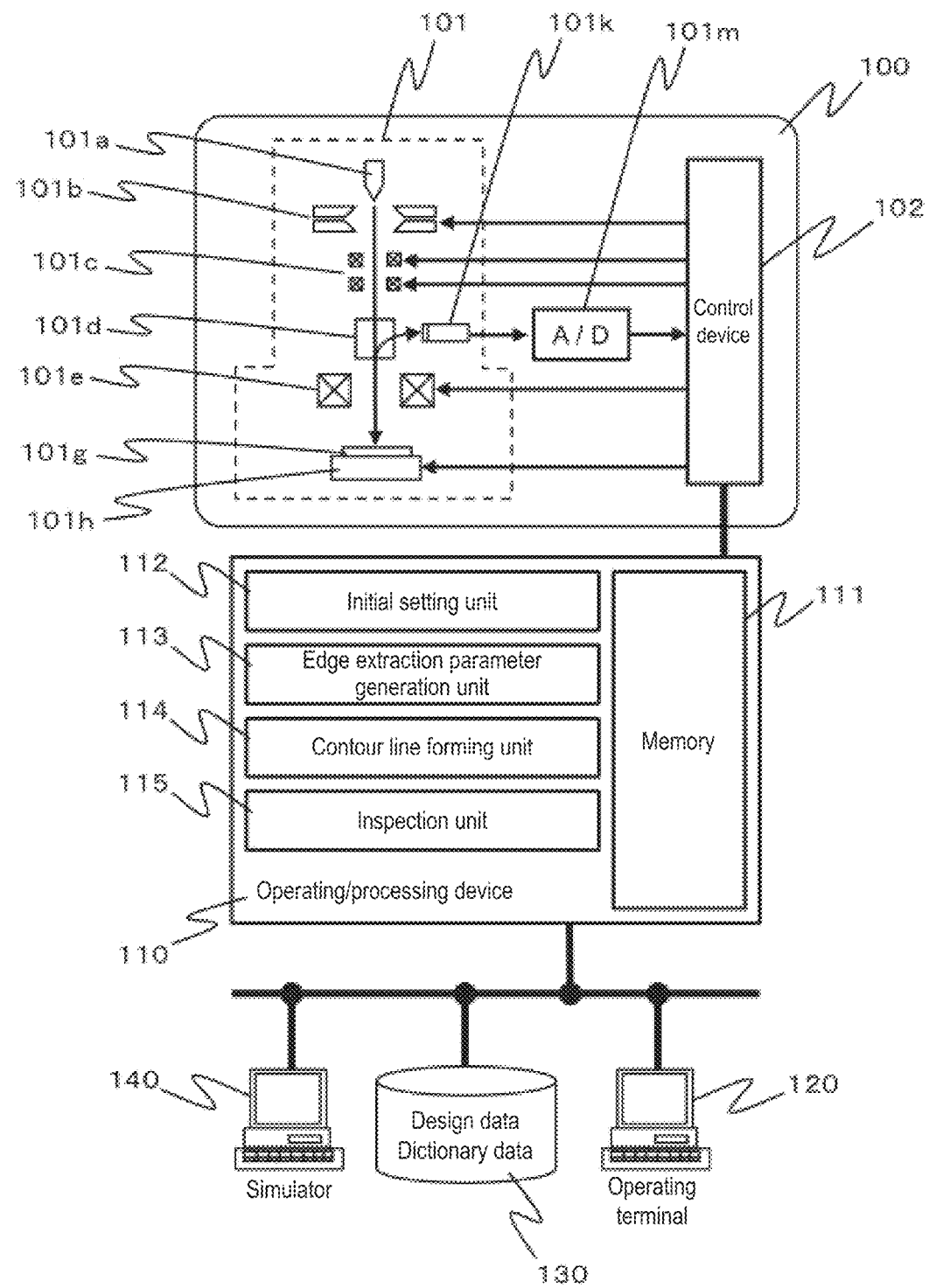
FIG. 1 illustrates a configuration of a pattern inspecting device according to a first embodiment.

In the examples described below, a description will be given mainly of a pattern inspecting and measuring device for decreasing the influence of noise and the like and increasing the reliability of an inspection or measurement result during inspection or measurement using the position of an edge extracted from image data obtained by imaging a pattern as the object of inspection or measurement, and a computer program for causing a computer to execute the above process.

In order to achieve the above purpose, in the examples described below, there will be described mainly a pattern inspecting and measuring device in which inspection or measurement of an inspection or measurement object pattern is performed using the position of an edge extracted, with the use of an edge extraction parameter, from image data obtained by imaging an inspection or measurement object pattern, wherein the edge extraction parameter is generated using a reference pattern having a shape as an inspection or measurement reference and the image data, and a computer pro gram.

First Example

First Embodiment

In the following, a first embodiment will be described with reference to FIG. 1 to FIG. 16. The present embodiment is an example of a pattern inspecting device which may be suitably used for extracting, by inspection involving image acquisition in a relatively large field of view with respect to the dimension of a pattern as the object of evaluation (image acquisition at low magnification ratio), a pattern region or a "defect region" (region with high risk of defect development) which is locally deformed with respect to a contour shape given in advance as an inspection reference.

As the semiconductor process rule evolves and increasingly finer patterns are transferred on a wafer, there is a growing need for inspection using design data so as to detect systematic defect caused by mask design flaw and the like. This is because, in addition to a decrease in the margin for parameter setting for mask design or transfer, making it easier for systematic defect to be caused, the importance of measures against systematic defects is increasing because the problem of systematic defects, as opposed to random defects, can be efficiently addressed by identifying the cause and implementing an improving measure. In the case of systematic defect, a defect is generated similarly for all dies. Thus, the defect cannot be detected by the conventional inspection involving comparison of dies, and can only be detected by inspection based on comparison with design data. From the inspection perspective too, there is a growing need for inspection of two-dimensional shapes as well as inspection of dimension as a one-dimensional feature. During such inspection, due to the inspection using a low magnification ratio image in addition to the trend toward finer patterns, the dimension of defect to be detected on the image is on a decreasing trend, as mentioned above.

When a locally deformed pattern region is extracted as a defect region by comparison with design data, it is necessary to separate the influence of pattern thickening or thinning due to variations in the focal distance or the amount of exposure within the shot. According to the technology disclosed in Patent Literature 1, such influence is separated from the amount of local pattern deformation as the amount of global pattern deformation, and defect inspection is performed using the amount of local pattern deformation. While this is effective in addressing the problem, there is also the problem described above.

Furthermore, from the viewpoint of decreasing the evaluation time, the inspection may involve the use of an image acquired while the stage (sample base) is moved. In this case, due to various factors such as the non-uniform speed of movement of the stage, the pattern shape on the image obtained by imaging a pattern may be distorted with respect to the actual shape of the pattern on the wafer. While such distortion is normally corrected before comparison with design data, residual distortion may remain in the form of a sufficiently small deformation relative to the dimension of the defect to be detected.

Based on the analysis described above, the present embodiment solves the problem as will be described below.

[Configuration of Pattern Inspecting Device]

FIG. 1 illustrates a configuration of a pattern inspecting device according to the present embodiment, which is an example of a pattern inspecting device in which an SEM is used as an imaging device. The pattern inspecting device according to the present embodiment includes an imaging device 100 provided with an SEM 101 and an SEM control device 102, an operating/processing device 110, an operation terminal 120, and a storage device 130.

The SEM 101 includes an electron gun 101a, a condenser lens 101b, a deflector 101c, an ExB deflector 101d, an objective lens 101e, a stage 101h, and a secondary electron detector 101k. A primary electron beam emitted by the electron gun 101a is converged by the condenser lens 101b and irradiated via the deflector 101c, the ExB deflector 101d, and the objective lens 101e, forming a focal point on a sample (wafer) 101g placed on the stage 101h. As the electron beam is irradiated, secondary electrons are generated from the sample 101g. The secondary electrons generated from the sample 101g are deflected by the ExB deflector 101d, and then detected by the secondary electron detector 101k. The secondary electrons generated from the sample are detected in synchronism with a two-dimensional scan of the electron beam by the deflector 101c, or in synchronism with a repetitive operation of the electron beam in the X-direction by the deflector 101c and with continuous movement of the sample 101g in the Y-direction by the stage 101h. As a result, a two-dimensional electron beam image is obtained. A signal detected by the secondary electron detector 101k is converted by an A/D convertor 101m into a digital signal which is then sent to the operating/processing device 110 via the control device 102.

The control device 102 enables an electron beam scan under desired conditions by controlling the SEM 101. The control device 102 supplies a deflecting signal to the deflector 101c for setting a scan position at a desired position on the sample. In accordance with the supplied signal, the deflector 101c changes a field of view dimension (magnification ratio) to a desired dimension. The control device 102 sends to the operating/processing device 110 an inspection image obtained by arranging detection signals obtained by the detector 101k in synchronism with the scan by the deflector 101c.

The configuration of the SEM 101 and the control device 102 is not limited to the illustrated configuration and may include any configuration such that an inspection image obtained by imaging the sample 101g under desired conditions can be supplied to the operating/processing device 110.

Figure 2:
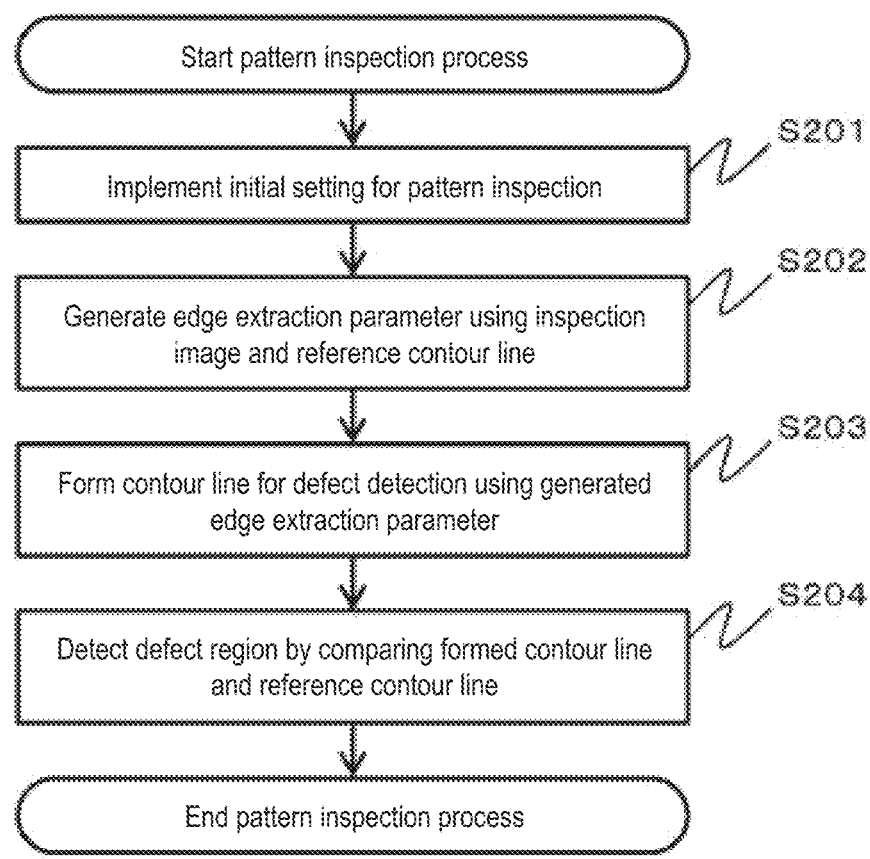
FIG. 2 is a flowchart of an operation of the pattern inspecting device according to the first embodiment.

The operating/processing device 110 includes a memory 111; an initial setting unit 112 that executes a process such as step S201 of FIG. 2; an edge extraction parameter generation unit 113 that executes a process such as step S202 of FIG. 2; a contour line forming unit 114 that executes a process such as step S203 of FIG. 2; and an inspection unit 115 that executes a process such as step S204 of FIG. 2. The operating/processing device 110 inspects a pattern formed on the sample 101g by comparing an inspection image input from the imaging device 100 with a reference contour line formed from design data stored in the storage device 130. Information necessary for the processes executed in the operating/processing device 110 may be stored in the memory 111 in the operating/processing device 110 as an inspection recipe. The recipe includes an operating program for causing the pattern inspecting device to be automatically operated. The recipe may be stored in the memory 111 or an external storage medium for each type of the sample as the object of inspection, and is read as needed.

The operating/processing device 110 is connected to the operation terminal 120 which is provided with an input means such as a keyboard. The operating/processing device 110 has the function of receiving an input from the operator via the input means, and displaying an image or an inspection result and the like to be presented to the operator on a display device provided in the operation terminal 120. These functions may be implemented using a graphical interface called graphical user interface (GUI), for example.

Some or all of controls or processes in the operating/processing device 110 may be implemented by allocating the controls or processes to an electronic computer and the like provided with a CPU and a memory capable of accumulating images. The operation terminal 120 also functions as an imaging recipe creating device that creates, either manually or by using electronic device design data stored in the storage device 130, an imaging recipe which may include the coordinates of an electronic device necessary for inspection, dictionary data (as will be described later) for pattern matching utilized for positioning purpose, and photography conditions.

The storage device 130 stores the design data and the dictionary data, and may include a hard disk, for example. According to the present embodiment, the design data refers to data for defining a two-dimensional contour shape as an inspection evaluation reference, and is not limited to the electronic device design data per se. For example, the design data may include a layout pattern describing the layout of a pattern figure to be formed on the wafer; a contour shape determined by a method such as lithography simulation from a mask pattern shape formed on the basis of the electronic device design data; or a contour shape extracted from a non-defective pattern. In the present embodiment, as the design data, a curve (which may include a broken line or a polygon) forming the outline of an exposure pattern obtained by a lithography simulator is used. The design data is configured to include the number of pattern figures; the coordinates of vertexes included in each pattern figure; and information about connection relationship of the vertexes, so that a polygon representing the contour shape as the evaluation reference can be defined. The connection relationship information is configured as orientation-attached information so that the inside and outside of a pattern can be distinguished. Further, as will be described below (FIG. 2), there is also stored dictionary data, which is geometric information concerning a region used as a template during positioning by the initial setting unit 112 between the reference contour line and the inspection image, in association with a reference pattern. The dictionary data includes, for example, coordinate information of the center position of a region and region dimension information. Specifically, information concerning one or more regions suitable as a template region that have been extracted in view of "uniqueness in a search range", for example, is generated and stored in advance. By retaining the information of the template for positioning as dictionary data rather than as image data, the amount of data to be retained can be reduced compared with a case where the information is retained as image data.

As needed, the configuration may include a simulator 140 that determines the pattern shape formed on the wafer on the basis of the design data stored in the storage device 130. In such configuration, when the difference between the two-dimensional contour shape determined by the design data initially stored in the storage device 130 and the pattern shape expected to be formed on the wafer is large, the pattern shape expected to be formed on the wafer can be determined by the simulator 140 from the initially stored design data to obtain a reference pattern as the inspection evaluation reference. Thus, false alert can be decreased and inspection reliability can be increased.

[Operation of Pattern Inspecting Device]

An operation of the pattern inspecting device according to the present embodiment will be described with reference to FIG. 2. FIG. 2 is a flowchart of the operation of the pattern inspecting device according to the present embodiment.

As the pattern inspection process is started, initially, in step S201, the initial setting unit 112 performs initial setting of an inspection image and a reference pattern. Specifically, the process concerning the initial setting of the inspection image and the reference pattern is as follows.

First, the initial setting unit 112 reads an inspection image from the imaging device 100, and implements preprocessing as needed. The preprocessing includes, for example, a smoothing process for noise removal. The preprocessing may be suitably implemented using known technology.

The initial setting unit 112 then reads the design data from the storage device 130 in a range corresponding to the inspection image, and, after performing a design data deforming process, such as a pattern figure edge rounding process as needed, determines a reference contour line on the basis of the design data after deformation. The reading of the design data in the range corresponding to the inspection image includes reading all design data such that a part of the polygon representing the contour shape as the evaluation reference could be included in the range corresponding to the inspection image (the range taking into consideration a margin corresponding to a position error at the time of inspection image acquisition, for example), using the vertex coordinates and connection relationship information in the design data. Namely, not just the data such that, of the sides of the polygon, at least one vertex is included in the range corresponding to the inspection image, but also data such that a part of the sides intersects the range corresponding to the inspection image are read. The reference contour line is a connection of reference edges based on the design data, and provides a reference pattern as the inspection reference in the present embodiment. Of the operation of the initial setting unit 112, an operation concerning a process of determining the reference contour line on the basis of the design data (reference contour line forming process) will be described later (see FIG. 3).

The initial setting unit 112 further reads the dictionary data from the storage device 130 in the range corresponding to the inspection image, and implements positioning of the reference contour line and the inspection image. The positioning of the reference contour line and the inspection image may be implemented using known technology. For example, template matching using a normalized cross-correlation value as an evaluation value may be used. In this case, the template image may be one obtained by, for example, determining a region suitable for positioning with reference to the dictionary data, drawing a reference contour line included in the region on an image, and then blurring the reference contour line using a smoothing filter, such as a Gaussian filter. In another example of the method of positioning the reference contour line and the inspection image, a reference contour line included in the region suitable for positioning which is determined with reference to the dictionary data and a contour line extracted from the inspection image using a Sobel filter and the like may be positioned by a contour line matching technique. The contour line matching may be accurately implemented by using a two-stage technique using generalized Hough transform for coarse search and an iterative closest point (ICP) algorithm for fine search. Alternatively, template matching using a normalized cross-correlation value as the evaluation value may be implemented. In this case, a template image is obtained by drawing on an image the reference contour line which is determined with reference to the dictionary data and included in the region suitable for positioning, and blurring the reference contour line using a smoothing filter such as a Gaussian filter, whereas a searched image is obtained by drawing a contour line extracted from the inspection image using a Sobel filter and the like on an image, and blurring the contour line using a smoothing filter such as a Gaussian filter. The method of positioning of the reference contour line and the inspection image is not limited to the above, and the positioning may be implemented by various other methods. When there is a plurality of "regions suitable for positioning" determined with reference to the dictionary data, one of the regions may be used for positioning; a final positioning result may be determined from the result of independent positioning in each region; or a plurality of regions may be combined for simultaneous positioning.

Then, in step S202, the edge extraction parameter generation unit 113 generates an edge extraction parameter. Specifically, the process of step S202 includes determining one edge extraction parameter for each reference edge, using the inspection image and the reference contour line that are in a positioned state. In the present embodiment, because the contour line forming unit 114 uses a threshold value method, the "threshold value" as a parameter used when extracting an edge by the threshold value method provides the edge extraction parameter. The edge extraction parameter is calculated such that the edge extracted from the inspection image in a normal portion and the reference edge are substantially aligned. The operation of the edge extraction parameter generation unit 113 will be described later (see FIG. 6).

Thereafter, in step S203, the contour line forming unit 114, using the edge extraction parameter generated in step S202, extracts a length measuring edge (which will be described later), and forms a length-measuring contour line (which will be described later). Specifically, the process of step S203 is a process of determining, from a brightness profile generated for each reference edge, an edge used in the process in the inspection unit 115 on the basis of the edge extraction parameter corresponding to the reference edge. In the following description, particularly the edge determined using the brightness profile will be referred to as a "length measuring edge". In the present example, because the value of an edge placement error (EPE, which corresponds to the distance from the reference edge to the length measuring edge in the present embodiment) is referenced in the process of the inspection unit 115 which will be described later, only the distance from the reference edge to the length measuring edge is determined. However, depending on the purpose of inspection or measurement, the length measuring edge may be determined as a string of two-dimensional coordinates in the coordinate system of the inspection image, the coordinates may be linked in accordance with the way the reference edges are linked, and then handled as a contour line. Such a link of length measuring edges will be referred to as a "length-measuring contour line". By handling as a contour line, a geometric smoothing process can be implemented using known technology such as curve approximation, whereby disturbance in the shape of the contour line due to the influence of noise can be decreased. Further, by defining, as needed, the way the EPE is measured not in terms of a "point-to-point" distance but in terms of a "point-to-polygon" or a "polygon-to-polygon" distance, the EPE measurement accuracy can also be increased. Further, intersection of line segments intersecting each other may be detected, and a process of deleting or moving the length measuring edges, or modifying the order of their arrangement may be implemented so as to eliminate the intersection. By additionally performing such processes, when it is desired to grasp a shape difference using the area of a disagreeing portion of the reference contour line and the length-measuring contour line as an index, for example, it becomes possible to increase the reliability of the index. In the following description of processes in the present specification, in view of such modifications, the length-measuring contour line is formed even when it is not necessarily required to form the length-measuring contour line after extraction of a length measuring edge.

Thereafter, in step S204, the inspection unit 115 inspects the pattern by comparing the length-measuring contour line formed by the contour line forming unit 114 and the reference contour line, outputs information concerning a region determined to be a defect region as an inspection result, and ends the pattern inspection process. Of the operation of the inspection unit 115, the pattern inspection operation comparing the length-measuring contour line and the reference contour line will be described later with reference to FIG. 14 and FIG. 15. Of the operation of the inspection unit 115, the operation concerning the output of the inspection result will be described later with reference to FIG. 16.

[Operation Concerning Reference Contour Line Forming Process as Part of Operation of Initial Setting Unit 112]

An operation concerning a reference contour line forming process as part of the operation of the initial setting unit 112 will be described with reference to FIG. 3 to FIG. 5.

Figure 3:
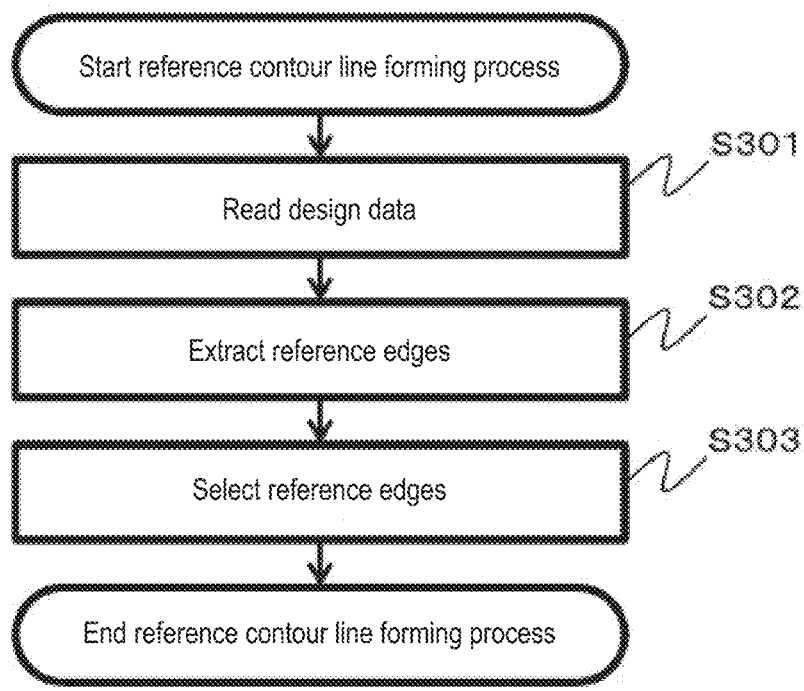
FIG. 3 is a flowchart of an operation concerning a reference contour line forming process as part of an operation of an initial setting unit included in an operating device of the pattern inspecting device according to the first embodiment.

FIG. 3 is a flowchart of an operation concerning a reference contour line forming process as part of the operation of the initial setting unit 112 included in the operating/processing device 110 according to the present embodiment.

As the reference contour line forming process is started, in step S301, the initial setting unit 112 reads the design data from the storage device 130, and stores the number of pattern figures that have been read in a counter MJ.

In step S302, the initial setting unit 112 extracts reference edges. The reference edges are extracted at maximum and regular intervals not exceeding a given maximum interval, for each pattern figure included in the design data. The reference edge may be configured to be extracted such that the density is varied in accordance with curvature, namely, such that the density of portions with high curvature is higher than the density of portions with low curvature. In this case, the shape of a portion with high curvature can be better reflected in the extracted contour. The details of the process of step S302 will be described later (see FIG. 5).

In step S303, the initial setting unit 112 selects the reference edges. This is a process of selecting, from among the reference edges extracted in step S302, only those reference edges that could be included in an inspection range, and registering successive reference edges as one segment. In consideration of position error correction, the reference edges included in a range wider than the imaging range of the inspection image (FOV) by a predetermined width are selected. In step S303, the initial setting unit 112 increments the value of the counter MS that has been initialized to "0" by "1" each time a segment is registered so as to make the counter MS value correspond to the number of segments that are to be made the object of processing. Also, the number NS of the reference edges included in an S-th segment is stored in association with the segment.

The contents of the processes of step S302 and step S303 will be described with reference to FIG. 4.

Figure 4:
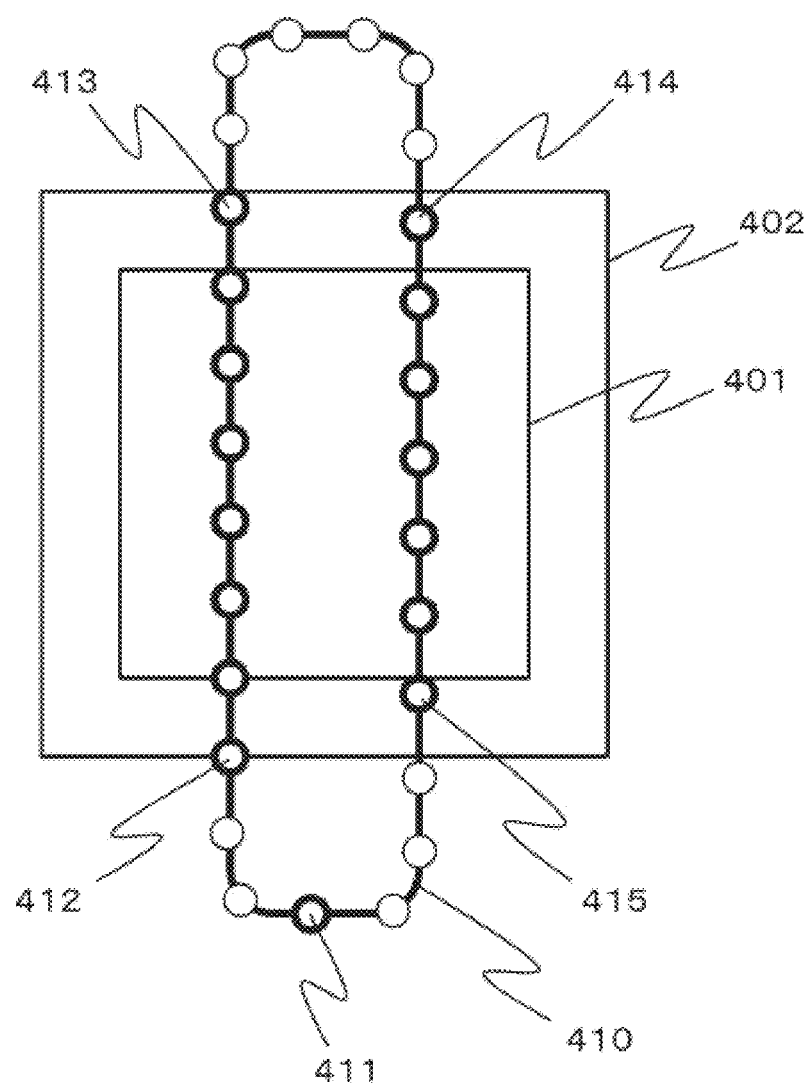
FIG. 4 illustrates a reference edge extraction method and reference edge selection method in a reference contour line forming process as part of the operation of the initial setting unit included in the operating device of the pattern inspecting device according to the first embodiment.

FIG. 4 illustrates, as part of the operation of the initial setting unit 112 included in the operating/processing device 110 according to the present embodiment, a reference edge extraction method and a reference edge selection method in the reference contour line forming process.

In FIG. 4, a rectangle 401 is the imaging range of the inspection image (FOV). A rectangle 402 corresponds to the rectangle 401 as enlarged, with respect to each of the upper-lower and left-right directions, by distances corresponding to the sum of the maximum amount of position error and the maximum interval of the reference edges that could be assumed in view of the specifications.

A figure 410 is a pattern figure which is expressed as a polygon forming a directed cycle. Depending on whether on the right side or left side of a directed side, the inside and outside of the pattern can be distinguished. In the example of FIG. 4, the pattern is oriented in clockwise direction.

The reference edge 411 is a reference edge corresponding to a vertex that is initially registered of the data of the FIG.

410. In the process of step S302, a reference edge group including reference edges 412 to 415 is extracted at regular intervals from the reference edge 411 as the start point and along the direction of the directed side.

In the process of step S303, with respect to each of the reference edges included in the extracted reference edge group, it is determined whether the reference edge is included in the rectangle 402. Of the reference edges determined to be included in the rectangle 402, a string of successive reference edges is registered as one segment. Specifically, a string of reference edges from the reference edge 412 to the reference edge 413 is registered as one segment, and a string of reference edges from the reference edge 414 to the reference edge 415 is registered as another segment.

Figure 5:
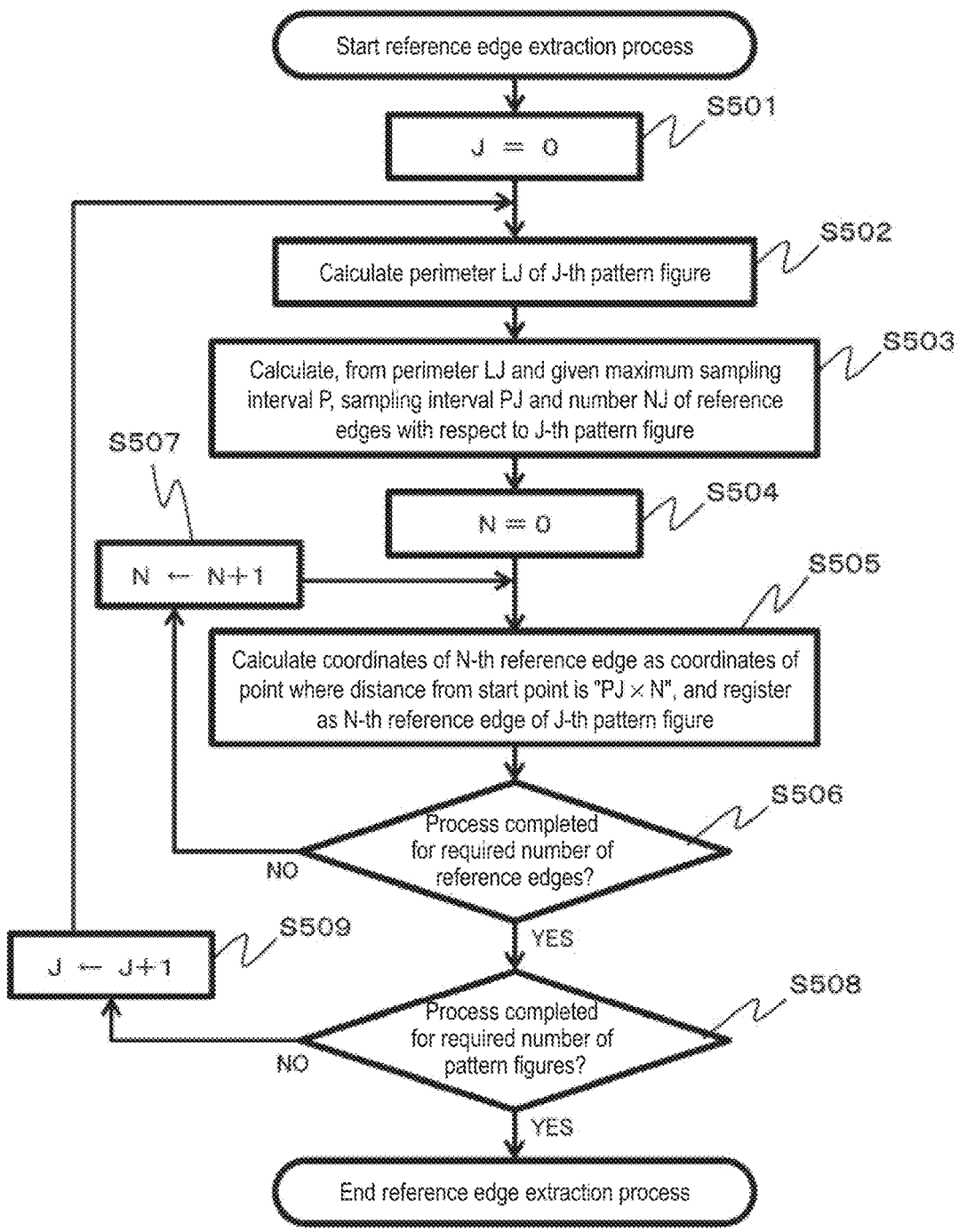
FIG. 5 is a flowchart of an operation concerning a reference edge extraction process in the reference contour line forming process as part of the operation of the initial setting unit included in the operating device of the pattern inspecting device according to the first embodiment.

FIG. 5 is a flowchart illustrating an operation concerning the reference edge extraction process (S302) in the reference contour line forming process as part of the operation of the initial setting unit 112 included in the operating/processing device 110 according to the present embodiment.

In step S501, the initial setting unit 112 sets the value of a counter J, which is a counter for identifying the pattern figure as the object of processing, to "0".

In step S502, the initial setting unit 112 computes a perimeter LJ of the J-th pattern figure. The perimeter LJ of the pattern figure may be computed using a known method.

In step S503, the initial setting unit 112 calculates a sampling interval PJ and the number NJ of reference edges with respect to the J-th pattern figure from the perimeter LJ and a given maximum sampling interval P. Specifically, if LJ is divisible by P, the reference edges are located at positions dividing the shortest path into (LJ/P) equal parts. In this case, PJ is equal to P, and NJ is (P/LJ+1) because both ends are included. If LJ is not divisible by P, PJ and NJ may be calculated similarly considering that the reference edges are located at positions dividing the shortest path into (LJ/P+1) equal parts. In the present embodiment, the value of P is 0.5 pixel; however, the value of P is not limited to the above.

In step S504, the initial setting unit 112 sets the value of the counter N, which is a counter for identifying the reference edge as the object of processing, to "0".

In step S505, the initial setting unit 112 calculates the coordinates of the N-th reference edge as the coordinates of a point at which the distance from the start point is "PJ×N", and registers the coordinates as the N-th reference edge of the J-th pattern figure.

In step S506, the initial setting unit 112 determines whether the processing has been completed for a required number of reference edges, by comparing the counter N with the number NJ of the reference edges. If the processing has been completed for the required number of reference edges (step S506: YES), the initial setting unit 112 proceeds to the process of step S508. If there is a reference edge that has not been processed (step S506: NO), the initial setting unit 112 proceeds to step S507, increments the value of the counter N by "1", and then proceeds to step S505 to continue the processing.

In step S508, the initial setting unit 112 determines whether the processing has been completed for the required number of pattern figures, by comparing the counter J with the counter MJ indicating the number of the pattern figures that have been read. If the processing has been completed for the required number of pattern figures (step S508: YES), the initial setting unit 112 ends the reference edge extraction process. If there is a pattern figure that has not been processed (step S508: NO), the initial setting unit 112 proceeds to step S509, increments the value of the counter J by "1", and then proceeds to step S502 to continue the processing.

[Operation of the Edge Extraction Parameter Generation Unit 113 Included in the Operating/Processing Device 110]

The operation of the edge extraction parameter generation unit 113 will be described with reference to FIG. 6 to FIG. 13.

Figure 6:
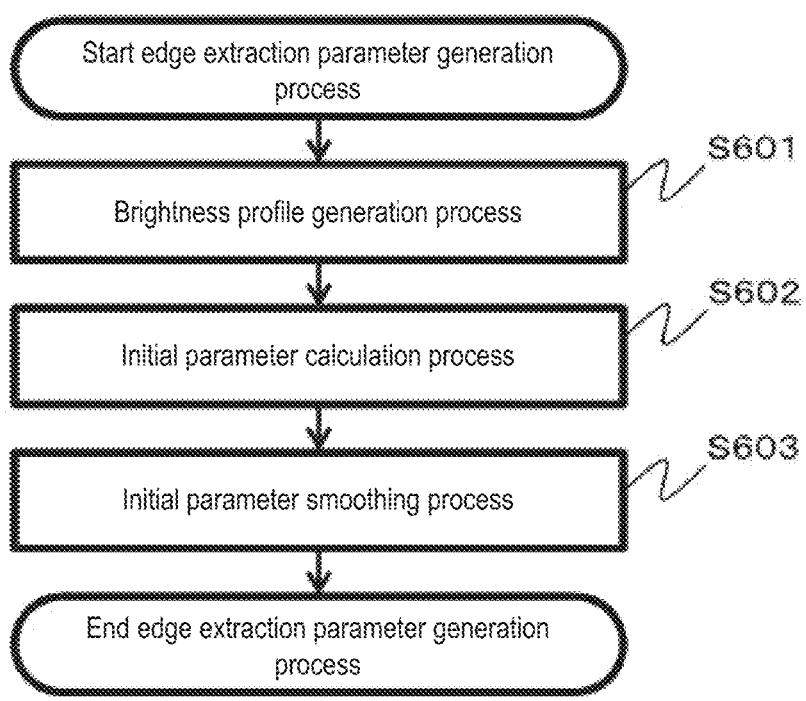
FIG. 6 is a flowchart of an operation of an edge extraction parameter generation unit included in the operating device of the pattern inspecting device according to the first embodiment

FIG. 6 is a flowchart of the operation of the edge extraction parameter generation unit 113 included in the operating/processing device 110 according to the present embodiment.

In step S601, the edge extraction parameter generation unit 113 determines, for each reference edge, a direction for acquiring a brightness profile, and generates the brightness profile. The process of step S601 will be described later (see FIG. 7).

In step S602, the edge extraction parameter generation unit 113, using the inspection image and a reference contour line, performs an initial parameter calculation process. The process of step S602 will be described later (see FIG. 9).

Figure 13A:
FIGS. 13A-13C illustrate an example of an initial parameter and an edge extraction parameter in the pattern inspecting device according to the first embodiment.
Figure 13B:
Figure 13C:
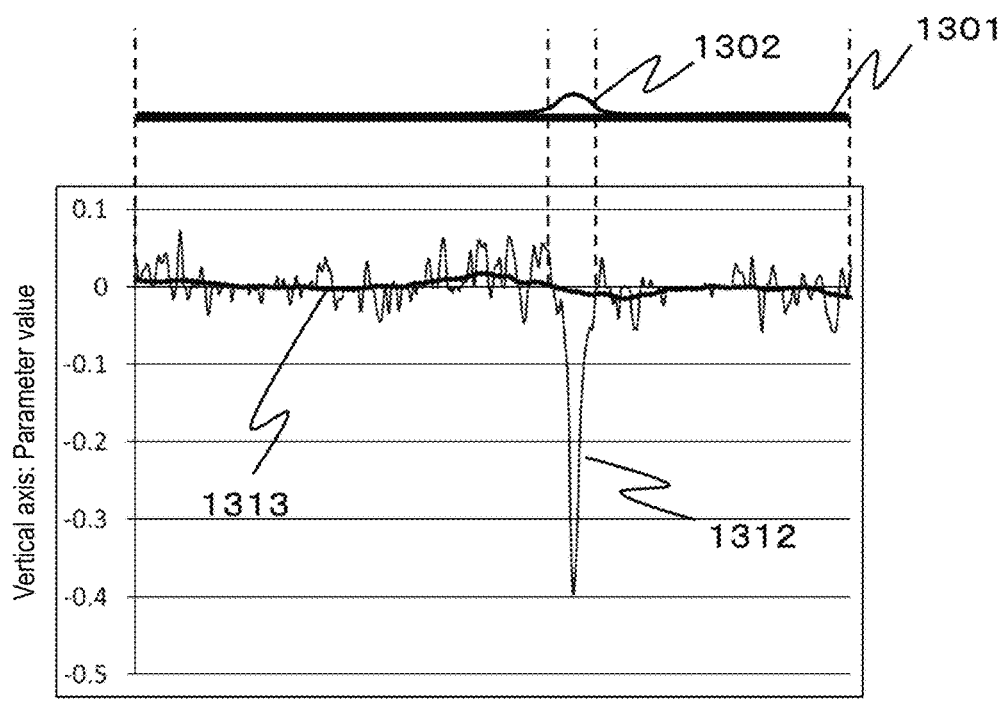

In step S603, the edge extraction parameter generation unit 113 performs an initial parameter smoothing process. The process of step S603 will be described later (FIG. 13).

Figure 7:
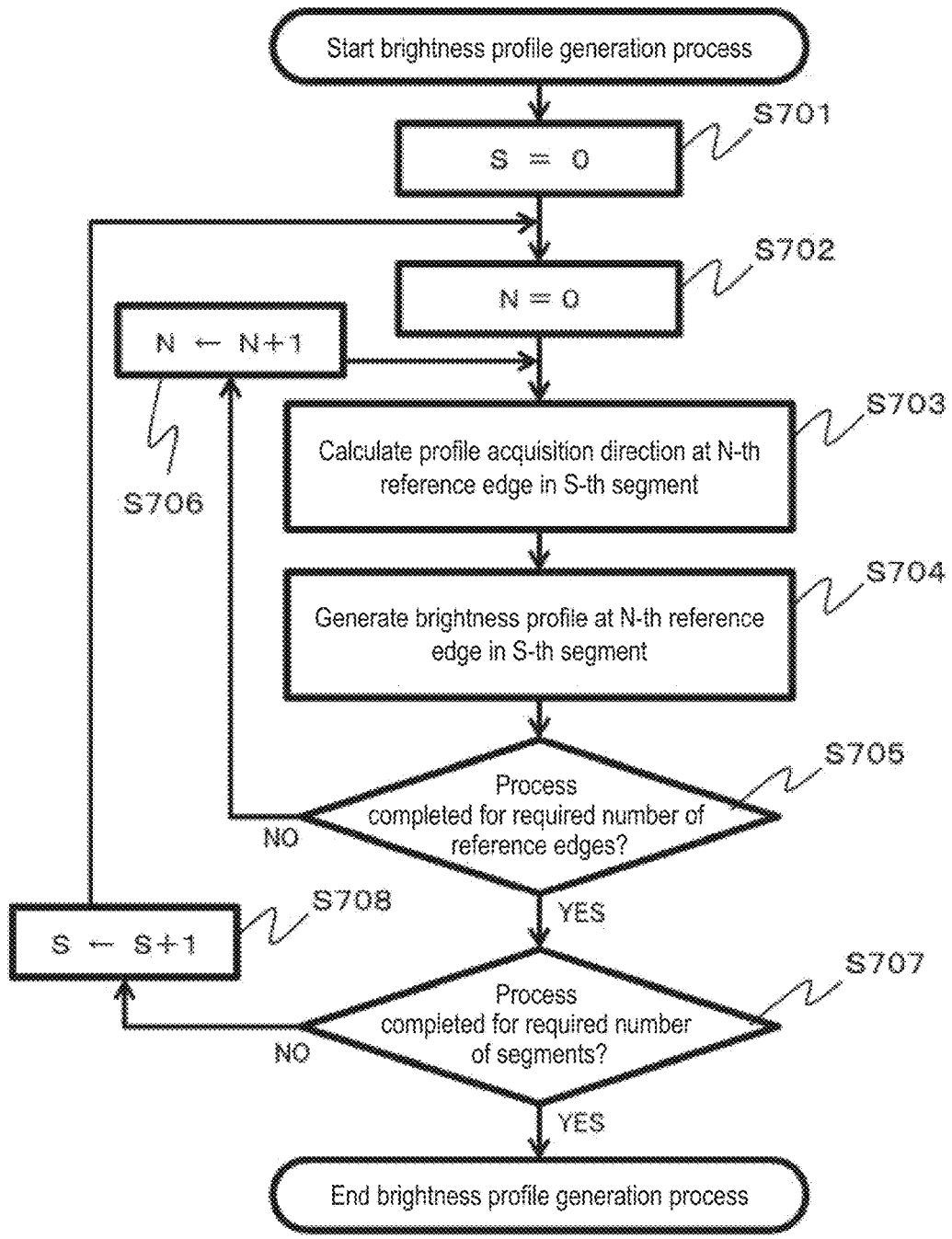
FIG. 7 is a flowchart illustrating an operation concerning a brightness profile generation process as part of the operation of the edge extraction parameter generation unit included in the operating device of the pattern inspecting device according to the first embodiment.

FIG. 7 is a flowchart illustrating an operation concerning a brightness profile generation process as part of the operation of the edge extraction parameter generation unit 113 included in the operating/processing device 110 according to the present embodiment.

In step S701, the edge extraction parameter generation unit 113 sets the value of the counter S, which is a counter for identifying a segment as the object of processing, to "0".

In step S702, the edge extraction parameter generation unit 113 sets the value of the counter N, which is the counter for identifying the reference edge as the object of processing, to "0".

Figure 8:
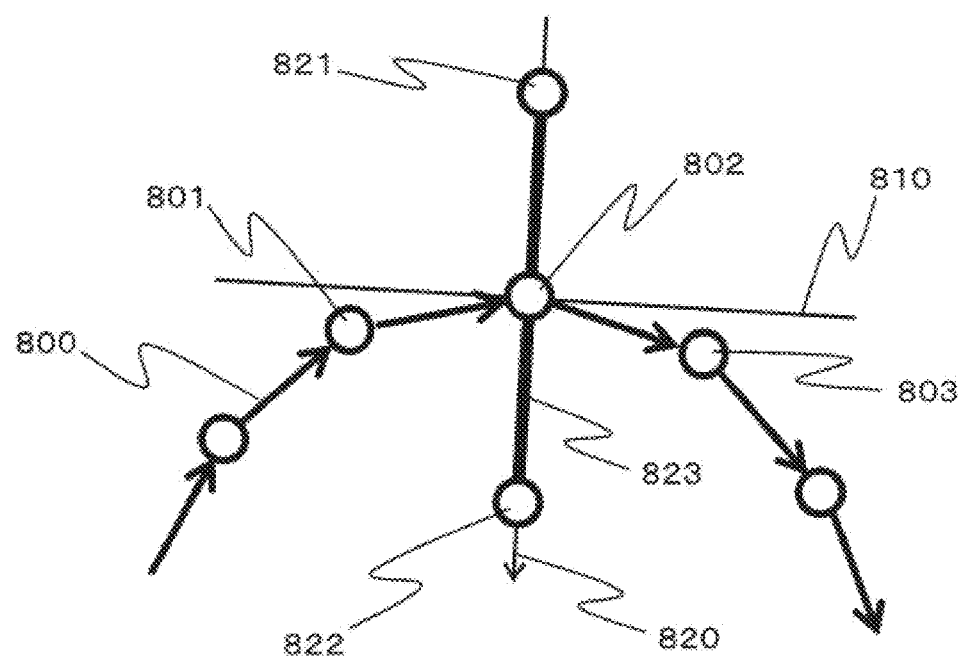
FIG. 8 illustrates a brightness profile acquisition direction in the brightness profile generation process, as part of the operation of the edge extraction parameter generation unit included in the operating device of the pattern inspecting device according to the first embodiment.

In step S703, the edge extraction parameter generation unit 113 computes a profile acquisition direction at the N-th reference edge of the S-th segment. The process of step S703 will be described later (FIG. 8).

In step S704, the edge extraction parameter generation unit 113 generates the brightness profile at the N-th reference edge of the S-th segment.

In step S705, the edge extraction parameter generation unit 113 determines whether the processing has been completed with respect to the required number of reference edges, by comparing the counter N with the number NS of the reference edges. If the processing with respect to the required number of reference edges has been completed (step S705: YES), the edge extraction parameter generation unit 113 proceeds to the process of step S707. If there is a reference edge that has not been processed (step S705: NO), the edge extraction parameter generation unit 113 proceeds to step S706, increments the value of the counter N by "1", and then proceeds to step S703 to continue the processing.

In step S707, the edge extraction parameter generation unit 113 determines whether the processing with respect to the required number of segments has been completed, by comparing the counter S with the counter MS indicating the number of segments. If the processing with respect to the required number of segments has been completed (step S707: YES), the edge extraction parameter generation unit 113 ends the edge extraction parameter generation process. If there is a segment that has not been processed (step S707: NO), the edge extraction parameter generation unit 113 proceeds to step S708, increments the value of the counter S by "1", and then proceeds to step S702 to continue the processing.

FIG. 8 illustrates a brightness profile acquisition direction in the brightness profile generation process as part of the operation of the edge extraction parameter generation unit 113 included in the operating/processing device 110 of the pattern inspecting device according to the present embodiment.

The brightness profile acquisition direction with respect to the N-th reference edge 802 of interest is determined as a direction perpendicular to the direction of the tangent to a segment 800 at the position of a reference edge 802. For example, the brightness profile acquisition direction is acquired using the coordinates of the reference edge 801 which is the reference edge one edge prior to the reference edge 802 on the segment 800, and the coordinates of the reference edge 803 which is the reference edge one edge subsequent to the reference edge 802 on the segment 800. When the coordinates of the reference edge 801 are (X1, Y1), and the coordinates of the reference edge 803 are (X3, Y3), first, as a vector (TX, TY) obtained by normalizing a vector (X3−X1, Y3−Y1) to the length of one, a directional vector of the line 810 corresponding to the tangent to the segment 800 at the reference edge 802 is determined, and then a directional vector (DX, DY) of the line 820 which is a line perpendicular to the line 810 is determined as (−TY, TX). The brightness profile is generated as a one-dimensional function on the line 820 using the origin of positional coordinates as the position of the reference pattern 802. An interval 823 is a profile acquisition interval. In the present example, the profile acquisition interval 823 is from a point 821 spaced apart from the reference edge 802 by a predetermined distance R on the negative side to a point 822 spaced apart on the positive side by the predetermined distance R. The brightness profile is generated by sampling pixel values at sub-pixel intervals (such as at 0.5 pixel intervals) in the profile acquisition interval 823. The pixel value sampling may be performed using a known technique, such as bilinear interpolation.

Figure 9:
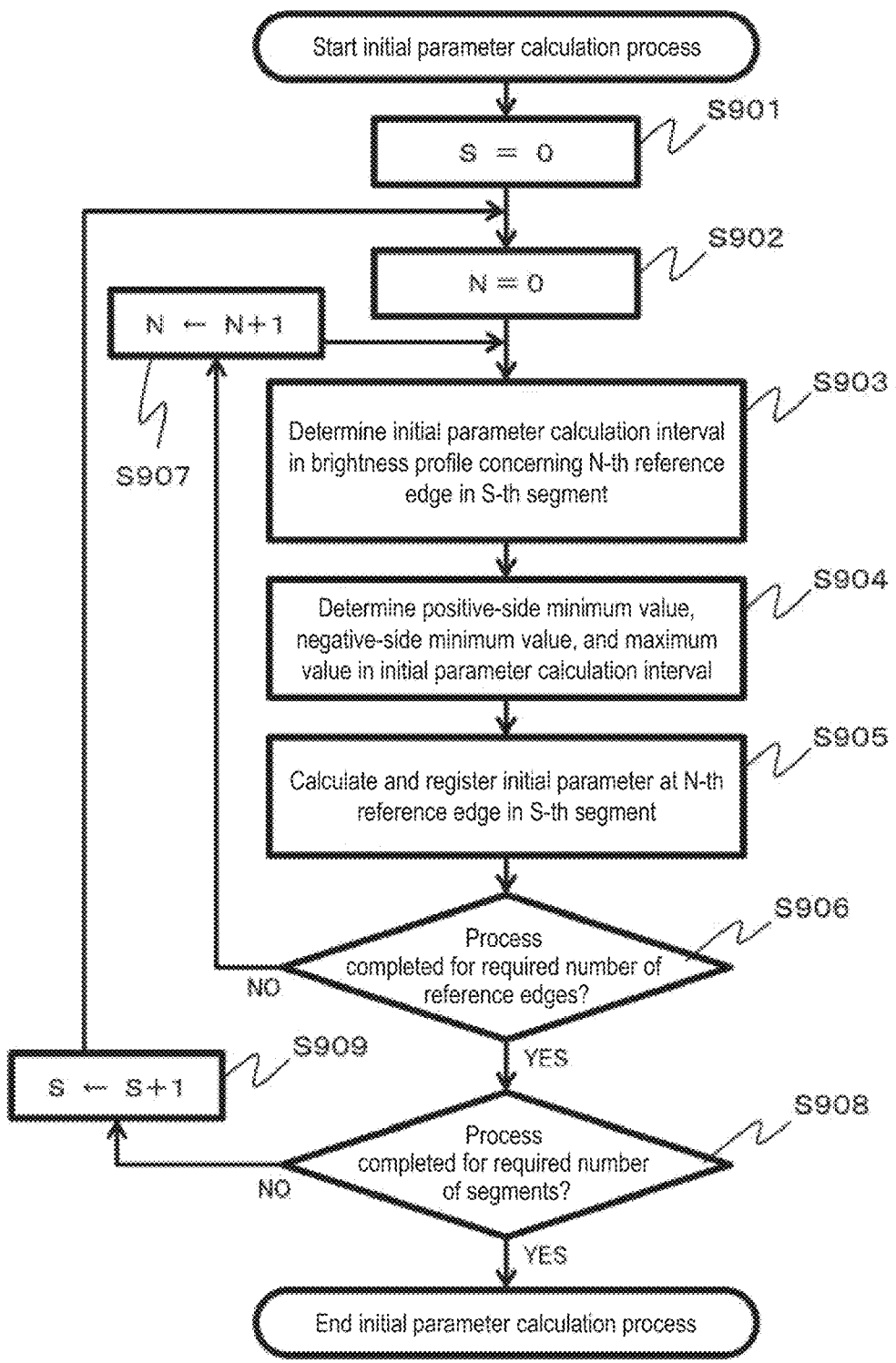
FIG. 9 is a flowchart illustrating an operation concerning an initial parameter calculation process as part of the operation of the edge extraction parameter generation unit included in the operating device of the pattern inspecting device according to the first embodiment.

FIG. 9 is a flowchart illustrating an operation concerning an initial parameter calculation process as part of the operation of the edge extraction parameter generation unit 113 included in the operating/processing device 110 according to the present embodiment.

In step S901, the edge extraction parameter generation unit 113 sets the value of the counter S, which is the counter for identifying the segment as the object of processing, to "0".

In step S902, the edge extraction parameter generation unit 113 sets the value of the counter N, which is the counter for identifying the reference edge as the object of processing, to "0".

In step S903, the edge extraction parameter generation unit 113 determines an initial parameter calculation interval in the brightness profile concerning the N-th reference edge of the S-th segment. The initial parameter calculation interval may be determined as one that includes a reference edge from among a sum set of one interval that is upwardly convex and intervals on both sides thereof that are downwardly convex.

If no such interval is found, namely if the pixel values of the pixels in the vicinity of the reference edge are so flat as to only have variations of the order of a noise level, this means that there is no portion within the profile acquisition interval that is suitable as a length measuring edge. Thus, in order to make a defect candidate determination in the later-described process of step S1401, exceptional values may be placed at both ends of the initial parameter calculation interval so that no length measuring edge is associated with the reference edge. The flatness determination may be made using a predetermined threshold value designated by the recipe and the like, or using a noise level separately estimated from the inspection image by a known method. Other methods may also be used for the determination.

In step S904, the edge extraction parameter generation unit 113 determines a positive-side minimum value, a negative-side minimum value, and a maximum value in the initial parameter calculation interval.

In step S905, the edge extraction parameter generation unit 113 calculates an initial parameter in the N-th reference edge of the S-th segment and registers the initial parameter.

In step S906, the edge extraction parameter generation unit 113 determines whether the processing has been completed with respect to the required number of reference edges by comparing the counter N with the number NS of the reference edges. If the processing has been completed with respect to the required number of reference edges (step S906: YES), the edge extraction parameter generation unit 113 proceeds to the process of step S908. If there is a reference edge that has not been processed (step S906: NO), the edge extraction parameter generation unit 113 proceeds to step S907, increments the value of the counter N by "1", and then proceeds to step S903 to continue the processing.

In step S908, the edge extraction parameter generation unit 113 determines whether the processing has been completed with respect to the required number of segments by comparing the counter S with the counter MS indicating the number of segments. If the processing has been completed with respect to the required number of segments (step S908: YES), the edge extraction parameter generation unit 113 ends the initial parameter calculation process. If there is a segment that has not been processed (step S908: NO), the edge extraction parameter generation unit 113 proceeds to step S909, increments the value of the counter S by "1", and then proceeds to step S902 to continue the processing.

Figure 10:
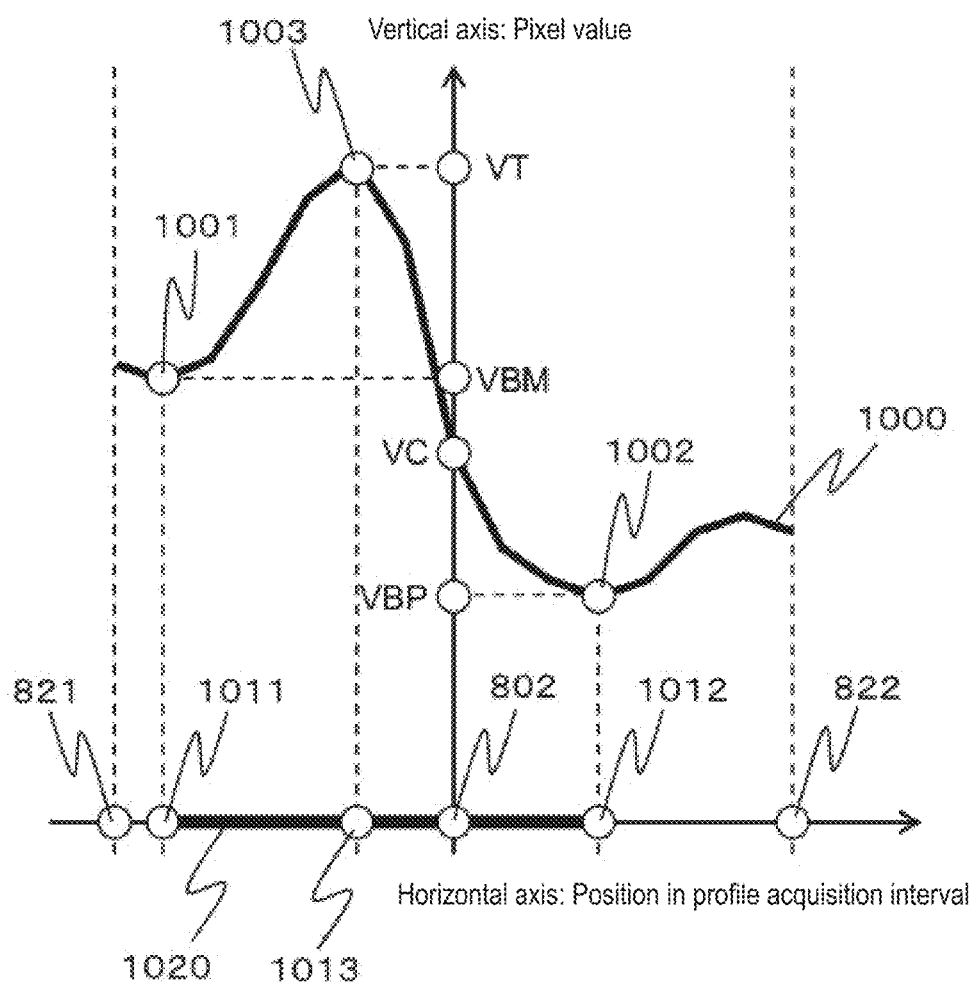
FIG. 10 illustrates an initial parameter calculation method in the initial parameter calculation process as part of the operation of the edge extraction parameter generation unit included in the operating device of the pattern inspecting device according to the first embodiment.

FIG. 10 illustrates an initial parameter calculation method in the initial parameter calculation process as part of the operation of the edge extraction parameter generation unit 113 included in the operating/processing device 110 of the pattern inspecting device according to the present embodiment.

The initial parameter is calculated using a position 1011, corresponding to a point 1001 at which a negative-side minimum value is achieved on a brightness profile 1000, within the profile acquisition interval; a position 1012, corresponding to a point 1002 at which a positive-side minimum value is achieved, within the profile acquisition interval; a position 1013, corresponding to a point 1003 at which a maximum value is achieved, within the profile acquisition interval; and a negative-side minimum value VBM, a positive-side minimum value VBP, and a maximum value VT. An interval 1020 is an interval providing the range corresponding to the edge extraction parameter domain [−1.0, 1.0] in the profile acquisition interval. The pixel value at the position of the reference edge in the profile 1000 is the pixel value VC. An edge extraction parameter corresponding to the pixel value VC provides the initial parameter. Conversion of a pixel value to an edge extraction parameter is performed in accordance with a definition in FIG. 11.

Figure 11:
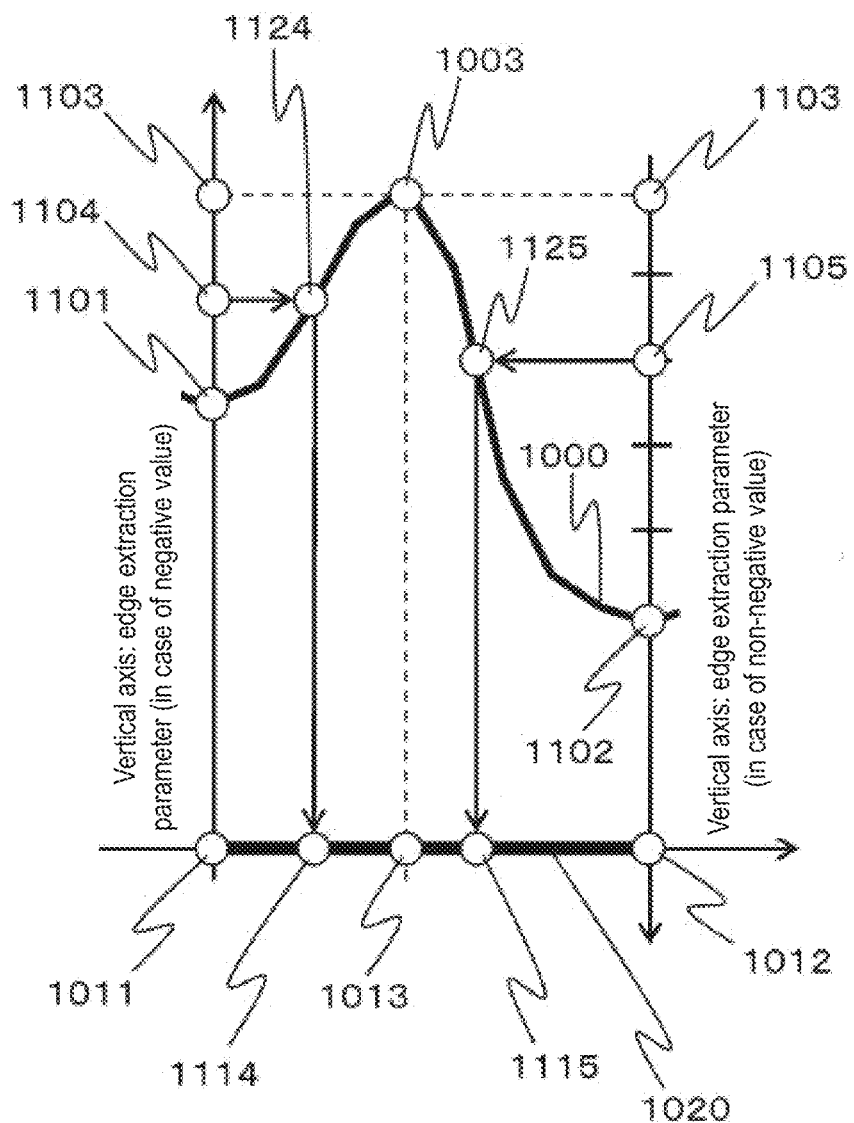
FIG. 11 illustrates the meaning of edge extraction parameter values in the pattern inspecting device according to the first embodiment.

FIG. 11 illustrates the meanings of edge extraction parameter values in the present embodiment.

As opposed to the conventional threshold value method using only one side of a brightness profile peak (which side with respect to the point at which a maximum value is achieved is to be used may be designated by the recipe and the like), according to the present embodiment, the brightness profile utilizes both sides of the point 1003 at which the maximum value is achieved. Thus, as the threshold value domain, instead of values such as [0%, 100%], but [−1.0, 1.0] including a negative value is used as the domain. Further, in order to ensure continuity of values at the points on the brightness profile, the value of the edge extraction parameter 1101 corresponding to the negative-side minimum value is "−1"; the value of the edge extraction parameter 1102 corresponding to the maximum value is "±0"; and the value of the edge extraction parameter 1103 corresponding to the positive-side minimum value is "+1". The positive or negative sign is defined by a magnitude relationship with respect to the position 1013, corresponding to the point 1003 at which the maximum value is achieved, within the profile acquisition interval.

For example, the position of the edge corresponding to an edge extraction parameter 1104 is a position 1114 which is the position corresponding to a point 1124 of intersection with the brightness profile 1000. The position of the edge corresponding to an edge extraction parameter 1105 is a position 1115 which is the position corresponding to a point 1125 of intersection with the brightness profile 1000. These positions are defined as a one-dimensional coordinate system having the position 802 of the reference edge as the origin. Thus, the positions provide an EPE value corresponding to the relevant reference edge as is. In the present example, because the process of the inspection unit 115 is only based on the EPE value, it is not necessary to calculate a two-dimensional contour shape using the directional vector (DX, DY). However, when it is necessary to calculate a two-dimensional contour shape, coordinate conversion may be performed using the directional vector (DX, DY) and the EPE value. At this time, a process for eliminating a self-crossing may be added as needed.

Conversion from the pixel value V to the edge extraction parameter may be performed according to "(V−VT)/(VT−VBM)" when the position at which the pixel value V is achieved is smaller than the position 1013 at which the maximum value is achieved, or "(VT−V)/(VT−VBP)" when greater.

Figure 12:
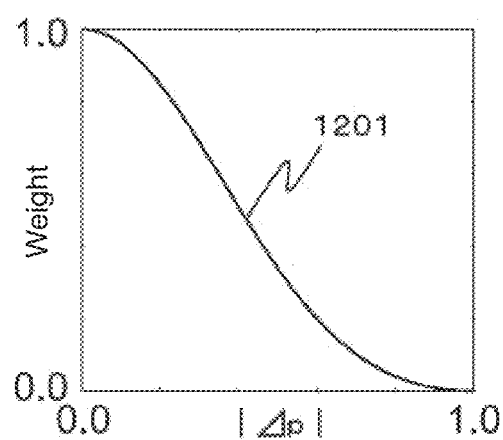
FIG. 12 illustrates an example of a weighting function used in an initial parameter smoothing process as part of the operation of the edge extraction parameter generation unit included in the operating device of the pattern inspecting device according to the first embodiment.

FIG. 12 illustrates an example of a weighting function used in an initial parameter smoothing process as part of the operation of the edge extraction parameter generation unit 113 included in the operating/processing device 110 according to the present embodiment.

A curve 1201 is a smooth function defined such that the weight is increased as the absolute value of Δp becomes smaller. Δp is a function of the initial parameter. In the present example, the value of the initial parameter per se is used, assuming that the ideal value of the initial parameter is "0.0". As a specific example of the curve 1201, "0.5+0.5× cos(π·|Δp|)" may be used. When the ideal value of the initial parameter is set other than "0.0", the absolute value of Δp is set to be not greater than "1.0", assuming that a difference from the ideal value smaller than "−1.0" is "−1.0" and that a difference from the ideal value greater than "1.0" is "1.0". The function used as the curve 1201 is not limited to the above example.

FIG. 13 illustrates an example of the initial parameter and the edge extraction parameter in the present embodiment.

When a curve 1301 shown in FIG. 13(*a*) which is a drawing of the reference pattern and a curve 1302 shown in FIG. 13(*b*) which corresponds to the ridge of a white band are actually overlapping as shown in FIG. 13(*c*), a parameter for extracting an edge at the position of the curve 1301, namely the initial parameter, is like a curve 1312, for example. By weighted-averaging the curve 1312 using the weighting function indicated by the curve 1201 of FIG. 12 and a predetermined dimension window, a curve 1313 is obtained. The curve 1313 provides the edge extraction parameter obtained as a result of the initial parameter smoothing process S603. In the process of the contour line forming unit 114, namely the process of step S203, an edge is extracted for each reference edge using the edge extraction parameter corresponding to the reference edge. Thus, in a normal portion, because the difference between the initial parameter and the parameter as a result of smoothing is small, an edge is extracted in the vicinity of the reference pattern. In a defect portion, because the difference between the initial parameter and the parameter as a result of smoothing is large, an edge is extracted at a position spaced apart from the reference pattern. With regard to the dimension of the window used for determining the curve 1313, i.e., the edge extraction parameter, a value described in the inspection recipe, or a value input by the operator via an input means of the operation terminal 120 may be used. When the window dimension is relatively small, compared with a case where the window dimension is relatively large, a length measuring edge is extracted at a position closer to the reference pattern. When the window dimension is relatively large, compared with the case where the window dimension is relatively small, a length measuring edge is extracted such that finer irregularities can be expressed. Thus, the window dimension may be set in view of the dimension of the defect to be detected.

For the window dimension used for determining the edge extraction parameter, different values may be used depending on the shape of the reference pattern. For example, separate values may be used between a linear portion and a corner portion. This is for lowering the defect detection sensitivity for a corner portion by decreasing the window dimension for the corner portion because it can be expected that, when the reference pattern is formed by rounding a corner of a layout pattern, for example, the divergence of the corner portion will become larger.

[Operation of the Inspection Unit 115 Included in the Operating/Processing Device 110 of the Pattern Inspecting Device]

The operation of the inspection unit 115 will be described with reference to FIG. 14 to FIG. 16.

Figure 14:
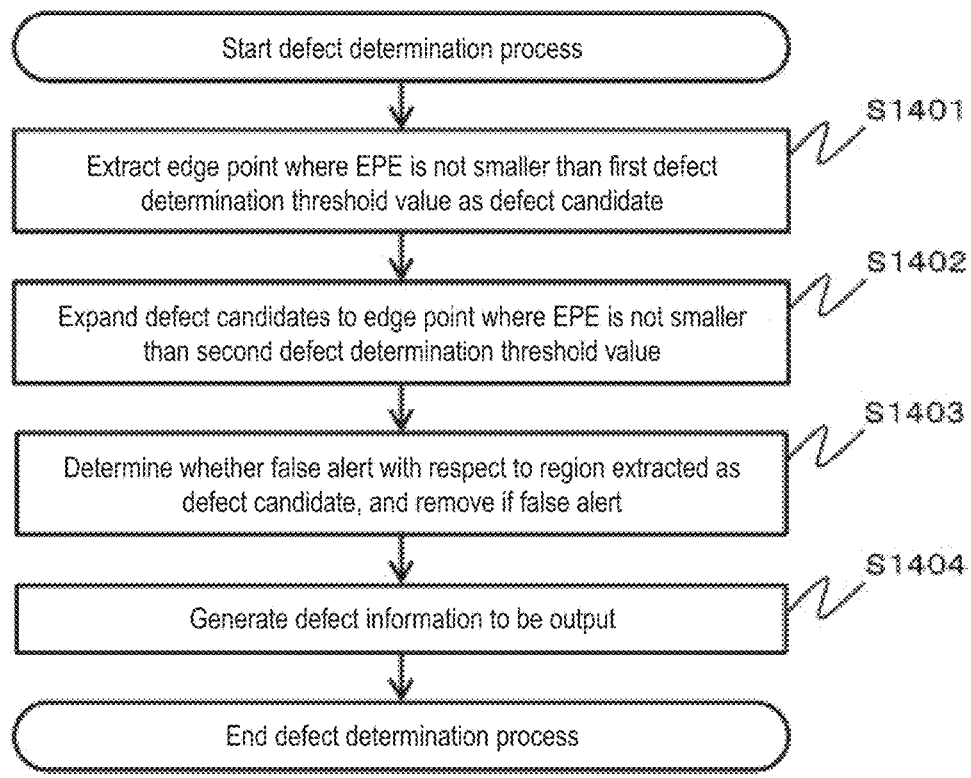
FIG. 14 is a flowchart of an operation of an inspection unit included in the operating device of the pattern inspecting device according to the first embodiment.

FIG. 14 is a flowchart of an operation of the inspection unit 115 included in the operating/processing device 110 of the pattern inspecting device according to the present embodiment. In the present embodiment, the inspection unit 115 detects a portion with a large shape deformation from the design data and outputs the portion as a defect region.

As a defect determination process is started, initially, the inspection unit 115 extracts, as defect candidates, reference edges with EPE of not less than a first threshold value in step S1401, and registers the defect candidates in a defect candidate list. The first defect determination threshold value is a value corresponding to "an amount of divergence from the design data such that the risk of defect development is considered high". As a specific value, a value described in the inspection recipe, or a value input from the operator via the input means of the operation terminal 120 may be used. The "amount of divergence from the design data such that the risk of defect development is high" corresponds to a value which has conventionally been given as "tolerance".

The defect candidate list is information about the intervals on the reference contour line that may possibly be finally output as a defect region, and holds information about "from the Ns-th reference edge to the Nt-th reference edge" of the S-th segment with respect to each defect candidate. The content of the defect candidate list is suitably updated by the inspection unit 115 in the process of step S1401 to S1403. Upon reaching the process of step S1404, the locations corresponding to the intervals remaining in the defect candidate list are finally output as defect regions.

In the process of step S903, the EPE value at a reference edge which is not associated with the length measuring edge for reasons such as, for example, that the initial parameter calculation interval is not found is treated as being infinite.

Thereafter, the inspection unit 115 in step S1402 expands the defect candidates to the reference edges such that the EPE is not less than a second defect determination threshold value. The second defect determination threshold value is a value smaller than the first defect determination threshold value. As the second defect determination threshold value, a value described in the inspection recipe, or a value input from the operator via the input means of the operation terminal 120 may be used. The inspection unit 115 updates the information about the defect candidates corresponding to the defect candidate list (i.e., expands the intervals). If a plurality of defect candidates forms a continuous interval, the plurality of defect candidates are integrated as one interval and the integrated interval is added to the defect candidate list after the plurality of defect candidates are eliminated from the defect candidate list.

The process of step S1402 is a process for preventing an erroneous determination such as a defect region being divided by fine irregularities in the shape of the length-measuring contour line, resulting in a false alert in the subsequent determination using a third defect determination threshold value. The second defect determination threshold value may be determined by a statistical method, such as determining an average value and a standard deviation of EPE at a normal portion using a discriminant analysis method (Otsu's method), and performing a calculation using such values.

In step S1403, the inspection unit 115 makes a false alert determination with respect to each of the defect candidates registered in the defect candidate list. If a false alert, the defect candidate is eliminated from the defect candidate list. Specifically, it is determined, using the third defect determination threshold value corresponding to the dimension of the defect to be detected, whether an extracted defect candidate has a predetermined length on the reference contour line. If the defect candidate is less than the predetermined length on the reference contour line, the candidate is eliminated as being a false alert. As the "length", the number of the reference edges is used, for example.

In step S1404, the inspection unit 115 integrates the defect candidates and creates defect information. Specifically, after those of the extracted defect candidates that are proximate on the image are integrated as one defect region, the circumscribed rectangle of the integrated defect region is determined. Then, the center position of the circumscribed rectangle is registered as the position of defect, and the dimension of the circumscribed rectangle is registered as the dimension of the defect. When it is not necessary to decrease the number of defect regions that are output, the process of integrating the defect regions may be omitted.

After the process of step S1404, the inspection unit 115 ends the defect determination process.

Figure 15A:
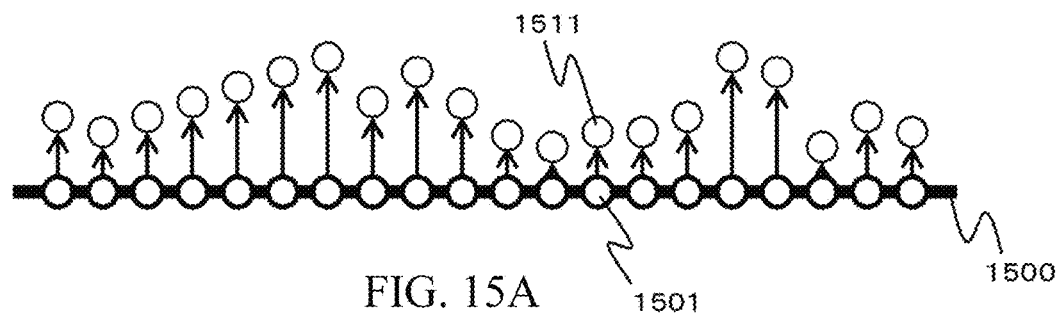
FIGS. 15A-15C illustrate the operation of the inspection unit included in the operating device of the pattern inspecting device according to the first embodiment.
Figure 15B:
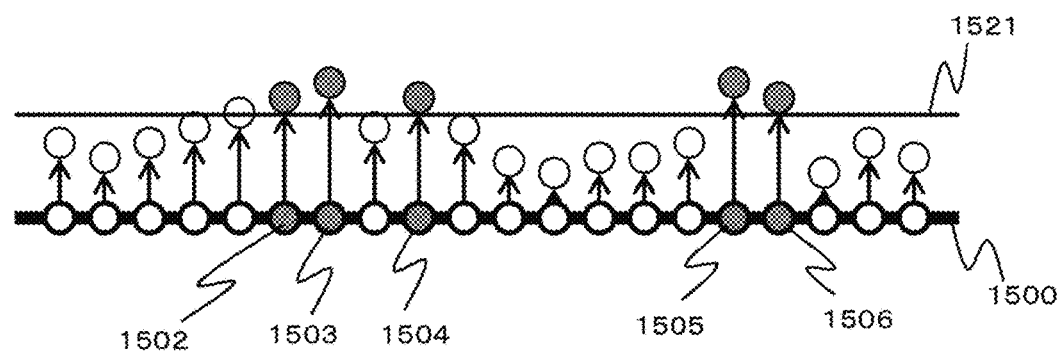
Figure 15C:
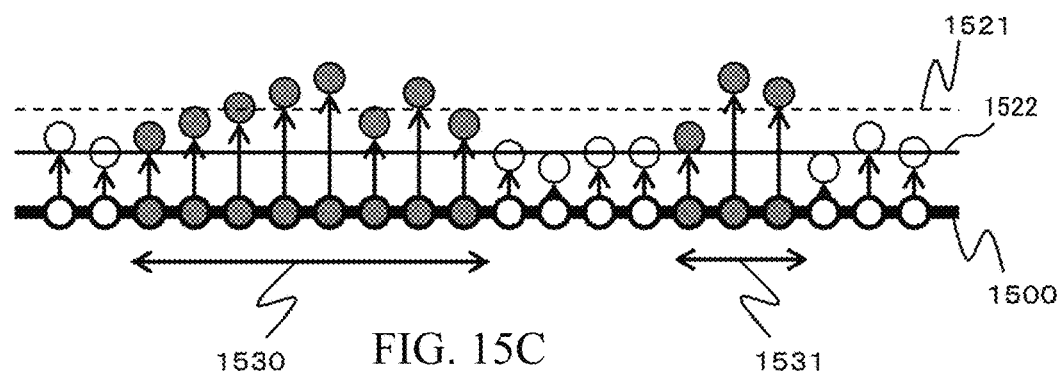

FIG. 15 intuitively illustrates the operation of the inspection unit 115 included in the operating/processing device 110 of the pattern inspecting device according to the present embodiment. In FIG. 15, FIG. 15(a) illustrates an initial state of the defect determination process; FIG. 15(b) illustrates a state in which defect candidates have been detected using the first defect determination threshold value; and FIG. 15(c) illustrates a state in which the defect candidates have been expanded using the second defect determination threshold value.

The defect determination process is performed, starting from the initial state of FIG. 15(a), by successively referencing the EPE value, which is the distance between the reference edges (such as a reference edge 1501) on a reference contour line 1500 and the length measuring edges (such as a length measuring edge 1511) corresponding to the reference edges.

In the process of step S1401, the reference edges of which the EPE is not less than the first threshold value are extracted as the defect candidates. In the case of FIG. 15(b), the reference edges of which the EPE is not less than a first defect determination threshold value 1521, namely a reference edge 1502, a reference edge 1503, a reference edge 1504, a reference edge 1505, and a reference edge 1506 are extracted as defect candidates.

In the process of step S1402, the defect candidates are expanded to reference edges of which the EPE is not less than the second threshold value. In the case of FIG. 15(c), the EPE of the reference edges adjacent to the reference edge 1502, the reference edge 1503, the reference edge 1504, the reference edge 1505, and the reference edge 1506, which are the reference edges extracted as the defect candidates, is successively referenced along a reference contour line 1500. Then, the defect candidates are expanded to but not including the reference edges of which the EPE is smaller than a second defect determination threshold value 1522. The defect candidates obtained by such expansion are a defect candidate 1530 and a defect candidate 1531.

In the process of step S1403, the false alert determination is made with respect to the defect candidate 1530 and the defect candidate 1531. According to the present embodiment, the false alert determination is made by observing the length on the reference contour line. Thus, when the third defect determination threshold value is "5", for example, the defect candidate 1530 of which the length is "8" is not determined to be a false alert and is finally output as a defect. On the other hand, the defect candidate 1531 of which the length is "3" is determined to be a false alert and eliminated from the defect candidate list.

FIG. 16 illustrates the contents of an inspection result image output from the pattern inspecting device according to the present embodiment. The inspection result image is generated by the inspection unit 115 on the basis of defect information obtained as a result of the defect determination process described with reference to FIG. 14 to FIG. 15. The inspection result image is displayed on an image display device of the operation terminal 120 by the operating/processing device 110, for example.

Figure 16A:
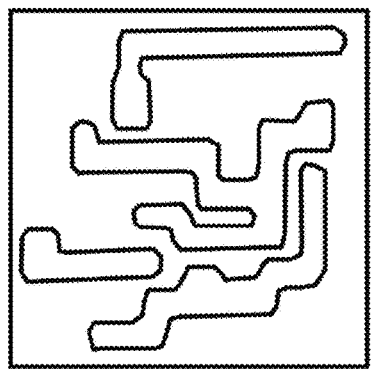
FIGS. 16A-16C illustrate the content of images output from the pattern inspecting device according to the first embodiment.
Figure 16B:
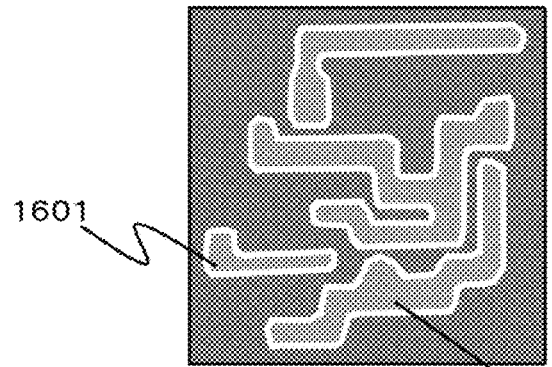

In the present embodiment, the reference contour line is drawn as an image shown in FIG. 16(a). When an inspection image is obtained as shown in FIG. 16(b), the inspection unit 115 generates an image shown in FIG. 16(c) or FIG. 16(d) as the inspection result image. The inspection image of FIG. 16(b) represents a situation in which patterns which are not normal are included in the image. Namely, the situation is such that a pattern FIG. 1601 is generally thinned, while a pattern FIG. 1602 partly has a degree of thickening that is detected as a defect.

Figure 16C:
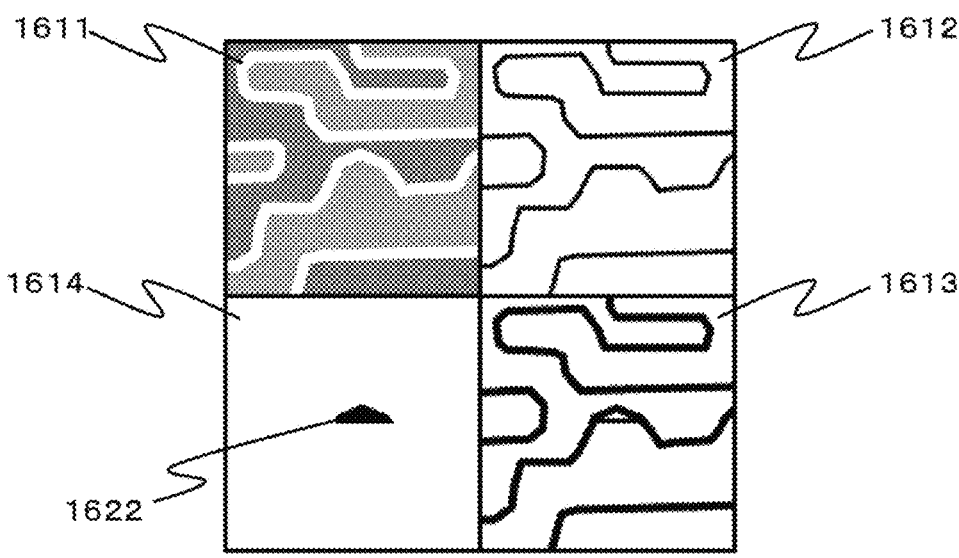

FIG. 16(c) shows an image for confirmation of information concerning the detected defect regions by the operator of the operation terminal 120. The inspection unit 115 generates the image by cutting out and drawing an inspection image of a region corresponding to the defect region in an upper-left region 1611 of the image; cutting out and drawing the reference pattern in a region corresponding to the defect region in an upper-right region 1612; drawing an image, in which the length-measuring contour line in a region corresponding to the defect region and the reference pattern are superposed one upon the other, in a lower-right region 1613; and drawing a location 1622 specifically determined to be a defect in a lower-left region 1614. The defect location 1622 corresponds to the thick portion of the pattern FIG. 1602 in the inspection image of FIG. 16(b). The drawing of the defect location 1622 may be implemented by, for example, paining over a region enclosed by the reference contour line included in the defect location, the length-measuring contour line corresponding to the reference contour line, and lines connecting the corresponding reference edge and a length measuring edge. However, the method of drawing the defect location 1622 is not limited to the above, and may include, for example, a method involving a morphological filter after contour lines related to the defect location are drawn.

Figure 16D:
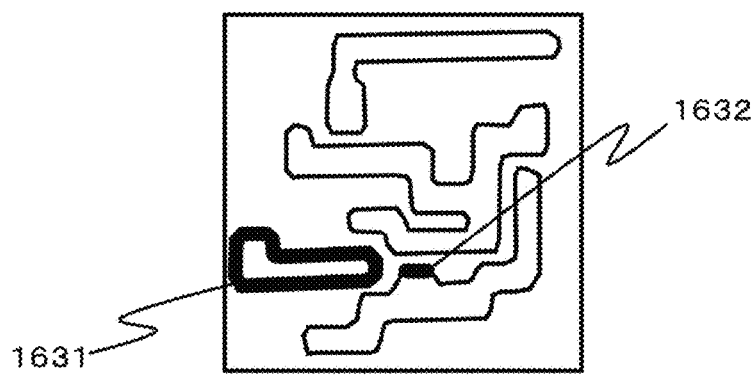
FIG. 16(d) shows an image indicating the extent of divergence of an edge extraction parameter of each local region from an average value.

FIG. 16(d) shows an image for confirmation by the operator of the operation terminal 120 of the degree of divergence of the edge extraction parameter at each local region from an average value. The inspection unit 115 computes, with respect to each reference edge, the absolute value of the difference between the edge extraction parameter corresponding to the reference edge and an edge extraction parameter reference value (such as the value of an average of the edge extraction parameters corresponding to the reference edges). When the calculated value is relatively large, the reference edge is drawn relatively thickly or with relatively large pixel value. When the calculated value is relatively small, the reference edge is drawn relatively thinly or with relatively small pixel values. As a result, the image shown in FIG. 16(d) is generated. In the image of FIG. 16(d) generated by such method, the portion corresponding to the generally thinned pattern FIG. 1601 in the inspection image of FIG. 16(b) is represented in such a way as to be visually recognized as a bold line portion 1631, and the thick portion of the pattern FIG. 1602 in the inspection image of FIG. 16(b) as a bold line portion 1632. Thus, the image can be used, for example, for observing variations in exposure conditions in a shot and making an analysis that "the pattern shape around this portion of the die tends to become unstable", or for checking the presence or absence of abnormality in a scanner. Instead of the edge extraction parameter, the initial parameter (i.e., the initial value of the edge extraction parameter) may be used to generate an image similar to FIG. 16(d). The edge extraction parameter itself may be used as one evaluation index for making the defect region determination, whereby a portion with a different edge extraction parameter from others can be determined as a defect region and output as such.

Thus, by focusing on the edge extraction parameter to generate an image, it becomes possible to extract a pattern location at which the risk of defect development is expected to be relatively high compared to other pattern regions, from a different point of view from the defect determination by dimension evaluation between patterns.

As described above, according to the first embodiment of the present invention, the edge extraction parameter for extracting an edge from the inspection image is generated, using the inspection image and the reference contour line, such that the edge of a normal portion is extracted in the vicinity of the reference contour line, and the edge determined from the inspection image on the basis of the generated edge extraction parameter and the reference edge are compared for inspection. In this configuration, the influence of noise and the like can be decreased, and the reliability of the inspection result can be increased. Particularly, during inspection, the influence of global shape deformation due to variations in the focal distance or the amount of exposure in the shot in which the inspected pattern was manufactured can be decreased. Thus, the configuration may be preferably used for the purpose of mask defect search.

A configuration may be adopted where a range designating unit for inputting a range of values considered appropriate as the values of the edge extraction parameters generated by the edge extraction parameter generation unit 104 is provided, so that the operator of the operation terminal 120 can designate the range of the edge extraction parameter values. The configuration can prevent the phenomenon where a portion which should be detected as a defect fails to be detected and produces an erroneous alert due to edge extraction using an edge extraction parameter generated beyond a range determined to be appropriate as an adjustable range of the edge extraction parameter. The range of values considered appropriate as the edge extraction parameter values generated by the edge extraction parameter generation unit 104 may be designated by the inspection recipe.

In the foregoing embodiment, the edge extraction parameter is determined from the initial parameter by a method using a weighted average. However, the method of determining the edge extraction parameter from the initial parameter is not limited to the above, and other techniques such as curve approximation may be used for the determination.

While in the foregoing embodiment the value "0.0" has been determined as an ideal value of $\Delta p$, the embodiment of the present invention is not limited to the above. For example, an average value of the initial parameters for each pattern figure or inspection image may be determined as being an ideal value.

In the foregoing embodiment, one edge extraction parameter is determined for each reference edge. However, the embodiment of the present invention is not limited to the above. For example, one edge extraction parameter may be determined in pattern figure units. Specifically, for example, an average value of the initial parameters of reference edges belonging to a pattern figure may be used as the edge extraction parameter, or a search may be conducted for an edge extraction parameter such that the length-measuring contour line best fits with respect to the reference contour line. By adopting such configuration, the phenomenon of the length measuring edge being fitted to the reference edge excessively can be prevented. Similarly, when the exposure conditions are assumed to be constant within the inspection image, one edge extraction parameter may be determined for the inspection image as a whole.

The method of comparing the length-measuring contour line and the reference contour line, and the mode of output and the output destination of the inspection result are not limited to those illustrated by way of example with reference to FIG. 14 to FIG. 16 and in corresponding descriptions, and may be variously modified depending on the purpose. For example, the mode of output of the inspection result may include, for visual confirmation, image information other than those in the illustrated examples, or, for analysis and the like, information such as the coordinates or dimension of the defect region, type of defect, and determination reliability. Alternatively, both may be output associated with each other. The output destination of the inspection result is not limited to the operation terminal 120 and may include an external storage device, or the inspection result may be transmitted via a network to another system.

The present embodiment may also be applied for comparison of pattern shapes between different steps, such as between pattern shapes after the lithography step and after the etching step. For example, inspection may be performed using common design data between the different steps. Alternatively, using a contour line formed from one as a reference contour line, the other may be inspected. In the case of pattern shape comparison between different steps, the profile shapes are generally different from each other. Thus, by employing the process using an edge extraction parameter adaptively determined from the inspection image, as according to the present invention, the reliability of the inspection result can be increased compared with when a given edge extraction parameter is used. When applied for pattern shape comparison between different steps, "the influence of small roughness can be prevented" when the contour line formed from the one is used as the reference contour line for inspecting the other. In view of this point being one feature of the present embodiment, it is preferable to use the contour line with relatively small roughness as the reference contour line. Accordingly, it is preferable to evaluate the pattern shape of the resist after the lithography step using the pattern shape after the etching step as the reference contour line. When it is expected that there will be a design difference between the pattern shapes in different steps, the reference contour line may be expanded or contracted by the expected amount of difference prior to processing. In this way, the reliability of the inspection result can be further increased.

First Modification of the First Embodiment

In the following, a first modification of the first embodiment will be described with reference to FIG. 17 to FIG. 25 and FIG. 43. The present modification is an example which is particularly preferable where, when the divergence from the reference pattern is large and the initial parameter calculation interval cannot be found in the process of step S903, it is desired to more accurately grasp the shape of the defect location or, when bridging or necking is caused, it is desired to not just detect such region as a defect region but also distinguish the type of defect, such as "bridging" or "necking". The pattern inspecting device of the present modification differs from the pattern inspecting device of the first embodiment mainly in the operation of the contour line forming unit 114. Specifically, in the present modification, the contour line forming unit 114 forms the length-measuring contour line for defect detection using the edge extraction parameter generated by the edge extraction parameter generation process, and then implements a length-measuring contour line repair process. In the following, the length-measuring contour line repair process will be described in detail.

FIG. 17 is a flowchart illustrating an operation concerning the length-measuring contour line repair process as part of the operation of the contour line forming unit 114 included in the operating/processing device according to the modification of the present embodiment.

As the length-measuring contour line repair process is started, the contour line forming unit 114 in step S1701 forms a first image contour line using the edge extraction parameter (namely, "0.0") corresponding to a profile peak position. The image contour line is a contour line which is formed by linking bright portions on the image, and which corresponds to a ridge (ridge line) when pixel values are viewed as height. In the present embodiment, the contour line is managed as a contour image (namely, an image such that the pixel values of the pixels forming the image contour line are "1 (foreground)", and the pixel values of other pixels are "0 (background)") in pixel units. When the coordinates at sub-pixel accuracy are required, coordinate values are determined by interpolation computation as the need arises. Alternatively, a contour line having a sub-pixel coordinate accuracy may be generated in advance using a known method (such as Patent Literature 1), and the contour line may be managed as geometric information in a known data structure. The first image contour line is formed by extracting an edge for each reference edge having a corresponding length measuring edge, using an edge extraction parameter corresponding to the profile peak position. When image edges (which, in the present embodiment, refer to the pixels constituting the image contour line; however, when the contour line is configured to be managed as geometric information, the image edges may mean the positions of sub-pixel accuracy edges) respectively corresponding to mutually adjacent reference edges do not correspond to the identical pixels or mutually adjacent pixels on the contour image, the gaps of the pixels are interpolated by a straight line, for example, so as to maintain connectivity.

In step S1702, the contour line forming unit 114 forms an image contour line candidate region by binarizing the inspection image. Specifically, the image contour line candidate region is provided by a set of pixels that belong to a class with greater pixel values upon binarization of the inspection image. The process of forming the image contour line candidate region may be implemented by a known method. For example, the inspection image may be binarized based on a threshold value determined by a known threshold value determination method, such as a discriminant analysis method (Otsu's method). Alternatively, the inspection image may be binarized by determining a different threshold value for each partial region of the inspection image using a dynamic threshold value process. Further alternatively, the information about the first image contour line may be used during the threshold value determination.

In step S1703, the contour line forming unit 114 forms a second image contour line from the image contour line candidate region and the first image contour line by a masked thinning process. Specifically, in the coordinate system of the inspection image, the image contour line candidate region and the first image contour line are drawn in a superposed manner, and then thinning is performed while the position of the first image contour line is maintained. Then, of the pixels on the resultant thin line, a set of pixels that are not included in the first image contour line provides the second image contour line. The details of the masked thinning process will be described later (see FIG. 18).

Then, in step S1704, the contour line forming unit 114 determines two points on the first image contour line that correspond to the ends of a gap interval on the basis of the reference contour line. Specifically, the reference edges on the reference contour line that are retained as a directed graph are tracked in order. Then, a first image edge corresponding to a reference edge satisfying a condition that "there is a first image edge corresponding to itself but there is no first image edge corresponding to the reference edge next to itself" is determined as a "gap interval start point". A first image edge corresponding to a reference edge satisfying a condition that "there is a first image edge corresponding to itself but there is no first image edge corresponding to the reference edge in front of itself" is determined as a "gap interval end point". The "gap interval start point" and the "gap interval end point" thus determined are registered in combination in a gap interval list. Specifically, information indicating "from the Ns-th reference edge to the Nt-th reference edge of the S-th segment" may be registered. The gap interval list is referenced in the intra-gap length-measuring contour line repair process of step S1705 and the inter-gap length-measuring contour line repair process of step S1706. Depending on the field of view (FOV) at the time of acquisition of the inspection image, there may be only one of the gap interval start point or the end point. In such a case, when registering in the gap interval list, if there is no start point, an exceptional value is stored in a start point side identifier Ns. If there is no end point, an exceptional value is stored in an end point side identifier Nt. The registration in the gap interval list is made even if there is only one of the start point or end point of the gap region because of possible use in the inter-gap length-measuring contour line repair process of step S1706. The number of the gap intervals registered in the gap interval list is referenced in the intra-gap length-measuring contour line repair process of step S1705 and the inter-gap length-measuring contour line repair process of step S1706. Thus, a counter KT retaining the number of the gap intervals is initialized to "0" at the start of the length-measuring contour line repair process, and then the value of the counter KT is incremented by "1" upon registration of a gap interval in the gap interval list and counted in the process of step S1704.

After the process of step S1704, the contour line forming unit 114 in step S1705 performs the intra-gap length-measuring contour line repair process as will be described later with reference to FIG. 19. Further, in step S1706, the contour line forming unit 114 performs the inter-gap length-measuring contour line repair process as will be described later with reference to the FIG. 20, and ends the length-measuring contour line repair process.

FIG. 18 illustrates an operation concerning a masked thinning process in the length-measuring contour line repair process as part of the operation of the contour line forming unit included in the operating/processing device according to the modification of the present embodiment.

FIG. 18(a) illustrates a state in which the first image contour line is drawn, where the painted-over pixels correspond to the pixels constituting the first image contour line. FIG. 18(b) illustrates the image contour line candidate regions having been drawn in a superposed manner in addition to the first image contour line, where the pixels drawn with bold lines correspond to the pixels constituting the image contour line candidate regions. FIG. 18(c) illustrates the result of the masked thinning process, where the pixels drawn with bold lines and painted over correspond to the pixels constituting the second image contour line. Thus, the masked thinning process is a process performed for determining the second image contour line linked to the first image contour line while the position of the first image contour line is maintained.

The method for creation of FIG. 18(b) to FIG. 18(c) may employ a known technique. In the present embodiment, for example, Hilditch's thinning algorithm is used. In this case, pixels as the object of update (i.e., the pixels that may possibly be changed from the foreground to the background by the thinning process) are registered in a list in the order of rastering (from upper left to lower right) in advance. Then, an odd-numbered iterative process is performed from top to bottom of the list, while an even-numbered iterative process is performed from bottom to top of the list, so that a bold lined region is shaved into a thin line from different directions. At this time, convergence determination is implemented each time the even-numbered process of the combination of the odd-numbered iterative process and the even-numbered iterative process is completed. By not registering the pixels constituting the first image contour line in the list of the pixels as the object of update, thinning can be performed while the position of the first image contour line is maintained.

If the first image contour line includes a closed chain and the entirety of the inside of the closed chain forms an image contour line candidate region, the image contour line candidate region is not thinned and left. In this regard, in order to achieve the purpose of the length-measuring contour line repair process of the present embodiment, the following process may be implemented. Namely, in the state of FIG. 18(c), the pixels constituting the first image contour line are removed, and the pixels constituting the second image contour line are separated into link components. Of the link components thus obtained, those required by the length-measuring contour line repair process are only those link components linking two or more end points in the first image contour line. Thus, the pixels constituting the link components that cannot link the two or more end points in the first image contour line are deleted from the second image contour line. Herein, the end points in the first image contour line refer to the pixels constituting the first image contour line that are each adjacent to only one of the pixels constituting the first image contour line.

FIG. 19 is a flowchart illustrating an operation concerning an intra-gap length-measuring contour line repair process in the length-measuring contour line repair process as part of the operation of the contour line forming unit included in the operating/processing device according to the modification of the present embodiment. The intra-gap length-measuring contour line repair process is a process performed when, although a gap interval is produced for reasons such as that "the initial parameter calculation interval cannot be found in the process of step S903 because the position of the length measuring edge to be determined is greatly diverged from the reference edge", the length measuring edge can be determined in association with the reference edge by properly setting the interval for brightness profile acquisition. This is a process for repairing the length-measuring contour line by repeating a process of determining the interval for brightness profile acquisition using the image contour line with reference to each reference edge in the gap interval, and then determining the length measuring edge using an interpolated edge extraction parameter. The intra-gap length-measuring contour line repair process will be intuitively described later with reference to FIG. 21 to FIG. 23.

As the intra-gap length-measuring contour line repair process is started, in step S1901, the contour line forming unit 114 initially sets the value of the counter K for identifying the gap interval as the object of processing to "0".

In step S1902, the contour line forming unit 114 determines the shortest path connecting an image edge corresponding to the start point of the K-th gap interval and an image edge corresponding to the end point of the K-th gap interval on the second image contour line. Specifically, using the image edge corresponding to the start point of the K-th gap interval, the image edge corresponding to the end point of the K-th gap interval, and each of the second image edges as vertexes, the image edges that are adjacent in eight pixels on the contour image are connected by sides, a weighted undirected graph having the distance between pixel centers as the weight of the side is created, and the shortest path is determined by a known technique, such as the Dijkstra's method.

In the gap interval list, if an exceptional value is registered as the identifier of the K-th gap interval start point or end point, it is determined that "the shortest path has not been found", and the step proceeds to the process of step S1903 without performing the shortest path determination process.

In step S1903, the contour line forming unit 114 determines whether, as a result of the process of step S1902, the shortest path has been found. If the shortest path has been found (step S1903: YES), the contour line forming unit 114 proceeds to the process of step S1904 and starts a repair process for the K-th gap interval. If the shortest path has not been found (step S1903: NO), the contour line forming unit 114 proceeds to the process of step S1908 assuming that the repair process for the K-th gap interval has been completed.

In step S1904, the contour line forming unit 114 sets the value of the counter N for identifying the reference edge as the object of processing to "0". The reference edge as the object of processing is such that the reference edge subsequent to the K-th gap interval start point corresponds to "N=0". Subsequently, the reference edge is successively associated with the value of N as the value is incremented one by one until the reference edge in front of the K-th gap interval end point is reached.

In step S1905, the contour line forming unit 114 determines, with respect to the N-th reference edge included in the K-th gap interval, the corresponding point on the shortest path. The corresponding point on the shortest path may be determined, after a direction perpendicular to the direction of the tangent to the reference contour line at the position of the N-th reference edge of interest is determined similarly to FIG. 8, as a point of intersection of a line extending from the N-th reference edge of interest in the perpendicular direction and the image contour line at a portion corresponding to the shortest path.

In step S1906, the contour line forming unit 114 creates a brightness profile in an interval including the corresponding point on the shortest path with respect to the N-th reference edge included in the K-th gap interval, and determines a length measuring edge using an interpolated edge extraction parameter. The interpolation of the edge extraction parameter is implemented by linear interpolation using the edge extraction parameter corresponding to the reference edge corresponding to the K-th gap interval start point, and the edge extraction parameter corresponding to the reference edge corresponding to the K-th gap interval end point. Alternatively, the interpolation may be implemented by techniques other than linear interpolation, such as one using a higher-order interpolation formula by increasing the number of the reference edges that are referenced.

In step S1907, the contour line forming unit 114 determines whether the length measuring edge calculation has been completed with respect to all of reference edges included in the K-th gap interval, by comparing the value of the counter N and the number of the reference edges included in the K-th gap interval. The number of the reference edges included in the K-th gap interval may be computed from the K-th gap interval start point identifier and end point identifier. When the length measuring edge calculation has been completed for all of the reference edges included in the K-th gap interval (step S1907: YES), the contour line forming unit 114, assuming that the repair process for the K-th gap interval has been completed, marks the K-th gap interval as "repaired", and proceeds to the process of step S1908. If there is a reference edge for which the length measuring edge calculation is not completed (step S1907: NO), the contour line forming unit 114 proceeds to step S1909 and increments the value of the counter N by "1", and then proceeds to step S1905 to continue the repair process for the K-th gap interval.

In step S1908, the contour line forming unit 114 determines whether the repair process has been completed for all gap intervals by comparing the value of the counter K and the number KT of gap intervals. If the repair process has been completed with respect to all gap intervals (step S1908: YES), the contour line forming unit 114 ends the intra-gap length-measuring contour line repair process. If there is a gap interval for which the repair process has not been completed (step S1908: NO), the contour line forming unit 114 proceeds to step S1910 to increment the value of the counter K by "1" and then proceeds to step S1902 to continue the processing.

Figure 20:
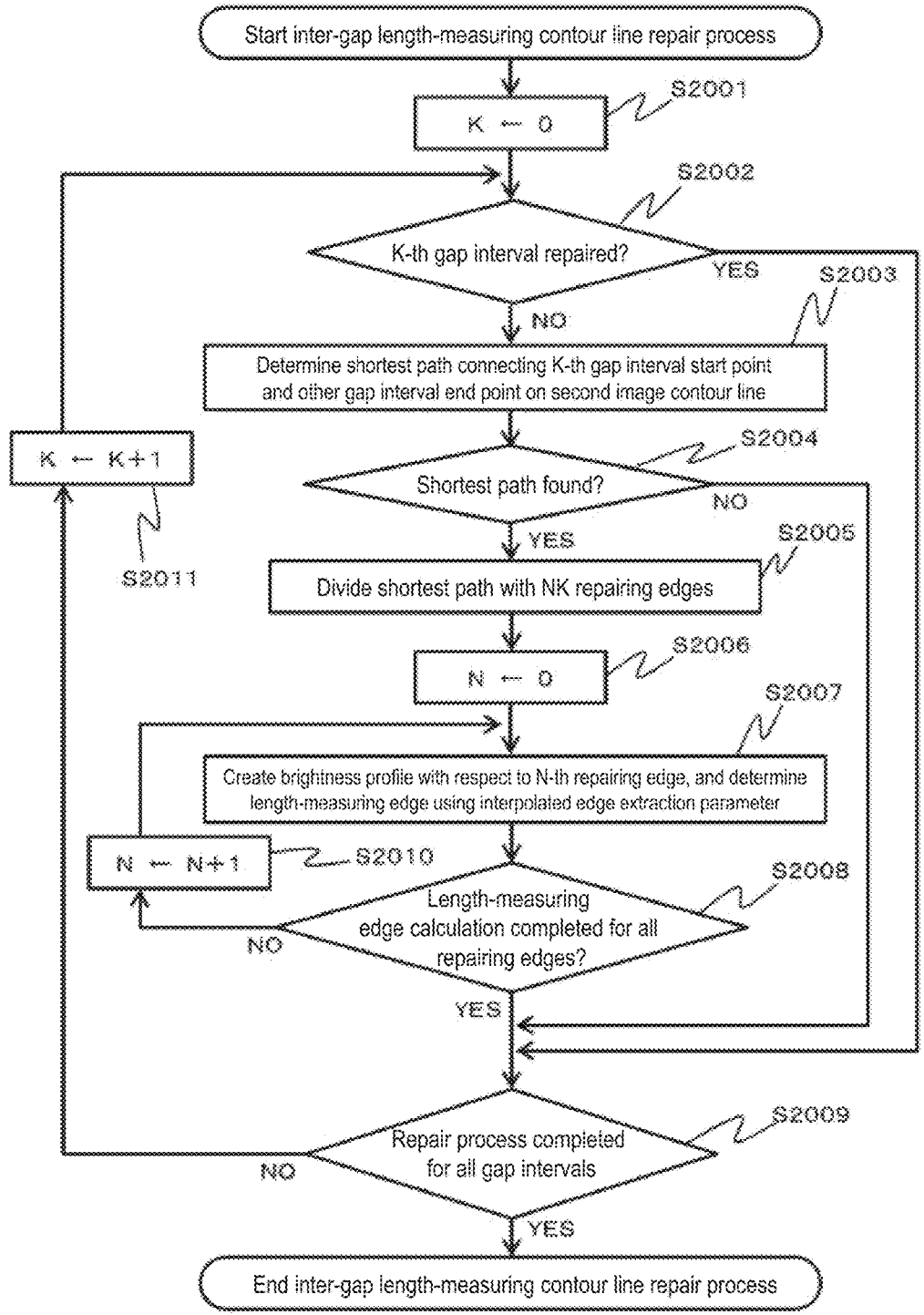
FIG. 20 is a flowchart illustrating an operation concerning, as part of the operation of the contour line forming unit included in the operating device according to the first modification of the first embodiment, an inter-gap length-measuring contour line repair process in the length-measuring contour line repair process.

FIG. 20 is a flowchart illustrating an operation concerning the inter-gap length-measuring contour line repair process in the length-measuring contour line repair process as part of the operation of the contour line forming unit included in the operating/processing device according to the modification of the present embodiment. The inter-gap length-measuring contour line repair process is a process that becomes necessary when the length measuring edge cannot be determined in association with the reference edge, such as when in a necking or bridging state. The process repairs the length-measuring contour line by repeating a process of determining the length measuring edge from the brightness profile created in association with an image edge using an interpolated edge extraction parameter. With regard to a gap interval that was not repaired at the start of the inter-gap length-measuring contour line repair process, there is a necking or bridging state if repaired at the end of the inter-gap length-measuring contour line repair process; if not repaired at the end of the inter-gap length-measuring contour line repair process, there is a state in which the white band is lost by pattern crumbling and the like. Thus, the type of defect can be distinguished. The necking state and the bridging state may be distinguished by whether the repair portion of the length-measuring contour line is positioned on the left or right side of the reference contour line of the gap portion. The inter-gap length-measuring contour line repair process will be intuitively described later with reference to FIG. 21, FIG. 24, FIG. 25, and FIG. 43.

As the inter-gap length-measuring contour line repair process is started, the contour line forming unit 114 in step S2001 initially sets the value of the counter K for identifying the gap interval as the object of processing to "0".

Then, in step S2002, the contour line forming unit 114 determines whether the K-th gap interval has been repaired. The determination of whether the K-th gap interval has been repaired may be made depending on whether the K-th gap interval is marked as "repaired". The method of determination is not limited to the above. For example, the determination may be based on whether a length measuring edge is associated with the reference edge in the K-th gap interval. If the K-th gap interval has been repaired (step S2002: YES), the contour line forming unit 114, assuming that the repair process concerning the K-th gap interval has been completed, proceeds to the process of step S2009. If the K-th gap interval has not been repaired (step S2002: NO), the contour line forming unit 114 proceeds to the process of step S2003.

In step S2003, the contour line forming unit 114 determines the shortest path connecting the image edge corresponding to the start point of the K-th gap interval and the image edge corresponding to the end point of another gap interval on the second image contour line. Specifically, the shortest path may be determined using the image edge corresponding to the start point of the K-th gap interval, the image edges corresponding to the end points of all of the other gap intervals that are not repaired, and each of second image edges as vertexes, connecting the image edges that are adjacent to each other in eight pixels on the contour image by sides, creating a weighted undirected graph having the distance between pixel centers as the weight of the side, and then using a known technique such as the Dijkstra's method.

Thereafter, in step S2004, the contour line forming unit 114 determines whether the shortest path has been found. If the shortest path has been found (step S2004: YES), the contour line forming unit 114 proceeds to the process of step S2005 and starts a repair process concerning the K-th gap interval. If the shortest path has not been found (step S2004: NO), the contour line forming unit 114, assuming that the repair process concerning the K-th gap interval has been completed, proceeds to the process of step S2009. Herein, "the repair process concerning the K-th gap interval" refers to a process for determining a length-measuring contour line connecting the K-th gap interval start point and the end point of the other gap interval.

If the shortest path has been found, the contour line forming unit 114 in step S2005 divides the shortest path by a plurality of repairing edges. The process of dividing the shortest path by the plurality of repairing edges is similar to the reference edge extraction process described in step S302 and with reference to FIG. 5. Namely, the length LK of the shortest path is determined, and, based on the given maximum sampling interval P, the sampling interval PK and the number NK of the repairing edges with respect to the shortest path are calculated. Specifically, when LK is divisible by P, the repairing edges are located at positions dividing the shortest path into (LK/P) equal parts. In this case, PK is equal to P, and NK is (P/LK−1) because both ends are removed. If LK is not divisible by P, PK and NK may be similarly determined in consideration of the fact that the repairing edges are located at positions dividing the shortest path into (LK/P+1) equal parts.

In step S2006, the contour line forming unit 114 sets the value of the counter N for identifying the repairing edge as the object of processing to "0".

In step S2007, the contour line forming unit 114 creates a brightness profile with respect to the N-th repairing edge included in the K-th gap interval, and determines the length measuring edge using an interpolated edge extraction parameter. In the inter-gap length-measuring contour line repair process, there is no reference contour line at the portion corresponding to the gap interval. Thus, the brightness profile is created using a repairing edge instead of the reference edge, and, instead of creating the brightness profile in a direction perpendicular to the reference contour line, the brightness profile is created in a direction perpendicular to the image contour line. Interpolation of the edge extraction parameter is implemented by linear interpolation using, as in the process of step S1906, an edge extraction parameter corresponding to the reference edge corresponding to the K-th gap interval start point, and an edge extraction parameter corresponding to the reference edge corresponding to the K-th gap interval end point. The interpolation may be implemented using techniques other than linear interpolation, such as using a higher-order interpolation formula by increasing the number of the reference edges that are referenced, as in step S1906.

In step S2008, the contour line forming unit 114 determines whether the length measuring edge calculation has been completed with respect to all repairing edges, by comparing the value of the counter N and the number NK of the repairing edges. If the length measuring edge calculation has been completed for all repairing edges (step S2008: YES), the contour line forming unit 114, assuming that the repair process concerning the K-th gap interval has been completed, marks the K-th gap interval as "repaired", and proceeds to the process of step S2009. If there is a repairing edge for which the length measuring edge calculation has not been completed (step S2008: NO), the contour line forming unit 114 proceeds to step S2010 and increments the value of the counter N by "1", and then proceeds to step S2007 to continue the repair process concerning the K-th gap interval.

In step S2009, the contour line forming unit 114 determines whether the repair process concerning all gap intervals has been completed, by comparing the value of the counter K and the number KT of gap intervals. If the repair process concerning all gap intervals has been completed (step S2009: YES), the contour line forming unit 114 ends the inter-gap length-measuring contour line repair process. If there is a gap interval for which the repair that has not been processed (step S2009: NO), the contour line forming unit 114 proceeds to step S2011 to increment the value of the counter K by "1", and then proceeds to step S2002 to continue the processing.

[Intuitive Description of Length-Measuring Contour Line Repair Process]

In the following, a process flow of the length-measuring contour line repair process described with reference to FIG. 17 to FIG. 20 will be described more intuitively with reference to FIG. 21 to FIG. 25 and FIG. 43. In FIG. 21 to FIG. 25 and FIG. 43, similar signs designate similar elements.

Figure 21:
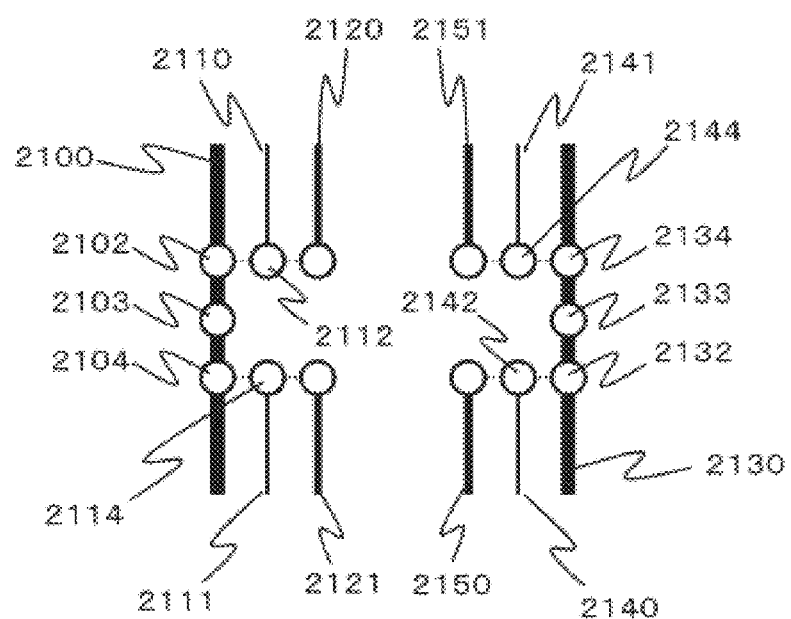
FIG. 21 illustrates, as part of the operation of the contour line forming unit included in the operating device according to a first modification of the first embodiment, an operation of the length-measuring contour line repair process.

FIG. 21 illustrates a state in which the process of step S1701 has been completed in the length-measuring contour line repair process described with reference to FIG. 17. A first image contour line 2120 and a first image contour line 2121 are formed in association with the respective intervals of a reference contour line 2100 of which a length-measuring contour line 2110 and a length-measuring contour line 2111 have been determined. A first image contour line 2150 and a first image contour line 2151 are formed in association with respective intervals of a reference contour line 2130 of which a length-measuring contour line 2140 and a length-measuring contour line 2141 have been determined. In the state of FIG. 21, of the three continuous reference edges on the reference contour line 2100, i.e., a reference edge 2102, a reference edge 2103, and a reference edge 2104, the reference edge 2103 does not have a corresponding length measuring edge. Thus, the interval from the reference edge 2102 to the reference edge 2104 is a "gap interval", providing the object of repair of the length-measuring contour line. Similarly, the reference edge 2133 does not have a corresponding length measuring edge, so that the interval from a reference edge 2132 to a reference edge 2134 is a "gap interval", providing the object of repair of the length-measuring contour line.

For the repair of the length-measuring contour line, priority is given to correspondence with the reference contour line. However, there may be cases where it is inappropriate to perform the repair in such a way that correspondence with the reference contour line can be achieved, such as when there is bridging or necking. Accordingly, in the present modification, after a repair is attempted by the intra-gap length-measuring contour line repair process in such a way that correspondence with the reference contour line can be achieved, the gap interval that could not be repaired in such a way that correspondence with the reference contour line can be achieved is subjected to a repair for the case where correspondence with the reference contour line cannot be achieved by the inter-gap length-measuring contour line repair process.

In the state of FIG. 21, when the length-measuring contour line is repaired by the intra-gap length-measuring contour line repair process (S1705), the behavior will be such that a length measuring edge is added between the length measuring edge 2112 and the length measuring edge 2114 to connect the length-measuring contour line 2110 and the length-measuring contour line 2111, forming one length-measuring contour line, or such that a length measuring edge is added between the length measuring edge 2142 and the length measuring edge 2144 to connect the length-measuring contour line 2140 and the length-measuring contour line 2141, forming one length-measuring contour line. This is the case for an example which will be described later with reference to FIG. 22 and FIG. 23.

In the state of FIG. 21, when the length-measuring contour line is repaired by the inter-gap length-measuring contour line repair process (S1706), the behavior is such that a length measuring edge is added between the length measuring edge 2112 and the length measuring edge 2144 to connect the length-measuring contour line 2110 and the length-measuring contour line 2141, forming one length-measuring contour line, or such that a length measuring edge is added between the length measuring edge 2142 and the length measuring edge 2114 to connect the length-measuring contour line 2140 and the length-measuring contour line 2111, forming one length-measuring contour line. This is the case for an example which will be described later with reference to FIG. 24 and FIG. 25.

Figure 22A:
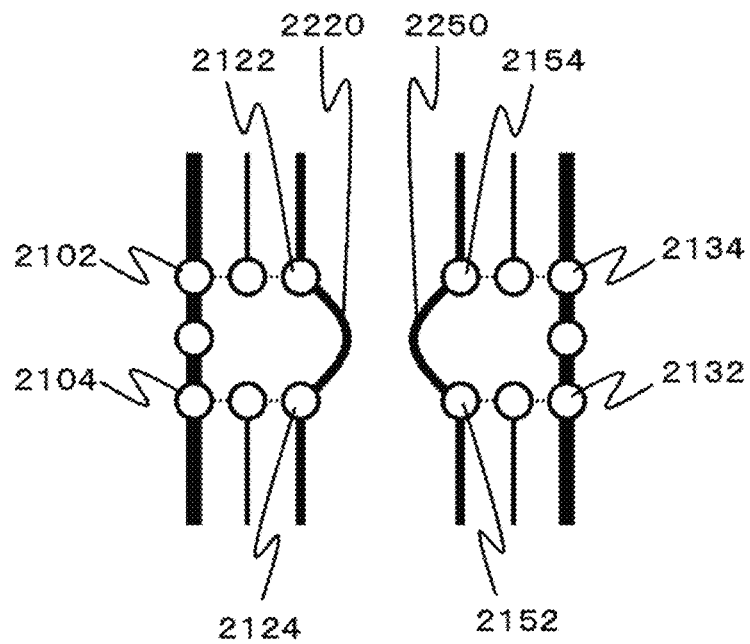
FIGS. 22A and 22B illustrate, as part of the operation of the contour line forming unit included in the operating device according to the first modification of the first embodiment, an operation of the intra-gap length-measuring contour line repair process.
Figure 22B:
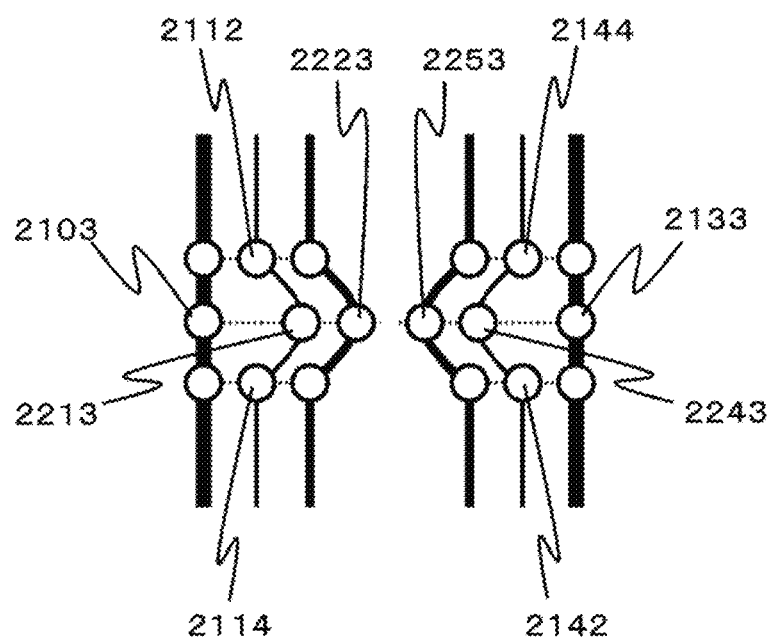

FIG. 22 illustrates an example in which correspondence between the second image contour line formed in step S1703 and the reference contour line can be achieved. In the case of the example of FIG. 22, initially, in step S1703, a second image contour line 2220 and a second image contour line 2250 are formed. Then, in step S1704, two points on the first image contour line corresponding to both ends of the gap interval, i.e., a start point 2122 and an end point 2124, and a start point 2152 and an end point 2154, are determined. In step S1902, the shortest path connecting the start point 2122 and the end point 2124, i.e., a second image contour line 2220, and the shortest path connecting the start point 2152 and the end point 2154, i.e., a second image contour line 2250, are determined (see FIG. 22(a)). In step S1905, a search is conducted from the reference edge 2103 in a profile acquisition direction at the reference edge 2103 so as to determine a corresponding point 2223 on the shortest path. Further, a search is conducted from the reference edge 2133 in a profile acquisition direction at the reference edge 2133 so as to determine a corresponding point 2253 on the shortest path. In step S1906, based on the profile acquisition direction at the reference edge 2103, a brightness profile is created in a range including the corresponding point 2223 of the reference edge 2103, and a length measuring edge 2213 is determined using an edge extraction parameter interpolated from an edge extraction parameter at the reference edge 2102 and an edge extraction parameter at the reference edge 2104. Similarly, a length measuring edge 2243 corresponding to the reference edge 2133 is also determined (see FIG. 22(b)).

Figure 23A:
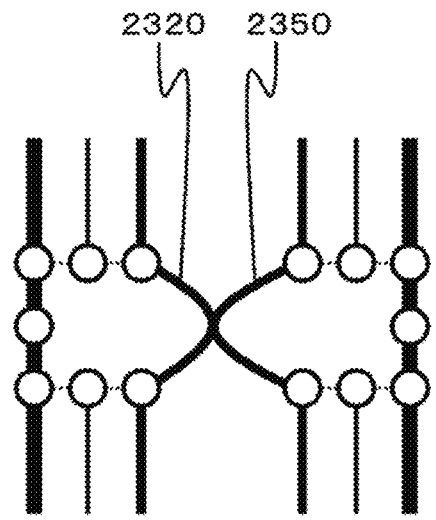
FIGS. 23A and 23B illustrate, as part of the operation of the contour line forming unit included in the operating device according to the first modification of the first embodiment, an operation of the intra-gap length-measuring contour line repair process.
Figure 23B:
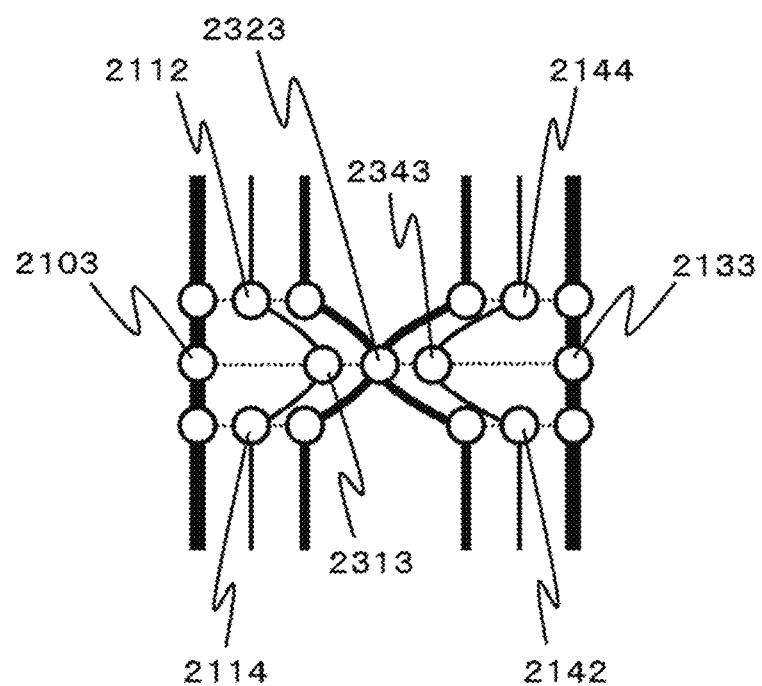

FIG. 23 illustrates an example in which, while a plurality of different interpretations are possible, an interpretation can be made such that correspondence between the second image contour line formed in step S1703 and the reference contour line can be achieved. In the case of the example of FIG. 23, initially, in step S1703, a second image contour line 2320 and a second image contour line 2350 are formed. However, at the point in time of step S1703, the second image contour line 2320 and the second image contour line 2350 are not formed as being separate, but they are formed as one linked region having "X" shape. Then, in step S1704, two points on the first image contour line corresponding to both ends of the gap interval, i.e., a start point 2122 and an end point 2124, and a start point 2152 and an end point 2154 are determined. Then, in step S1902, the shortest path connecting the start point 2122 and the end point 2124, i.e., a second image contour line 2220, and the shortest path connecting the start point 2152 and the end point 2154, i.e., a second image contour line 2250 are determined. Namely, the image contour lines formed as one linked region having "X" shape at the point in time of step S1703 are recognized as the two image contour lines of the second image contour line 2220 and the second image contour line 2250 at the end of the process of step S1902 (see FIG. 23(a)). Thereafter, in step S1905, a search is conducted from the reference edge 2103 in the profile acquisition direction at the reference edge 2103 so as to determine a corresponding point 2323 on the shortest path. Also, a search is conducted from the reference edge 2133 in the profile acquisition direction at the reference edge 2133 so as to determine a corresponding point 2353 on the shortest path. Herein, FIG. 23(b) illustrates the example in which the corresponding point 2353 is at the same position as the corresponding point 2323. Then, in step S1906, based on the profile acquisition direction at the reference edge 2103, a brightness profile is created in a range including the corresponding point 2323 of the reference edge 2103, and a length measuring edge 2313 is determined using an edge extraction parameter interpolated from an edge extraction parameter at the reference edge 2102 and an edge extraction parameter at the reference edge 2104. Similarly, a length measuring edge 2343 corresponding to the reference edge 2133 is also determined (see FIG. 23(b)).

Figure 24A:
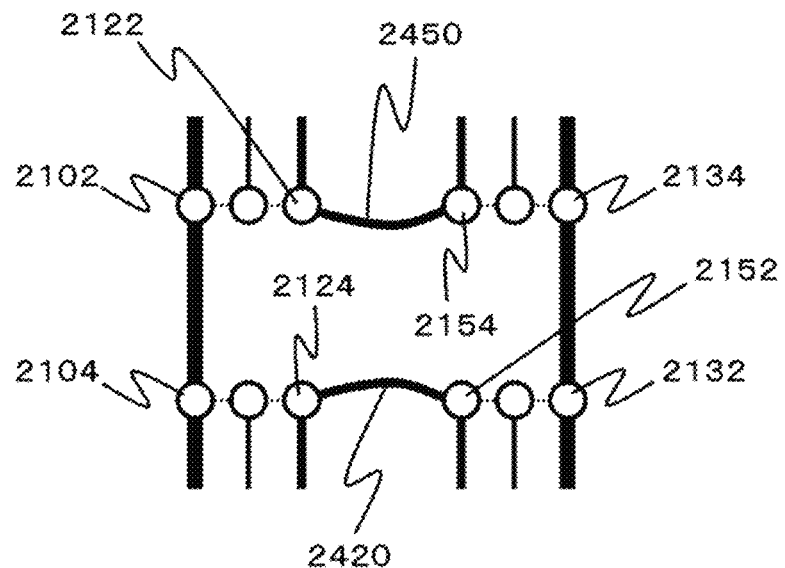
FIGS. 24A and 24B illustrate, as part of the operation of the contour line forming unit included in the operating device according to the first modification of the first embodiment, an operation of the inter-gap length-measuring contour line repair process.
Figure 24B:
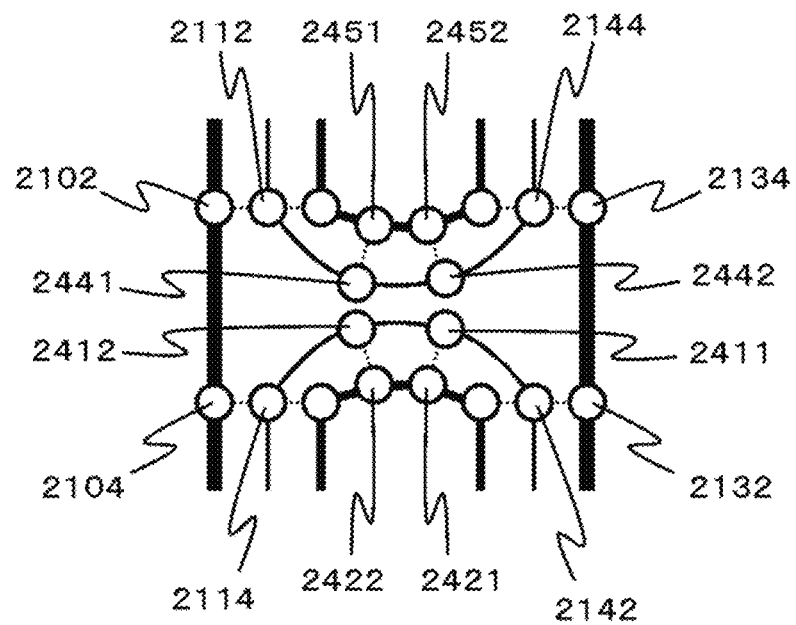

FIG. 24 illustrates a first example in which correspondence between the second image contour line formed in step S1703 and the reference contour line cannot be achieved. In the case of the example of FIG. 24, initially, in step S1703, a second image contour line 2420 and a second image contour line 2450 are formed. Then, in step S1704, the two points on the first image contour line corresponding to both ends of the gap interval, i.e., the start point 2122 and the end point 2124, and the start point 2152 and the end point 2154 are determined. In step S1902, it is attempted to determine the shortest path connecting the start point 2122 and the end point 2124, and the shortest path connecting the start point 2152 and the end point 2154. However, this is unsuccessful. Thus, in step S2003, the shortest path connecting the start point 2122 with any of the end points, and the shortest path connecting the start point 2152 with any of the end points are determined. In the case of FIG. 24, as such shortest paths, a second image contour line 2420 and a second image contour line 2450 are determined (see FIG. 24(a)). Then, in step S2005, the shortest path connected to the start point 2122, i.e., the second image contour line 2420, is divided to obtain a repairing edge 2421 and a repairing edge 2422. Similarly, the shortest path connected to the start point 2152, i.e., the second image contour line 2450, is divided to obtain a repairing edge 2451 and a repairing edge 2452. In step S2007, using the normal direction to the second image contour line 2420 at the repairing edge 2421 as a profile acquisition direction, a brightness profile at the position of the repairing edge 2421 is created, and a length measuring edge 2411 is determined using an edge extraction parameter interpolated from an edge extraction parameter at the reference edge 2102 and an edge extraction parameter at the reference edge 2134. Similarly, a length measuring edge 2412 corresponding to the repairing edge 2422, a length measuring edge 2441 corresponding to the repairing edge 2451, and a length measuring edge 2442 corresponding to the repairing edge 2452 are determined (see FIG. 24(*b*)).

Figure 25A:
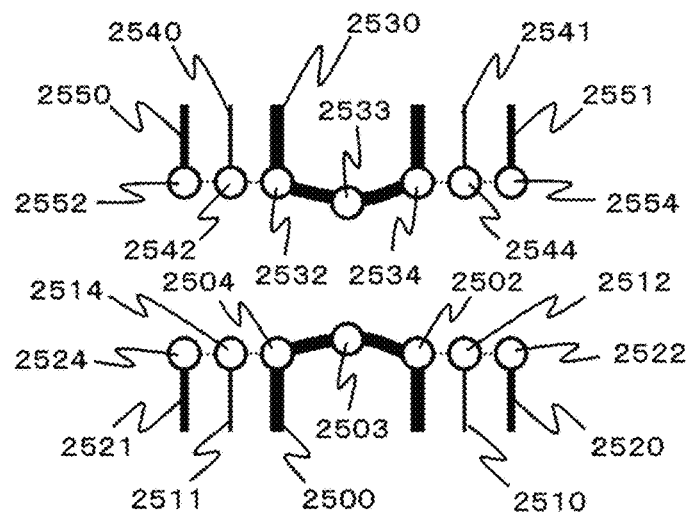
FIGS. 25A-25C illustrate, as part of the operation of the contour line forming unit included in the operating device according to the first modification of the first embodiment, an operation of the inter-gap length-measuring contour line repair process.
Figure 25B:
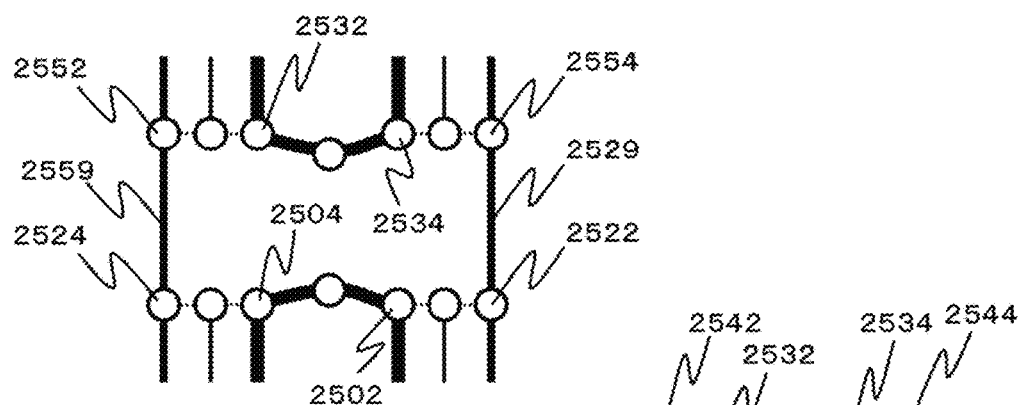
Figure 25C:
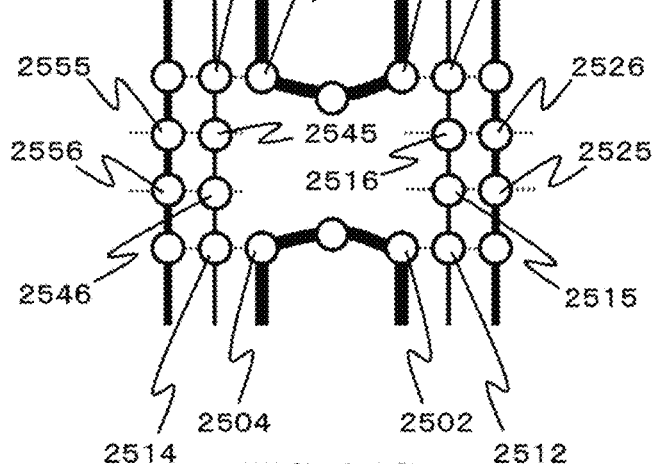

FIG. 25 illustrates a second example in which correspondence between the second image contour line formed in step S1703 and the reference contour line cannot be achieved.

FIG. 25(*a*) illustrates a state in which the process of step S1701 has been completed in the length-measuring contour line repair process described with reference to FIG. 17. A first image contour line 2520 and a first image contour line 2521 are formed in association with respective intervals of the reference contour line 2500 for which a length-measuring contour line 2510 and a length-measuring contour line 2511 are respectively determined. A first image contour line 2550 and a first image contour line 2551 are formed in association with respective intervals of the reference contour line 2530 for which a length-measuring contour line 2540 and a length-measuring contour line 2541 are respectively determined. In the state of FIG. 25, of the three successive reference edges on the reference contour line 2500, i.e., a reference edge 2502, a reference edge 2503, and a reference edge 2504, the reference edge 2503 does not have a corresponding length measuring edge. Thus, the interval from the reference edge 2502 to the reference edge 2504 provides a "gap interval", which is the object of repair of the length-measuring contour line. Similarly, because the reference edge 2533 does not have a corresponding length measuring edge, the interval from the reference edge 2532 to the reference edge 2534 provides a "gap interval", which is the object of repair of the length-measuring contour line.

In the case of the example of FIG. 25, initially, in step S1703, a second image contour line 2529 and a second image contour line 2559 are formed. Then, in step S1704, two points on the first image contour line corresponding to both ends of the gap interval, i.e., a start point 2522 and an end point 2524 and a start point 2552 and an end point 2554 are determined. Then, in step S1902, it is attempted to determine the shortest path connecting the start point 2522 and the end point 2524, and the shortest path connecting the start point 2552 and the end point 2554. However, the attempt is unsuccessful, so that in step S2003 the shortest path connecting the start point 2522 with any of the end points, and the shortest path connecting the start point 2552 with any of the end points are determined. In the case of the example of FIG. 25, as such shortest paths, the second image contour line 2529 and the second image contour line 2559 are determined (see FIG. 25(*b*)). Thereafter, in step S2005, the shortest path connected to the start point 2522, i.e., the second image contour line 2529 is divided to obtain a repairing edge 2525 and a repairing edge 2526. Similarly, the shortest path connected to the start point 2552, i.e., the second image contour line 2559 is divided to obtain a repairing edge 2555 and a repairing edge 2556. Then, in step S2007, using the normal direction to the second image contour line 2529 at the position of the repairing edge 2525 as a profile acquisition direction, a brightness profile at the position of the repairing edge 2525 is created, and a length measuring edge 2515 is determined using an edge extraction parameter determined by interpolation from an edge extraction parameter at the reference edge 2502 and an edge extraction parameter at the reference edge 2534. Similarly, a length measuring edge 2516 corresponding to the repairing edge 2526, a length measuring edge 2545 corresponding to the repairing edge 2555, and a length measuring edge 2546 corresponding to the repairing edge 2556 are determined (see FIG. 25(*c*)).

Figure 43A:
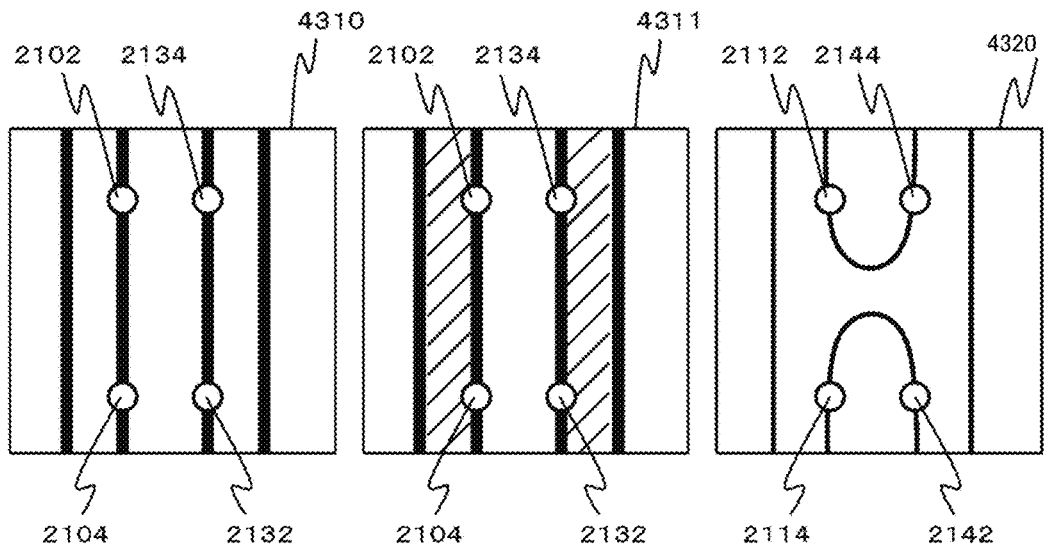
FIGS. 43A and 43B illustrate, as part of the operation of the contour line forming unit included in the operating device according to the first modification of the first embodiment, a defect type distinguishing method in a case where the inter-gap length-measuring contour line repair process is performed.
Figure 43B:
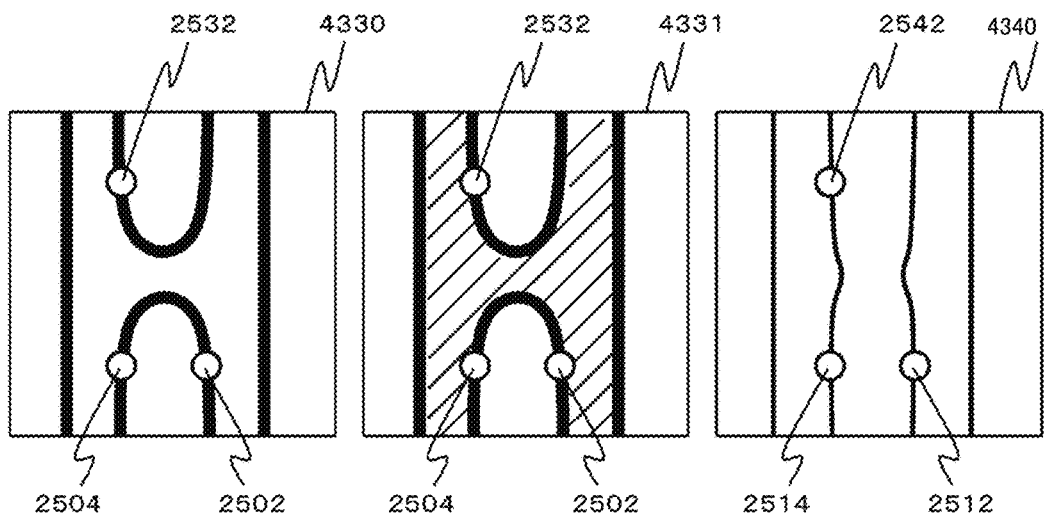
Figure 44A:
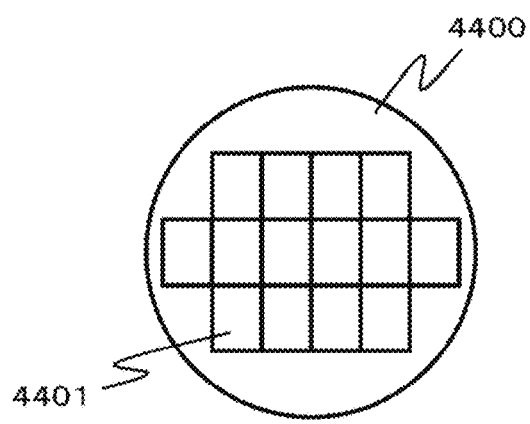
FIGS. 44A-44E illustrate an inspection image acquisition method in the pattern inspecting device according to a second modification of the first embodiment.
Figure 44B:
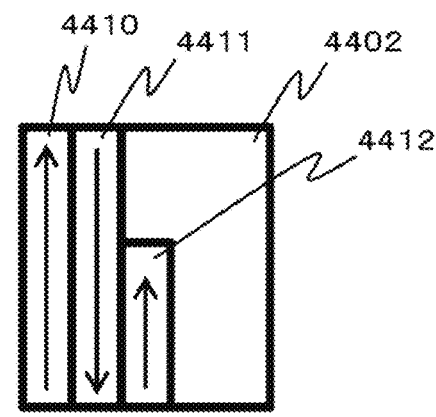
Figure 44C:
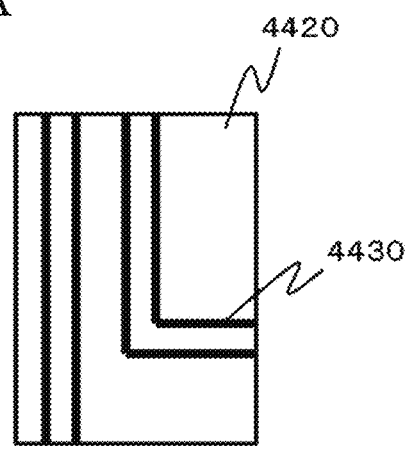
Figure 44D:
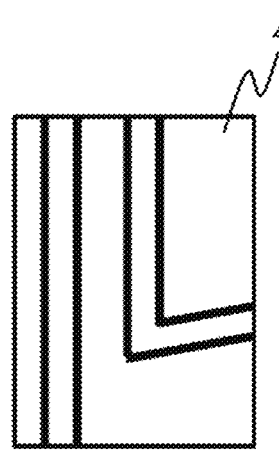
Figure 44E:
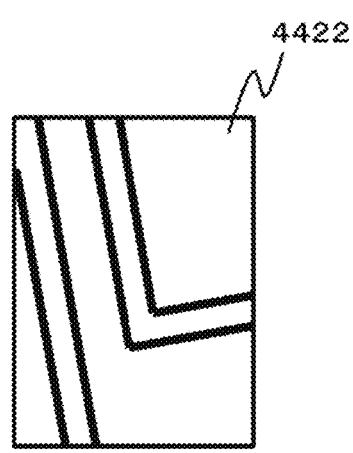

FIG. 43 illustrates a method of distinguishing whether the state of defect is bridging or necking when a repair is conducted in the inter-gap length-measuring contour line repair process. In FIG. 43, portions similar to those of FIG. 24 are designated with signs similar to those of FIG. 24, and their detailed description will be omitted. Further, in FIG. 43, portions similar to those of FIG. 25 are designated with signs similar to those of FIG. 25, and their detailed description will be omitted.

FIG. 43(*a*) illustrates an example of bridging corresponding to the case of FIG. 24. FIG. 43(*b*) illustrates an example of necking corresponding to the case of FIG. 25. In FIG. 43(*a*), with respect to an image 4310 in which reference contour lines are drawn, an image 4311 is provided with hatching on the side where a pattern is present, with reference to information about the orientation of the reference contour line. By comparing these images with an image 4320 in which length-measuring contour lines are drawn, it can be seen that the portion of the length-measuring contour lines that is related to the inter-gap length-measuring contour line repair process, i.e., the interval from the length measuring edge 2112 to the length measuring edge 2144, for example, is present on the left side of the reference contour line including the reference edge 2102 and the reference edge 2104. This can be determined by various methods. For example, the image 4311 is created, and the length of the shortest path (first shortest path) from the reference edge 2102 corresponding to the length measuring edge 2112 to the reference edge 2134 corresponding to the length measuring edge 2144 through the region without hatching is compared with the length of the shortest path (second shortest path) through the region with hatching. Then, if the length of the first shortest path is shorter, it is determined that there is "bridging"; if the length of the second shortest path is shorter, it is determined that there is "necking". If there is no shortest path, the shortest path length is defined as "infinite". The first shortest path may be determined by known technology, such as Dijkstra's method, using the pixels of the image 4311 as vertexes, and linking the vertexes corresponding to the pixels that are adjacent in the region without hatching by sides, the weight of the sides being the distance between the pixels. The second shortest path may also be determined by a similar method with the exception that the vertexes corresponding to the pixels that are adjacent in the region with hatching are connected by sides. From the vertexes corresponding to the pixels corresponding to the reference edge 2102 and the reference edge 2134, the sides are connected to the vertexes corresponding to each of adjacent pixels.

In the case of FIG. 43(*b*) too, with respect to an image 4330 in which reference contour lines are drawn, an image 4331 is provided with hatching on the side where a pattern is present with reference to information about the orientation of the reference contour lines. As in the case of FIG. 43(*a*), by comparing these images and an image 4340 in which length-measuring contour lines are drawn, it can be determined that there is a necking state.

Thus, the present modification is provided with the process of repairing the length-measuring contour line in the interval in which the length-measuring contour line is lacking when a contour line for defect detection is formed. In this way, when the amount of deformation from the reference pattern is large and the initial parameter calculation interval cannot be found in the process of step S903, the shape of the defect location can be more accurately grasped. Further, when there is bridging or necking, not only the region can be detected as a defect region but also the type of defect such as "bridging" or "necking" can be distinguished. The result of the distinguishing may be output as information accompanying the defect information.

In the process of step S1902 of the intra-gap length-measuring contour line repair process described with reference to FIG. 19, and in the process of step S2003 of the inter-gap length-measuring contour line repair process described with reference to FIG. 20, when the weighted undirected graph is created for the shortest path determination, a process of separating the second image edge into link components on the contour image may be added as preprocessing. By adding such preprocessing, when the weighted undirected graph is created in the process of step S1902 or step S2003, only the second image edges included in the link component adjacent to the start point of the gap interval of interest may be considered the object of processing, rather than the second image edges as a whole, whereby the processing time can be decreased.

The weighted undirected graph may also be created such that the weight of the side is "0", and the weight of the vertex has a positive value that decreases with increasing pixel value. In this case, instead of determining the shortest path, a path with the minimum weight is determined. The minimum weight path may be determined by a known technique. In this configuration, the contour line may be repaired using a path that preferentially traces portions that appear brightly on the inspection image.

Second Modification of the First Embodiment

In the following, a second modification of the first embodiment will be described with reference to FIG. 44 and FIG. 45. The present modification represents an example of a pattern inspecting device which may be preferably used for inspecting a wide range on a wafer as the object of inspection at high speed while preventing the phenomenon of an edge parallel with the electron beam scan direction being blurred by the influence of charge. The pattern inspecting device according to the present modification differs from the pattern inspecting device according to the first embodiment mainly in the inspection image acquisition method and the process flow of the pattern inspection process. Thus, in the following, the inspection image acquisition method and the process flow of the pattern inspection process will be described in detail.

FIG. 44 illustrates an inspection image acquisition method in the pattern inspecting device according to the present modification. In the present modification, a wide range of a semiconductor pattern formed on a die 4401 on a wafer 4400 shown in FIG. 44(a) is considered the object of inspection. In order to acquire an SEM image of the range of the inspection object at high speed, an SEM image is acquired while the stage (sample base) is moved. For example, when the inspection object range is as shown by an inspection range 4402 in FIG. 44(b), SEM images are acquired successively along the directions of arrows while overlapping boundary portions of a first inspection stripe (band-like inspection range) 4410, a second inspection stripe 4411, a third inspection stripe 4412, and so on (namely, the stage is moved in the opposite directions to the arrows). FIG. 44(b) illustrates a state in which the third inspection stripe 4412 is still being acquired. From each inspection stripe, longitudinal image data are acquired. The acquired image data are input to the operating/processing device 110 as an inspection image for a pattern inspection process. Conventionally, when the inspection image is acquired, an electron beam scan is performed in a direction perpendicular to the direction of movement of the stage. Thus, for example in an inspection image 4420 shown in FIG. 44(c), a phenomenon may be caused in which a lateral pattern 4430 parallel with the electron beam scan direction is blurred by the influence of charge. Because a semiconductor circuit pattern generally often includes longitudinal and lateral patterns, some measure against the phenomenon has been sought. In this respect, according to the present modification, the electron beam scan direction is inclined with respect to the direction perpendicular to the direction of movement of the stage (hereafter referred to as "inclined scan"). As a result, an image such as an inspection image 4421 shown in FIG. 44(d) is acquired. By adopting such configuration, the electron beam scan direction and the direction of the lateral pattern 4430 do not become parallel, whereby the degree of blurring of the lateral pattern 4430 by the influence of charge can be decreased. The angle of inclination of the electron beam scan direction with respect to the direction perpendicular to the direction of movement of the stage (hereafter referred to as an "inclined scan angle") is 10 degrees in the present modification. However, the angle is not limited to the above. Instead of inclining the electron beam scan direction with respect to the direction perpendicular to the direction of movement of the stage, the die may be inclined relatively to the direction of movement of the stage. In this way, as illustrated by an inspection image 4422 shown in FIG. 44(e), the electron beam scan direction and the direction of the lateral pattern 4430 do not become parallel, whereby the phenomenon of the lateral pattern 4430 being blurred by the influence of charge can be solved. However, in this case, the number of the inspection stripes required for inspecting the entire surface of the die increases, and the process becomes complex due to different dimensions of the inspection images for each inspection stripe (for example, the algorithm for increasing processor allocation efficiency in a parallelized process becomes complex). Thus, there still remains a problem from the viewpoint of high speed inspection, as opposed to the method according to the present modification. Further, in the method of the present modification, respective longitudinal patterns included in the same inspection stripe are inspected under the same conditions, so that the reliability of the inspection result can be said to be high compared with the method of FIG. 44(e) by which the longitudinal patterns are included in a plurality of inspection stripes. In FIG. 44(c), FIG. 44(d), and FIG. 44(e), white bands are drawn with black lines from the viewpoint of visibility.

Figure 45:
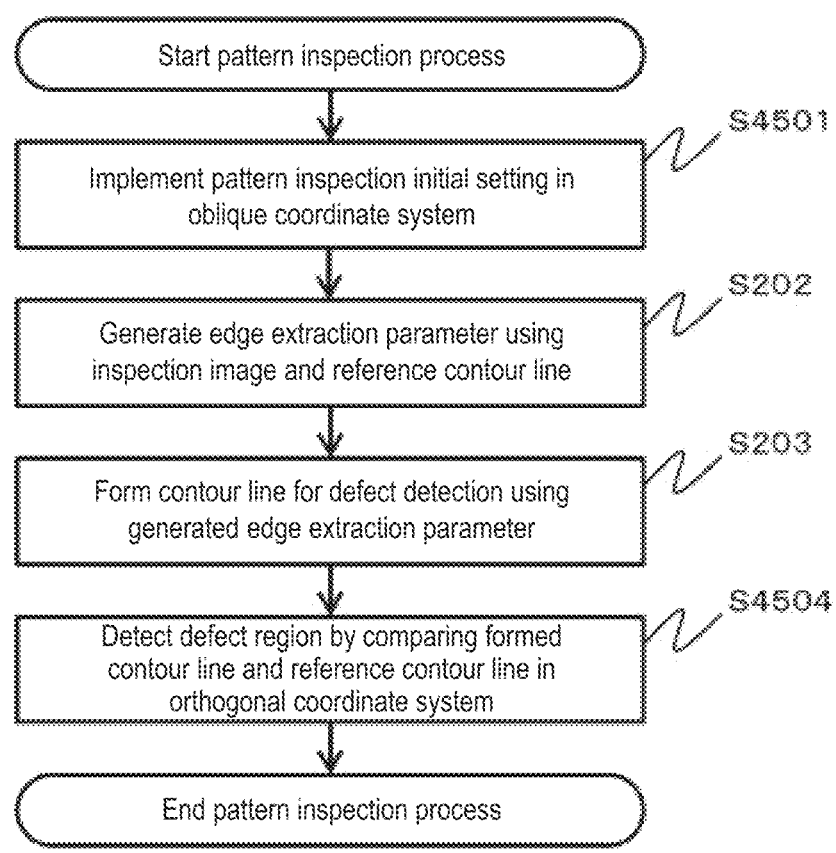
FIG. 45 is a flowchart of an operation of the pattern inspecting device according to the second modification of the first embodiment.

FIG. 45 is a flowchart of an operation of the pattern inspecting device according to the present modification. In FIG. 45, portions similar to those of FIG. 2 are designated with similar signs in FIG. 2 and their detailed description will be omitted.

As the pattern inspection process is started, initially, in step S4501, the initial setting unit 112 performs initial setting of an inspection image and a reference pattern. Preprocessing concerning the inspection image is a process similar to that of step S201. With regard to design data, the design data of a range corresponding to the inspection image is read from the storage device 130. After a design data deforming process, such as a pattern figure edge rounding process, is performed as needed, conversion to an oblique coordinate system is performed based on the inclined scan angle, and then a reference contour line is determined based on the converted design data. With regard to the positioning of the reference contour line and the inspection image, the range identified by the inclined scan using dictionary data is a parallelogram. Thus, in order not to detract from the uniqueness of the dictionary data, after the parallelogram is determined based on the inclined scan angle, a template image corresponding to a rectangular region that circumscribes the parallelogram is generated, and template matching is performed.

As a method for handling the inclined scan, the inspection image may be subjected to coordinate conversion instead of the design data. However, since one of the features of the present invention lies in the use of a length measuring edge determined by generating an appropriate edge extraction parameter so as to perform sub-pixel accuracy inspection. Accordingly, it is preferable to use a design data converting method that does not affect the brightness profile.

The processes of step S202 and step S203 that are performed after the process of step S4501 are similar to the processes according to the first embodiment. After the process of step S203, in step S4504, the inspection unit 115 inspects the pattern by comparing the length-measuring contour line formed in step S203 with the reference contour line. After information concerning a region determined to be a defect region is output as an inspection result, the pattern inspection process is completed. The process of step S4504 differs from the process of step S204 in that at the start of the process, with respect to the length-measuring contour line and the reference contour line, conversion from the oblique coordinate system to the orthogonal coordinate system is implemented based on the inclined scan angle. Because these contour lines provide geometric information, no degradation of information is caused by the coordinate system conversion process. Further, the orthogonal coordinate system conversion enables defect determination based on correct distance. The process after the implementation of the coordinate system conversion process with respect to the length-measuring contour line and the reference contour line is similar to the process of step S204.

Thus, according to the present modification, with respect also to the inspection image obtained by imaging involving stage movement and inclined scan, the present invention is applied using the configuration with reduced influence on the brightness profile. Thus, the reliability of the inspection result can be increased.

In the present modification, the SEM image is acquired while the stage is moved. However, the method of acquiring the SEM image according to the present invention is not limited to the above configuration, and various other methods for inspecting the band-like regions may be used. For example, an SEM image is acquired after the stage is stopped, and the stage is moved to the next inspection position after the SEM image acquisition has been completed. In this case, the electron beam scan direction may be inclined with respect to a direction perpendicular to the longitudinal direction of the band-like region.

Second Example

Second Embodiment

In the following, a second embodiment will be described with reference to FIG. 26 to FIG. 30. The present embodiment represents an example of a dimension measuring device which may be preferably used for measuring the dimension of the evaluation object pattern while decreasing the influence of noise or the influence of small roughness.

In the field of semiconductor manufacturing, dimension management has been implemented using a dimension measured from an image obtained by CD-SEM (SEM image), by a threshold value method, for example. The object of dimension management includes, for example, the line pattern width and hole pattern diameter. As the process rule evolves, pattern dimension becomes smaller, and the influence of length measurement value variations accompanying side wall irregularities on the pattern dimension becomes relatively large. As a result, there is a growing need for accurately measuring and managing an index referred to as line edge roughness (LER) or line width roughness (LWR). For example, the LER or LWR is measured by dividing a predetermined measurement range at multiple points in a longitudinal direction from a line pattern image obtained by CD-SEM, and determining the variation ($3\sigma$) of the amount of divergence from an edge position reference line determined in each divided range by a technique such as a threshold value method, or the variation ($3\sigma$) of the length measurement value. However, it is known that if noise is superposed on the acquired image, an error called "noise-induced bias" is caused by a displacement of the position of an observation edge from a true position due to image noise at the time of extracting the pattern edge, and it is desirable to decrease the error.

When a fixed edge extraction parameter is used, irregularities are caused in the contour line used for length measurement due to the influence of noise and the like. In the method by which the contour line is geometrically smoothed in order to decrease the contour line irregularities, even an irregular shape that is desired to be reflected in the measurement value could possibly be smoothed. According to the inventor's analysis, one reason for this is smoothing without consideration of the profile shape. Further, by the method that uses an averaged brightness profile for decreasing the variations, a portion with a different side wall shape is also included in the averaging calculation. As a result, even if a processing technique of aligning the peak positions of the brightness profile is implemented during the averaging process, for example, the greater the range that is averaged, the less visible will the local feature that should be picked up become.

The inventor, based on the understanding that the above problem is caused by the determination of the edge position using the same edge extraction parameter in all brightness profiles, proposes the present embodiment as a solution example. In the present embodiment, a contour line formed with a predetermined edge extraction parameter described by the recipe and the like is used as a reference contour line, an edge extraction parameter suitable for measuring dimension is generated, and a contour line for measuring dimension is formed. Hereafter, the details will be described.

Figure 26:
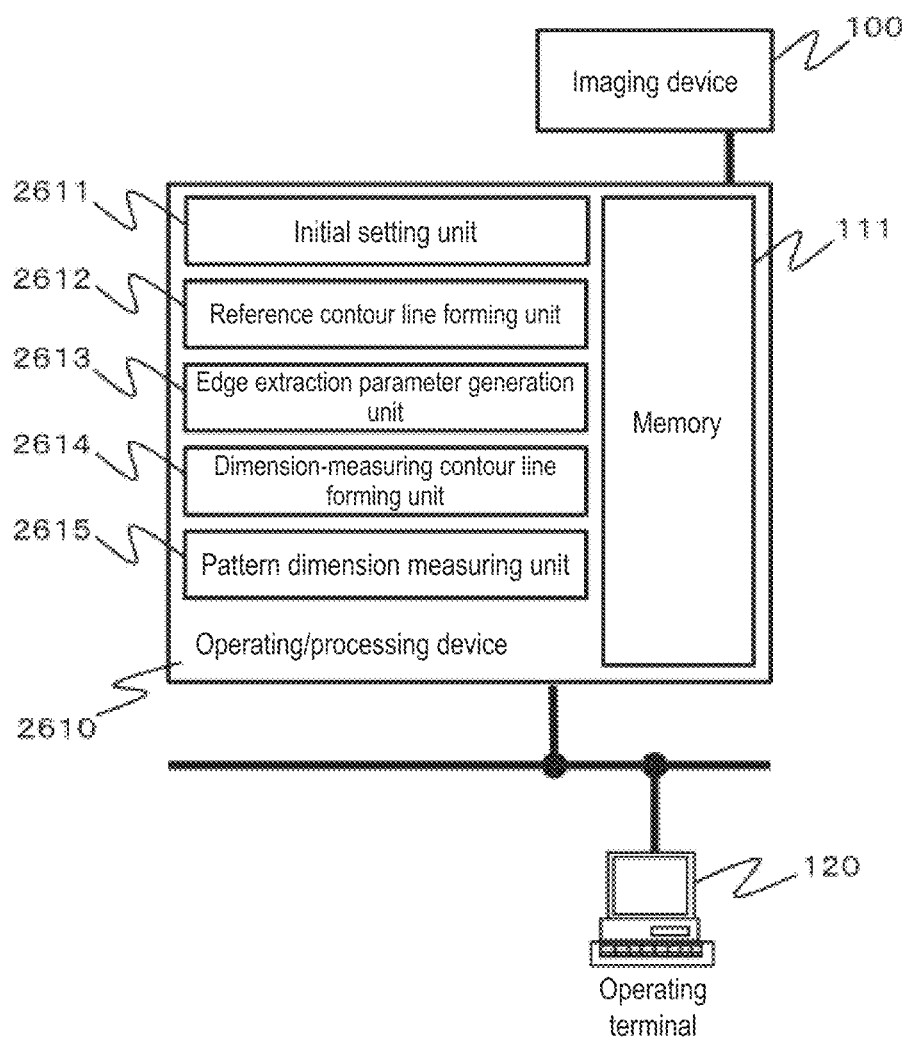
FIG. 26 illustrates a configuration of a dimension measuring device according to a second embodiment.

FIG. 26 illustrates a configuration of a dimension measuring device according to the present embodiment. In FIG. 26, portions similar to those of FIG. 1 are designated with similar signs in FIG. 1, and their detailed description will be omitted.

Figure 27:
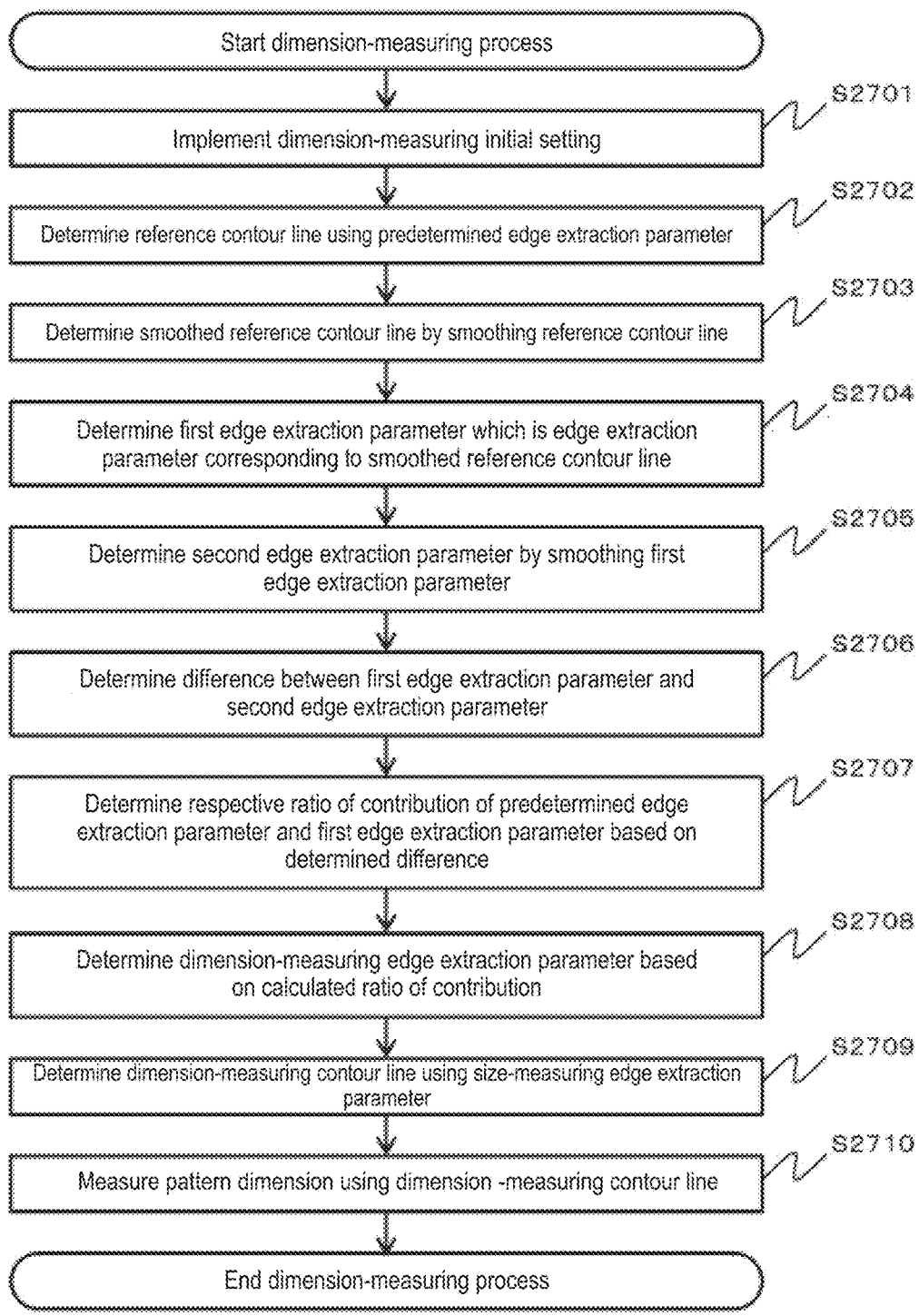
FIG. 27 is a flowchart of an operation of the dimension measuring device according to the second embodiment.

An operating/processing device 2610 according to the present embodiment includes the memory 111; an initial setting unit 2611 that executes the process of step S2701 and the like of FIG. 27; a reference contour line forming unit 2612 that executes the process of step S2702 and the like of FIG. 27; an edge extraction parameter generation unit 2613 that executes the process of step S2703 to S2708 and the like of FIG. 27; a dimension measuring contour line forming unit 2614 that executes the process of step S2709 and the like of FIG. 27; and a pattern dimension measurement unit 2615 that executes the process of step S2710 and the like of FIG. 27. Based on an SEM image input from the imaging device 100, the dimension of the pattern formed on the sample 101g is measured. Information required for processes executed by the operating/processing device 2610, such as "how the dimension of which portion of the pattern present at which position on the sample is to be measured", is stored in the memory 111 in the operating/processing device 2610 as a dimension measuring recipe. The recipe includes an operating program for automatically operating the dimension measuring device. The recipe may be stored in the memory 111 or an external storage medium for each type of the sample as the object of measurement, and is read as needed.

The operating/processing device 2610 is also connected to the operation terminal 120. In response to an input from the operator via the input means of the operation terminal 120, the operating/processing device 2610 modifies the content of the measurement process or displays a measurement result and the like on a display device of the operation terminal 120 as needed. These functions may be implemented by a graphical interface called "GUI", for example.

An operation of the dimension measuring device according to the present embodiment will be described with reference to FIG. 27 to FIG. 30. FIG. 27 is a flowchart of the operation of the dimension measuring device according to the present embodiment. FIG. 28 illustrates charts generated by a simulation assuming the measurement of the line width of longitudinal line patterns for describing the operation of the dimension measuring device according to the present embodiment. Specifically, the edge position in FIG. 28 indicates the edge position on one side of contour lines formed in length measuring cursors on both left and right sides when the length measuring cursors 3001 (as will be described later) are disposed with respect to a longitudinal line pattern as shown in FIG. 30(a). Thus, in FIG. 28, each curve is expressed as a function of the Y-coordinate (longitudinal position). An interval 2801 is intended for behavior observation when there is an exceptional value or the influence of noise. An interval 2802 is an interval intended for observation of a behavior with respect to a gradual and large change also accompanied by a change, such as a defect, in the shape of a brightness profile.

The method of dimension measurement according to the present embodiment is similar to conventional dimension measuring method with the exception that, as the edge extraction parameter for generating the length-measuring contour line for dimension measurement, a value generated by the operating/processing device 2610 is used. Namely, as shown in FIG. 30(a), a range as the object of measurement is designated using the length measuring cursor 3001, and length measuring edges are determined at predetermined intervals in the measurement object range. Then, dimension measurement is performed using a plurality of the determined length measuring edges. Whether the brightness profile is created toward the inside or outside of the disposed length measuring cursor 3001 is designated by the dimension measuring recipe and the like stored in the memory 111 in the operating/processing device 2610. The edge extraction parameter for determining the length measuring edges will be described with reference to an example of using the threshold value method. Thus, the edge extraction parameter takes a value of not lower than "0%" and not more than "100%".

As the dimension measurement process is started, initially, in step S2701, the initial setting unit 2611 performs initial setting of an SEM image as the object of processing. Specifically, the initial setting unit 2611 initially acquires the SEM image from the imaging device 100, and implements preprocessing as needed. The preprocessing includes, for example, a smoothing process for noise removal. The preprocessing may be suitably implemented using a known technology. In the following description of the present embodiment, the SEM image that has been subjected to preprocessing as needed may be simply referred to as "SEM image". The initial setting unit 2611 then, based on the dimension measuring recipe stored in the memory 111 of the operating/processing device 2610, locates the length measuring cursor at a predetermined position of the SEM image. If a field of view error could be caused when the SEM image is acquired, it is necessary to perform position correction when locating the length measuring cursor. The amount of correction may be determined by known technology. For example, when, as information for positioning, image data of a non-defective portion is registered in the recipe together with reference coordinates, the determination may be made by template matching using a normalized cross-correlation value and the like as an evaluation value. When, as positioning information, design data of a layout pattern and the like is registered in the recipe together with reference coordinates, the determination may be made by matching of a contour line extracted from the image data and the design data.

Figure 28A:
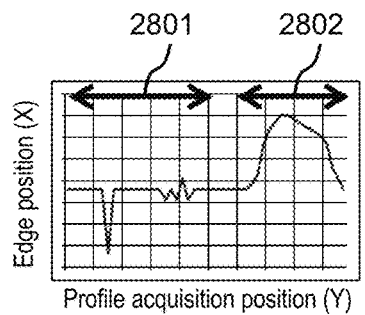
FIGS. 28A-28I illustrate an operation of the dimension measuring device according to the second embodiment.

Then, in step S2702, the reference contour line forming unit 2612 determines from the SEM image a reference contour line using a predetermined edge extraction parameter P0 (see FIG. 28(a)). For the predetermined edge extraction parameter P0, a value designated by a dimension measuring recipe stored in the memory 111 and the like of the operating/processing device 2610, or a value input from the operator via the input means of the operation terminal 120 is used. When the value input by the operator is used, a mode of GUI as will be described later may be used (see FIG. 29). The reference contour line in the present embodiment is a contour line as a dimension measurement reference, and formed by successively determining length measuring edges corresponding to the predetermined edge extraction parameter P0 using known technology, such as a threshold value method. In this case, the position and direction for acquiring the brightness profile are determined by the dimension measurement method and the location of the length measuring cursor which may be designated by the dimension measuring recipe. For example, FIG. 30(a) illustrates an example in which the line width of a longitudinal line pattern is measured. The reference edges are set at predetermined intervals in the length measuring cursor, and the direction in which the brightness profile is acquired is the lateral direction, i.e., a direction parallel to an X-axis.

The position and direction of brightness profile acquisition may be determined based on the image contour line. For example, after an image contour line is determined from the SEM image using known technology, edges are disposed at regular intervals along the image contour line, and a brightness profile is acquired at the position of the edges in a direction perpendicular to the direction of the tangent to the image contour line. In this configuration, the present embodiment can be applied even when the length measuring cursor is not disposed, such as when two-dimensional shape evaluation is desired, for example.

Figure 28B:
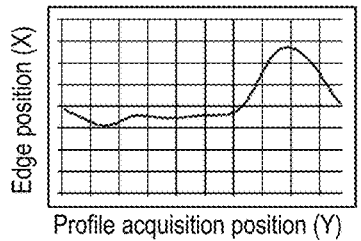

In step S2703, the edge extraction parameter generation unit 2613 smoothes the reference contour line to determine a smoothed reference contour line (see FIG. 28(b)). Specifically, this may be implemented using known technology, such as simple moving averaging or weighted moving averaging along the reference contour line, or curve approximation. FIG. 28(b) illustrates an example of weighted moving averaging using the Hann window as weight.

Figure 28C:
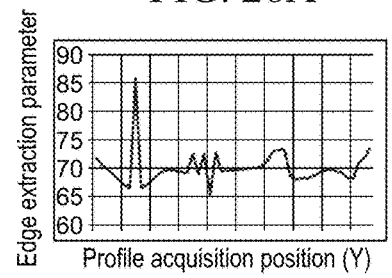

Thereafter in step S2704, the edge extraction parameter generation unit 2613 determines a first edge extraction parameter P1 which is the edge extraction parameter corresponding to the smoothed reference contour line (see FIG. 28(c)). The first edge extraction parameter P1 is a unique value for each reference edge. The process of step S2704 is similar to the process of step S602 according to first embodiment, and involves determining an edge extraction parameter corresponding to the smoothing reference edge position on the same brightness profile as that during reference edge extraction. In the present embodiment, on which side of the image contour line the length measuring edge is extracted is determined by the dimension measuring recipe in advance. Thus, when the position of the smoothing reference edge is not included in the interval of 0% to 100% on the brightness profile, the edge extraction parameter is "0%" if displaced on the 0% side; if displaced on the 100% side, the edge extraction parameter is "100%".

Figure 28D:
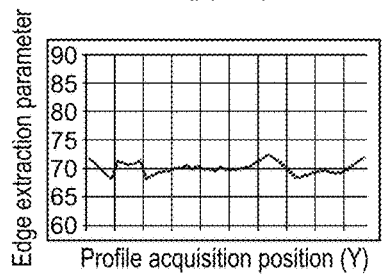
Figure 28D:
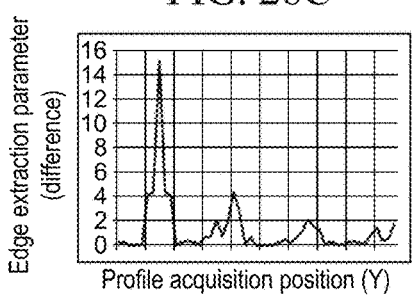

In step S2705, the edge extraction parameter generation unit 2613 smoothes the first edge extraction parameter P1 to determine a second edge extraction parameter P2 (see FIG. 28(d)). The second edge extraction parameter P2 is a unique value for each reference edge. Specifically, the smoothing of the first edge extraction parameter P1 may be implemented using known technology, such as simple moving averaging or weighted moving averaging along the reference contour line, or curve approximation. FIG. 28(d) illustrates an example of simple moving averaging.

Figure 28E:
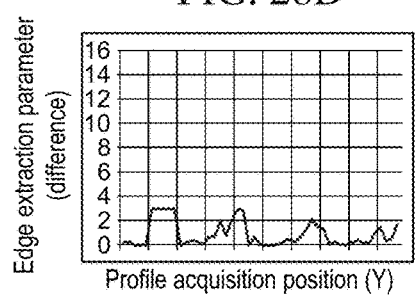

In step S2706, the edge extraction parameter generation unit 2613 determines the difference between the first edge extraction parameter P1 and the second edge extraction parameter P2 (see FIG. 28(e)). Specifically, the absolute value of "P1-P2" is computed for each reference edge.

In step S2707, the edge extraction parameter generation unit 2613 determines, based on the difference, the ratio of contribution of each of the predetermined edge extraction parameter and the first edge extraction parameter. Specifically, by using the smaller of the difference D and the predetermined threshold value TD, namely a value Dc, the ratio of contribution W0 of the predetermined edge extraction parameter is computed according to "(TD−Dc)/TD", and the ratio of contribution W1 of the first edge extraction parameter is computed according to "Dc/TD". Namely, when the difference between the first edge extraction parameter and the second edge extraction parameter is relatively small, the ratio of contribution of the predetermined edge extraction parameter is relatively increased. When the difference between the first edge extraction parameter and the second edge extraction parameter is relatively large, the ratio of contribution of the first edge extraction parameter is relatively increased. If interpreted more intuitively, the predetermined edge extraction parameter is valued highly with respect to a portion where a change in the edge extraction parameter is locally large. On the other hand, with respect to a portion where the change in edge extraction parameter is locally large, because it can be considered that the influence of noise and the like is large, the ratio of contribution of the first edge extraction parameter is increased so as to obtain an edge extraction parameter such that a dimension measurement edge can be extracted near the smoothing reference edge.

During the computation of the ratio of contribution, the smaller of the difference D and the predetermined threshold value TD, namely the value Dc (see FIG. 28(e)) is used for the following reason. Specifically, while the intension of determining the contribution ratios is to determine an edge extraction parameter such that the edge for dimension measurement can be extracted near the smoothing reference edge with respect to a portion where the influence of noise and the like is large, it is considered appropriate, with respect to a portion having a difference of certain degree or more, to adopt the position of the smoothing reference edge regardless of the magnitude of the difference.

Figure 28F:
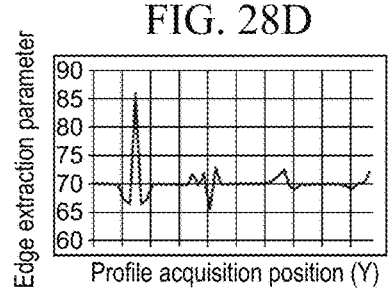

In step S2708, the edge extraction parameter generation unit 2613, based on the calculated ratios of contribution, determines the edge extraction parameter for dimension measurement (see FIG. 28(f)). Specifically, an edge extraction parameter Pmsr for dimension measurement is determined as a weighted average of the predetermined edge extraction parameter P0 and the first edge extraction parameter P1 according to "Pmsr=W0×P0+W1×P1". The edge extraction parameter Pmsr for dimension measurement is a unique value for each reference edge, and is determined using the corresponding first edge extraction parameter P1 for each reference edge.

When a minimum value Pmin and a maximum value Pmax of the edge extraction parameter is designated by the operator of the operation terminal 120 using an input interface and the like as will be described later (see FIG. 29) or designated by the dimension measuring recipe, the value of the edge extraction parameter Pmsr for dimension measurement that has been determined by weighted averaging is corrected as needed. Specifically, if the value of the edge extraction parameter Pmsr for dimension measurement determined by weighted averaging is smaller than Pmin, the value of the edge extraction parameter Pmsr for dimension measurement is corrected to be equal to Pmin. If the value of the edge extraction parameter Pmsr for dimension measurement determined by weighted averaging is greater than Pmax, the value of the edge extraction parameter Pmsr for dimension measurement is corrected to be equal to Pmax.

Figure 28G:
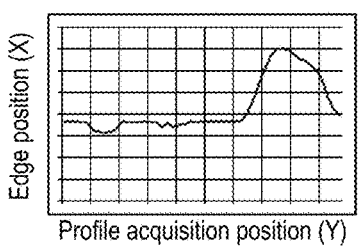

In step S2709, the dimension measuring contour line forming unit 2614, using the edge extraction parameter Pmsr for dimension measurement, determines a contour line for measuring dimension from the SEM image (see FIG. 28(g)). Specifically, on the brightness profile acquired for each reference edge in step S2702, the length measuring edge for dimension measurement is determined using the edge extraction parameter Pmsr for dimension measurement corresponding to the reference edge.

Figure 28H:
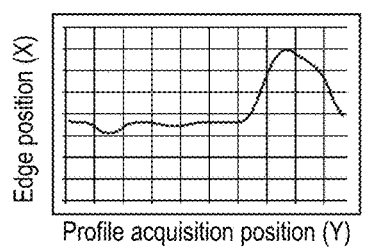

After the contour line for measuring dimension is determined using the edge extraction parameter Pmsr for dimension measurement, geometric smoothing may be performed (see FIG. 28(h)). The smoothing is performed for the purpose of mitigating the phenomenon in which the portion that has originally been smooth is made continuously indifferentiable by the threshold value processes of step S2707 and step S2708. Thus, a filter having a small radius may be used for implementation. FIG. 28(h) illustrates an example of using the Hann window of a diameter of 3.

Figure 28I:
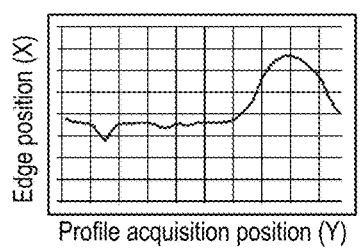

For comparison, FIG. 28(i) illustrates a contour line determined using an edge extraction parameter determined based not on the difference in edge extraction parameters but on the difference in distance in the process of step S2706 to step S2707. When the respective contour lines of FIG. 28(b), FIG. 28(h), and FIG. 28(i) that have been generated based on FIG. 28(a) are compared, it can be seen that FIG. 28(b) and FIG. 28(h) are superior from the viewpoint of decreasing the influence of an exceptional value or noise present in the interval 2801, while FIG. 28(h) is superior from the viewpoint of high traceability to the contour shape in the interval 2802. This is an effect obtained by the fact that the smoothing is performed using not just simple geometric information but also reflecting brightness profile information.

In step S2710, the pattern dimension measurement unit 2615 measures the dimension of the pattern using the contour line for measuring dimension. The content of the process of step S2710 is similar to that according to conventional technology. For example, the distance between corresponding length measuring edges in the range of the length measuring cursor is measured, and statistics of the distances, such as their average value, maximum value, minimum value, and the like, are determined as a dimension measurement result. After the process of step S2710, the operating/processing device 2610 ends the dimension measurement process.

Figures 29A, 29B:
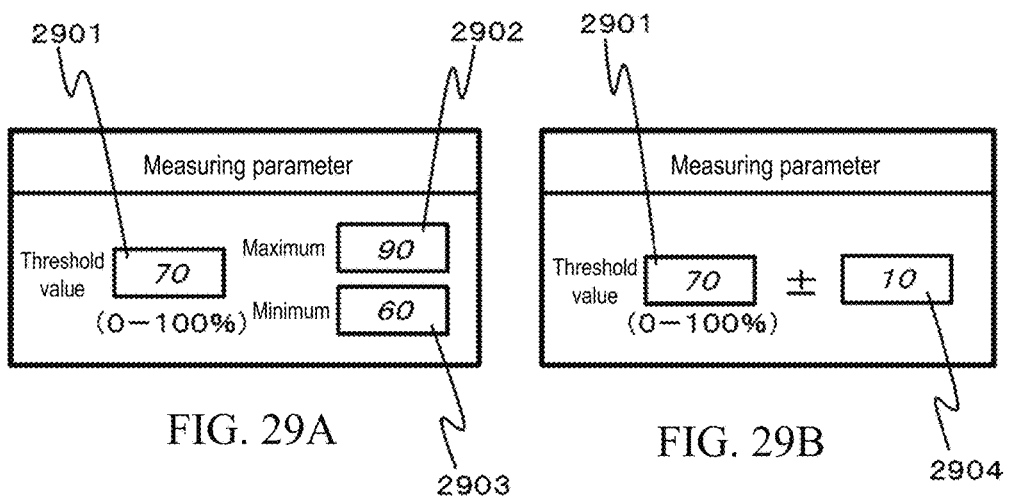
FIGS. 29A and 29B illustrate an input interface for a process parameter set by the operator of the operation terminal 120 in the dimension measuring device according to the second embodiment.
Figures 30A, 30B:
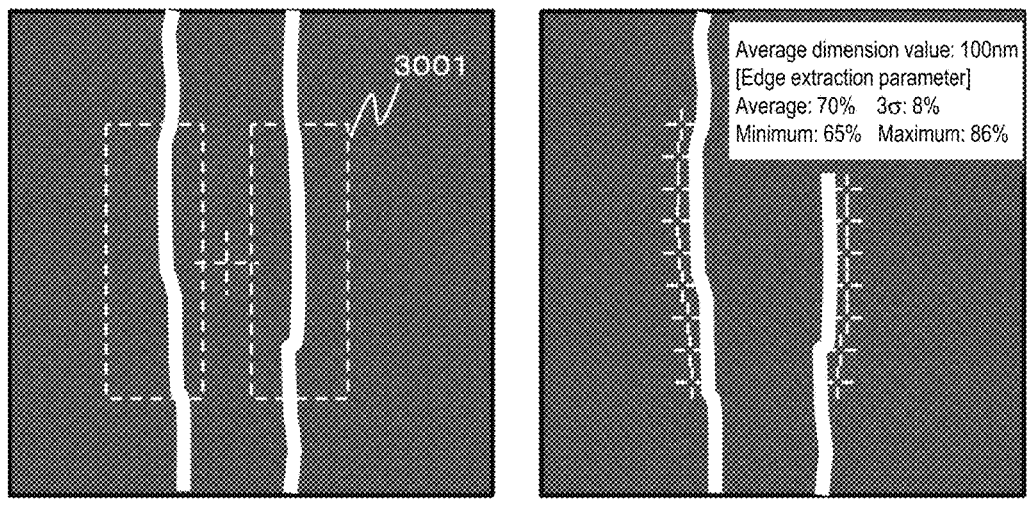
FIGS. 30A and 30B illustrate a measurement result presenting method in the dimension measuring device according to the second embodiment.

FIG. 29 illustrates examples of the input interface for the process parameter set by the operator of the operation terminal 120 in the dimension measuring device according to the present embodiment. In FIG. 29(a), in addition to the edge extraction parameter 2901 used in the process of step S2702 of FIG. 27, a variation range of the edge extraction parameter used in the process of step S2708 of FIG. 27 is designated using an upper limit value 2902 and a lower limit value 2903. In FIG. 29(b), in addition to the edge extraction parameter 2901 used in the process of step S2702 of FIG. 27, a variation range of the edge extraction parameter used in the process of step S2708 of FIG. 27 is designated by a relative value 2904. Thus, by setting the range of the variation range, the phenomenon in which the contour line for measuring dimension is excessively smoothed can be prevented. The edge extraction parameter 2901, the upper limit value 2902, the lower limit value 2903, and the relative value 2904 in FIG. 29 are examples of threshold values in the case of threshold value method (i.e., values in % where the minimum value is 0% and the maximum value is 100%). When dimension measurement is implemented by a method other than the threshold value method, the above values may be suitably modified to values suitable for the particular technique. The input interface for the process parameter is also not limited to the above examples.

FIG. 30 illustrates a measurement result presenting method for the dimension measuring device according to the present embodiment, illustrating the content displayed on the display device of the operation terminal 120. In the case of line width measurement illustrated in FIG. 30(a), the length measuring cursor 3001 is disposed and then measurement is implemented. As a result, an image illustrated FIG. 30(b) is presented to the operator of the operation terminal 120. As shown in FIG. 30(b), in the present embodiment, in addition to the dimension measurement result, such as an average dimension value, that has conventionally been presented, values such as an average value, the standard deviation a, the minimum value, and the maximum value of the edge extraction parameter for dimension measurement are also presented. Thus, the operator of the operation terminal 120 can grasp the appropriateness of the edge extraction parameter used for dimension measurement. The operator of the operation terminal 120 can also utilize the measurement result as information that is not directly reflected in the dimension value measured using an extracted edge itself but that is indicative of a "region having a different state from other regions", such as a change in the brightness profile shape due to a change in side wall shape. The values presented with regard to the edge extraction parameter for dimension measurement are not limited to the above examples and may include any value capable of providing any of the above effects.

Thus, according to the present embodiment, an edge extraction parameter suitable for dimension measurement is determined for each reference edge, and dimension measurement is performed using an edge extracted with the use of the edge extraction parameter. In this configuration, the influence of noise or small roughness can be decreased, whereby measurement value reliability can be increased.

In the present embodiment, the edge extraction parameter value is not lower than 0% and not more than 100%. However, the embodiment of the present invention is not limited to the above, and may be defined in the same way as the first embodiment. While the present embodiment has been described with reference to the example of measurement of dimension concerning a line pattern, the pattern as the object of dimension measurement is not limited to the above, and the embodiment may also be applied when measuring a hole pattern diameter and the like, for example.

Modification of the Second Embodiment

The dimension measuring device according to the second embodiment may be applied to an exposure condition measuring device that determines an exposure condition on the basis of a model that is created in advance from image data obtained by imaging a measurement object pattern, using an FEM wafer.

In the field of semiconductor manufacturing, as miniaturization advances, the demand for critical dimension uniformity (CDU) also increases. In order to achieve high CDU, it is considered necessary not only to find the optimum exposure conditions (the focal point position and the amount of exposure) using an FEM wafer but also to execute exposure condition management for compensating for the influence of process variations, i.e., "quantification" of errors in the focal point position and the amount of exposure. For the quantification, an exposure condition measuring device has been proposed that determines the exposure conditions on the basis of a model that is created in advance from image data obtained by imaging a measurement object pattern, using an FEM wafer. In the exposure condition measuring device, from the image data obtained by imaging a predetermined position on the FEM wafer, or image data obtained by imaging the measurement object pattern, several types of dimension feature quantities are determined that reflect a pattern dimension change accompanying a change in the focal point position and the amount of exposure, or a change in the cross section shape of the photo resist. Then, a model is created using such dimension feature quantities, or the dimension feature quantities are applied to the model, so as to measure the exposure conditions.

As described above, as the process rule evolves and the pattern dimension becomes smaller, the influence of length measurement value variations on the pattern dimension due to edge roughness accompanying side wall irregularities of the photo resist becomes relatively large, reducing model estimation accuracy. Thus, for example, when a dimension feature quantity is determined by conventional technology, the dimension measuring device according to the second embodiment may be used to create a model using measurement values in which the influence of small edge roughness is decreased. As a result, a model with higher reliability can be obtained, whereby the reliability of exposure condition measurement values can be increased.

Further, in the present modification, an example of estimation of exposure conditions on the basis of a feature quantity obtained by two-dimensional shape measurement will be described. It is known that as focus changes, the shape of a pattern also changes. According to an analysis by the inventor, the element of shape change can also be used for the estimation by adopting two-dimensional shape evaluation using contour shape, whereby an estimation result with higher reliability can be obtained.

It is known that, as a general tendency concerning exposure condition variation, the cross-sectional shape of a side wall becomes downwardly convex in the case of an upper focal point (plus focus), while the cross-sectional shape of the side wall becomes upwardly convex in the case of a lower focal point (minus focus). Accordingly, in the exposure condition measuring device, it is effective, for increasing the measurement accuracy, to use a feature quantity in which roundness of a pattern upper part or tapering of a pattern lower part is reflected.

According to an analysis by the inventor, in order to reflect the irregularities in the cross-sectional shape of a side wall in the feature quantity, at least three length-measuring contour lines are necessary. Further, in order to reflect the roundness of a pattern upper part or tapering of a pattern lower part, it is necessary to use three or more length-measuring contour lines across the position of the highest pixel value on the brightness profile; namely, a total of five to six length-measuring contour lines are necessary. The purpose of the length-measuring contour lines is to have the side wall shape reflected in the feature quantity. Thus, it is preferable to form the length-measuring contour lines by determining a plurality of length measuring edges from the same brightness profile, rather than independently determining the length-measuring contour lines. The position and direction of brightness profile acquisition may be determined based on the design data or an image contour line. The process of determining the length-measuring contour lines after generation of the brightness profile is similar to the second embodiment, and executed for each of a plurality of predetermined edge extraction parameters.

After the length-measuring contour lines are determined, a dimension feature quantity is determined using the determined length-measuring contour lines. As the dimension feature quantity, there may be used a statistic of EPE (such as an average value or standard deviation) based on comparison of the length-measuring contour lines; a statistic (such as an average value or standard deviation) of EPE based on comparison of a reference contour line shape determined from the design data and each of the length-measuring contour lines; the area of a region enclosed by the length-measuring contour lines; or, in the case of a hole pattern, a hole diameter determined from the length-measuring contour lines.

Thus, according to the present modification, during exposure condition measurement, an appropriate edge extraction parameter is used when determining the length-measuring contour lines, or a dimension feature quantity obtained by two-dimensional shape measurement using a plurality (three or more) of length-measuring contour lines is used, whereby an exposure condition estimation result with higher reliability can be obtained.

The method of estimating the exposure condition from a plurality of dimension feature quantities is not limited to the illustrated examples. For example, multiple-regression analysis technique may be used.

Third Example

Third Embodiment

In the following, a third embodiment will be described with reference to FIG. 31 to FIG. 34. The present embodiment represents an example of a dimension measuring device which may be preferably used for the purpose of quantifying and evaluating the two-dimensional shape of a measurement object pattern by shape comparison with a reference contour shape. In the case of quality management based on one-dimensional dimension, evaluation can be made by comparison with a reference dimension value. However, in the case of quality management based on two-dimensional shape, it is necessary to evaluate by comparison with the shape of the reference contour line. Normally, evaluation is made by comparison of the shape of a given contour line as an evaluation reference with the shape of a contour line determined from an image obtained by imaging a pattern as the object of evaluation. In this case, there is a problem similar to that of the second embodiment when the contour line is determined from the image. The shape of the evaluation reference contour line may be generated based on the design data, or the shape may be generated using image data obtained by imaging one or more non-defective products, as will be described in the following examples.

As an example of the shape generated on the basis of the design data, a contour shape is determined by lithography simulation. The shape may be determined by geometrically deforming the design data in such a manner as to simulate the contour shape of a pattern expected to be formed on the wafer, such as by rounding a corner portion of the design data (layout pattern).

An example of the shape generated using image data obtained by imaging one or more non-defective products is a contour shape extracted from one image obtained by imaging a non-defective product determined to be "the most desirable shape" by the operator of the operation terminal. Further, one contour shape suitable as an evaluation reference may be determined using a plurality of contour shapes extracted from a plurality of images obtained by imaging each of a plurality of non-defective products.

According to the present embodiment, in order to avoid confusion concerning the use of terms, the shape of the reference contour line described above will be uniformly referred to as "design pattern" regardless of whether the shape is one generated based on the design data. This is due to the fact that, in the present embodiment, the pattern as a reference at the time of forming the length-measuring contour line (i.e., the pattern representing the position of an ideal length-measuring contour line assumed to be preferable for dimension measurement) differs from the pattern as a reference at the time of shape evaluation using the length-measuring contour line. Thus, the terms "reference pattern", "reference contour line", and "reference edge" will be used for the former, while "design pattern", "design contour line", "design edge" will be used for the latter.

Compared with the first embodiment, the major differences are that there is a relatively large discrepancy between the contour shape extracted from the design data and the contour shape extracted from the SEM image because of the use of an SEM image obtained by imaging at a relatively high magnification ratio, and that it is necessary to obtain a quantified evaluation value as a contour shape comparison result. The details will be described in the following.

Figure 31:
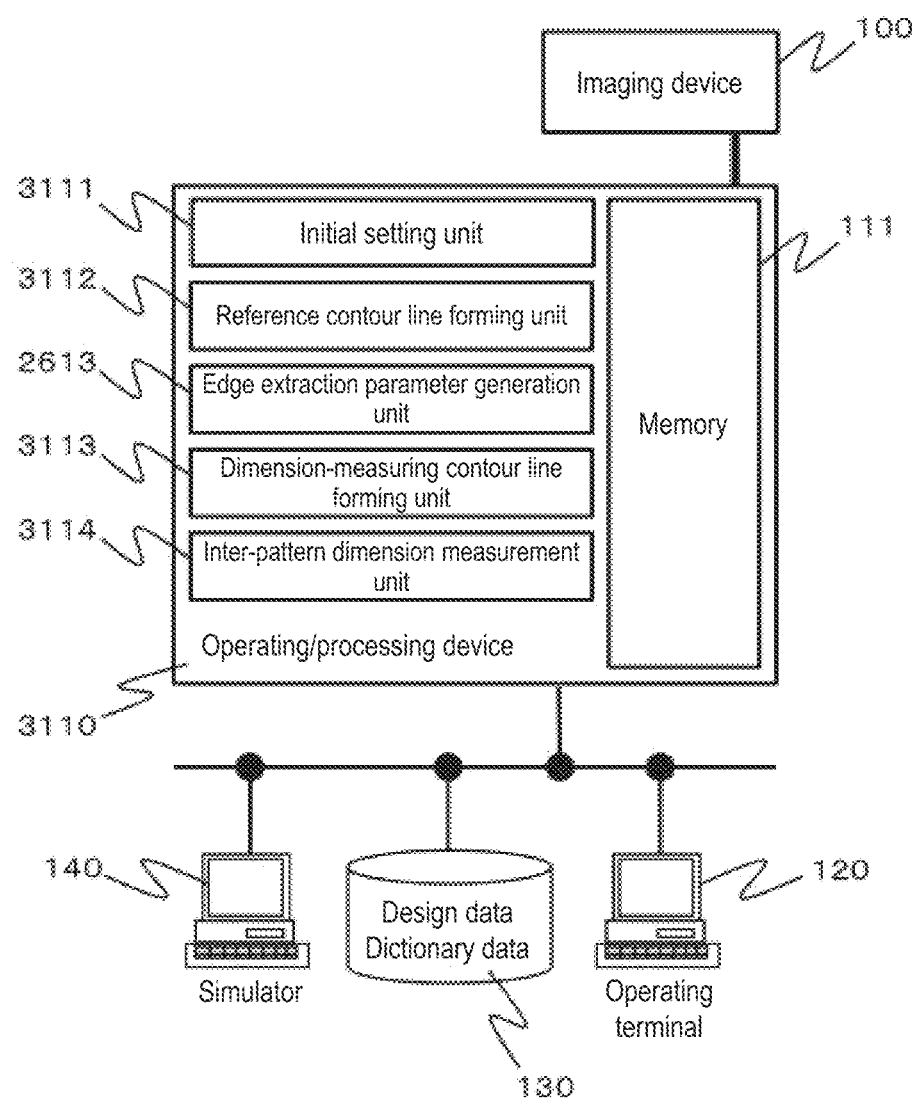
FIG. 31 illustrates a configuration of the dimension measuring device according to a third embodiment.

FIG. 31 illustrates a configuration of a dimension measuring device according to the present embodiment. In FIG. 31, portions similar to those of FIG. 1 will be designated with similar signs to those of FIG. 1 and their detailed description will be omitted. Also, portions similar to those of FIG. 26 will be designated with similar signs in FIG. 26 and their detailed description will be omitted.

Figure 32:
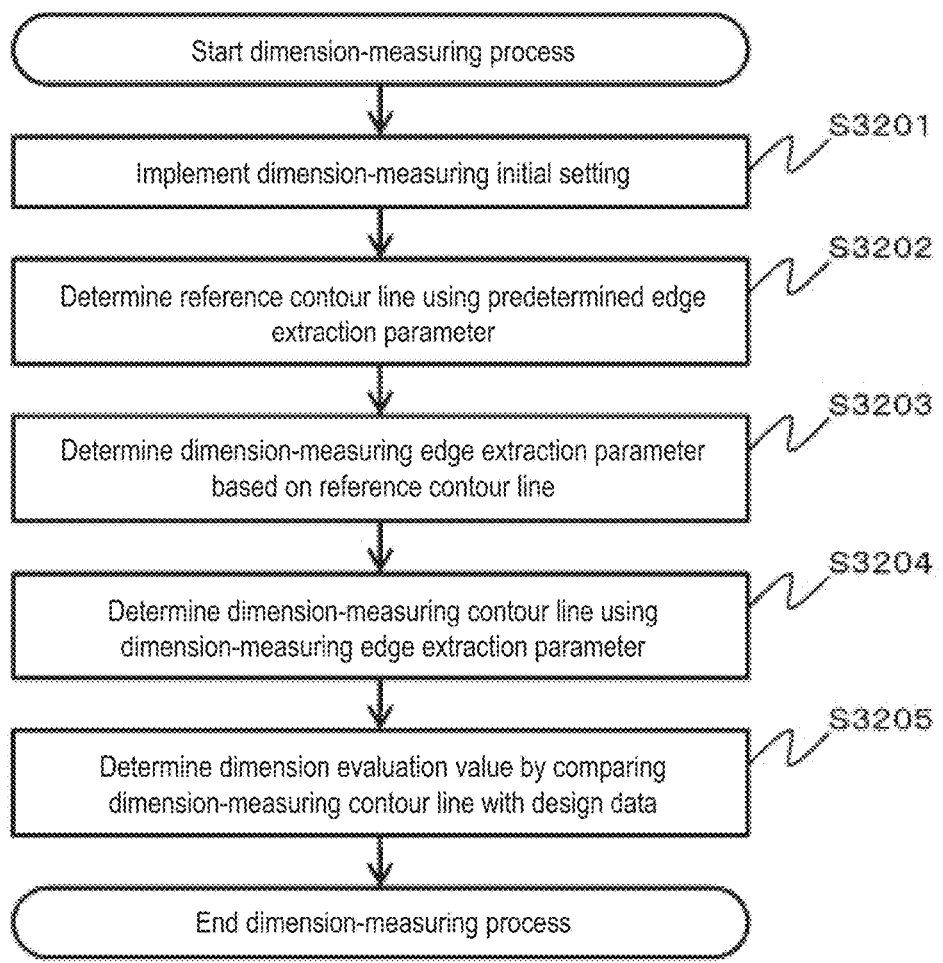
FIG. 32 is a flowchart of an operation of the dimension measuring device according to the third embodiment.
Figure 33A:
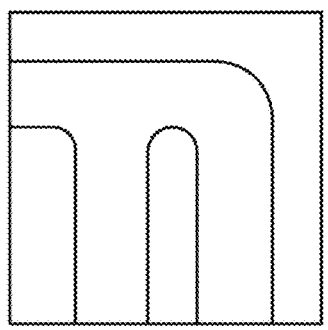
FIGS. 33A-33G illustrate an operation of the dimension measuring device according to the third embodiment.
Figure 33B:
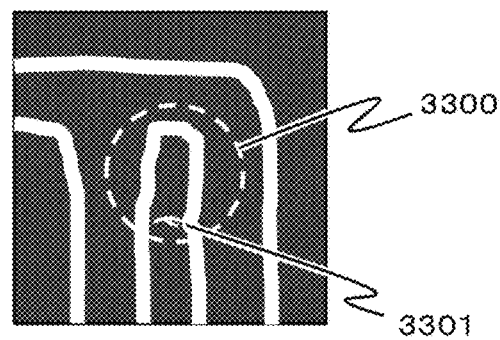
Figure 33C:
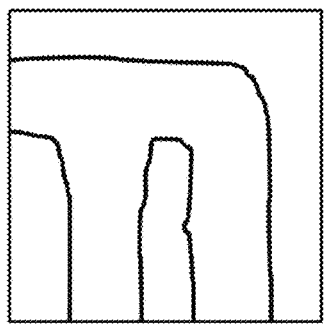
Figure 33D:
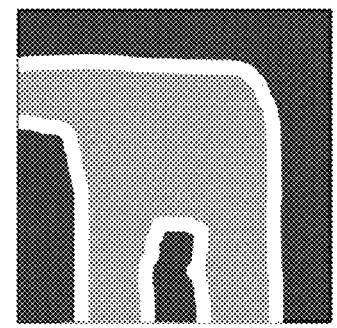
Figure 33E:
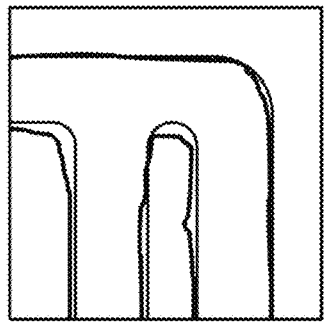
Figure 33F:
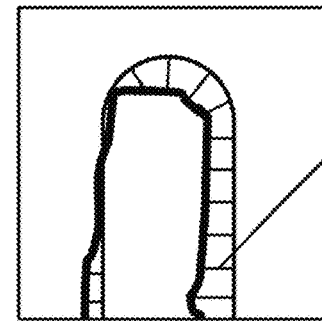
Figure 33G:
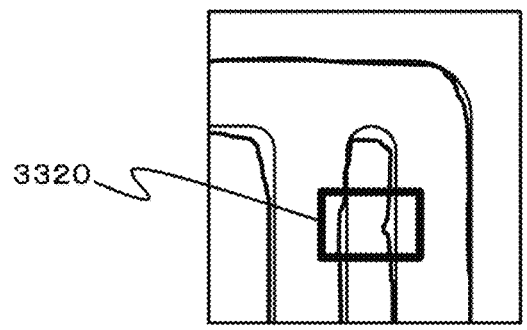

An operating/processing device 3110 according to the present embodiment includes the memory 111; an initial setting unit 3111 that executes the process of step S3201 and the like of FIG. 32; a reference contour line forming unit 3112 that executes the process of step S3202 and the like of FIG. 32; an edge extraction parameter generation unit 2613 that executes the process of step S3203 and the like of FIG. 32 (namely, the process of step S2703 to S2708 of FIG. 27); a dimension measuring contour line forming unit 3113 that executes the process of step S3204 and the like of FIG. 32; and an inter-pattern dimension measurement unit 3114 that executes the process of step S3205 and the like of FIG. 32. Based on the SEM image input from the imaging device 100 and the design data concerning the pattern formed on the sample 101g, a dimension evaluation value for the pattern formed on the sample 101g (such as an average value, a standard deviation, the maximum value and the like of the distance between each edge of a contour line determined from the SEM image and a reference contour line) is determined to evaluate the quality of the pattern formed on the sample 101g. Information necessary for the process executed in the operating/processing device 3110 are stored in the memory 111 in the operating/processing device 3110 as a dimension measuring recipe. The recipe includes an operating program for causing the dimension measuring device to be automatically operated. The recipe is stored in the memory 111 or an external storage medium for each type of sample as the object of measurement, and read as needed.

The operating/processing device 3110 is also connected to the operation terminal 120. The operating/processing device 3110 receives an input from the operator of the operation terminal 120 via an input means of the operation terminal 120, and modifies the content of the measurement process as needed, or displays a measurement result and the like on a display device of the operation terminal 120. These functions are implemented using a graphical interface called "GUI", for example.

FIG. 32 is a flowchart of an operation of the dimension measuring device according to the present embodiment.

As the dimension measurement process is started, initially, in step S3201, the initial setting unit 3111 performs initial setting of an SEM image as the object of processing and design data as a reference for comparison evaluation. Specifically, the initial setting unit 2611 initially acquires an SEM image from the imaging device 100 and implements preprocessing as needed. The preprocessing includes, for example, a smoothing process for noise removal. The preprocessing may be suitably implemented using known technology. In the following description of the present embodiment, the SEM image that has been subjected to preprocessing as needed will be simply referred to as "SEM image". The initial setting unit 2611 then reads the design data corresponding to a recipe-designated range from the from storage device 130, and executes a design data deforming process as needed, such as a pattern figure edge rounding process, generating a design pattern as a comparison evaluation reference. Then, the initial setting unit 2611 performs positioning of the SEM image and the design pattern. The process of positioning the SEM image and the design pattern may be implemented using known technology. For example, a contour line is extracted from the SEM image and matched with the design pattern.

In step S3202, the reference contour line forming unit 3112 determines a reference contour line using a predetermined edge extraction parameter. As the predetermined edge extraction parameter, there may be used a value designated by a dimension measuring recipe stored in the memory 111 and the like of the operating/processing device 3110, or a value input from the operator via the input means of the operation terminal 120 may be used.

Because it is assumed that there is a large discrepancy between the contour shape extracted from the design data and the contour shape extracted from the SEM image, the reference contour line is determined based on an image contour line. Namely, after an image contour line is determined from the SEM image using known technology, edges are disposed at regular intervals along the image contour line. Then, at the position of the edges, a brightness profile is acquired in a direction perpendicular to the direction of the tangent to the image contour line to determine the reference contour line.

In step S3203, the edge extraction parameter generation unit 2613 determines an edge extraction parameter Pmsr for dimension measurement on the basis of the reference contour line and the SEM image. The process of step S3203 is similar to the process of step S2703 to S2708 in the second embodiment.

In step S3204, the dimension measuring contour line forming unit 3113 determines a length-measuring contour line for dimension measurement from the SEM image using the edge extraction parameter Pmsr for dimension measurement. Specifically, on the brightness profile acquired in step S3202 for each reference edge, the length measuring edge for dimension measurement is determined using the edge extraction parameter Pmsr for dimension measurement corresponding to the reference edge.

In step S3205, the inter-pattern dimension measurement unit 3114 measures the dimension between the length-measuring contour line for dimension measurement and the design pattern to determine a dimension evaluation value. The dimension measurement is implemented by determining the closest point on the design pattern with respect to each length measuring edge. At this time, the design pattern may be handled as a polygon as is, or as a set of design edges disposed at regular intervals, as in the first embodiment. When the design pattern is handled as a set of design edges, development of erroneous association may be prevented by the following method. Namely, when a point on first contour data and a point on second contour data are associated with each other, first association information of the point on the first contour data and the point on the second contour data is generated. Then, consistency of an association relationship included in the first association information is determined, and the association relationship that does not have consistency is corrected to generate second association information. The dimension measurement may be implemented by a method disclosed in Patent Literature 1, for example, using the design pattern as a reference.

After completion of the association between the length measuring edge for dimension measurement and the edge on the design pattern, the inter-pattern dimension measurement unit 3114 determines statistics depending on the purpose of evaluation, such as an average value, a standard deviation, and the maximum value of EPE corresponding to each of the length measuring edges for dimension measurement, obtaining dimension evaluation values. As needed, a region as the object of evaluation, i.e., a region with high risk of defect development may be set as a region of interest (ROI), and the process may be implemented only for the length measuring edges for dimension measurement that are present in the ROI. The setting of the ROI may be made using a region designated by the dimension measuring recipe stored in the memory 111 of the operating/processing device 3110 and the like. Alternatively, a region designated by the operator via the input means of the operation terminal 120 may be used.

When the average value of EPE is adopted as the dimension evaluation value, "the average degree of divergence of the length-measuring contour line for dimension measurement from the design pattern" is expressed as a numerical value. Thus, this is preferable for the purpose of evaluating the degree of expansion or contraction of a pattern figure due to exposure condition variations. When the standard deviation of EPE is adopted as the dimension evaluation value, for example, "the degree of distortion of the shape of the length-measuring contour line for dimension measurement with respect to the shape of the design pattern" is expressed as a numerical value. Thus, this is preferable for the purpose of evaluating the extent of crumbling of a pattern figure due to exposure condition variation. Accordingly, these dimension evaluation values are preferable for the purpose of process window analysis. When the maximum value of EPE is adopted as the dimension evaluation value, for example, "whether the shape of the length-measuring contour line for dimension measurement as a whole is within a tolerance with respect to the shape of the design pattern" can be determined. Thus, this is preferable for the purpose of non-defective product inspection.

The dimension evaluation value is not limited to any one of the statistics that have been described by way of example concerning the EPE. The dimension evaluation value may be another index based on a measured dimension, or a plurality of values may be retained as vector values. After the process of step S3205, the operating/processing device 3110 ends the dimension measurement process.

FIG. 33 illustrates an operation of the dimension measuring device according to the present embodiment.

FIG. 33(*a*) illustrates a design pattern. FIG. 33(*b*) illustrates an inspection image obtained by imaging a resist after development. Due to the presence of resist residue around a recess portion 3300, a light white band is observed around the boundary region 3301. In such a state, a phenomenon develops in which a portion that does not appear to be a defect at the stage of inspection of the developed wafer by imaging presents itself as a defect upon inspection by imaging the wafer after etching. According to an analysis by the inventor, the phenomenon is due to the fact that the resist residue around the recess portion 3300 has such a small thickness and not even stepped that the white band does not appear clearly.

FIG. 33(*c*) shows a contour line for measuring dimension formed from the inspection image of FIG. 33(*b*). FIG. 33(*d*) shows an image obtained by imaging the same region as that of FIG. 33(*b*) that has been etched. The image shows the development of a defect that is difficult to expect by simply observing the shape of the contour line of FIG. 33(*c*). FIG. 33(*e*) shows the design pattern and the contour line for measuring dimension that have been drawn superposed upon each other. By measuring the dimension between the "two contour lines that have been positioned", a dimension evaluation value that contributes to the evaluation of the two-dimensional shape of the measurement object pattern, such as an average value of EPE or a standard deviation, is calculated. FIG. 33(*f*) shows a part of FIG. 33(*e*) as enlarged, in which the distance of a line segment 3310 is an example of EPE.

FIG. 33(*g*) shows an image in which a marker 3320 is superposed at a portion determined to have an abnormal edge extraction parameter. Specifically, for example, an average value and a standard deviation of edge extraction parameters corresponding to a reference edge in the vicinity of a reference edge of interest are determined, and an edge extraction parameter normal range is determined using the values. If the edge extraction parameter of the reference edge of interest is not included in the calculated normal range, abnormality is determined. The method of determining whether the edge extraction parameter is abnormal is not limited to the above.

The contour line for measuring dimension is determined based on the shape of the design pattern. Thus, no contour line for measuring dimension is formed in a portion with a phase structure different from the shape of the design pattern, such as the white band in the boundary region 3301. Thus, the abnormality would not be determined as a defect solely from the viewpoint of EPE. Further, a portion such as the white band in the boundary region 3301 is often not clearly present on the image. Thus, a contour line extraction approach involving, for example, extraction of a portion that appears relatively bright in a predetermined region on the image is often not capable of stable contour line detection due to a difficulty in setting parameters, such as a threshold value.

According to the present embodiment, the edge extraction parameter per se is used as an evaluation index for determining "whether the state is different from other regions". In this way, even in the above-described cases, the portion that could possibly be a defect can be detected as long as the portion is present in the vicinity of the design pattern.

Figure 34:
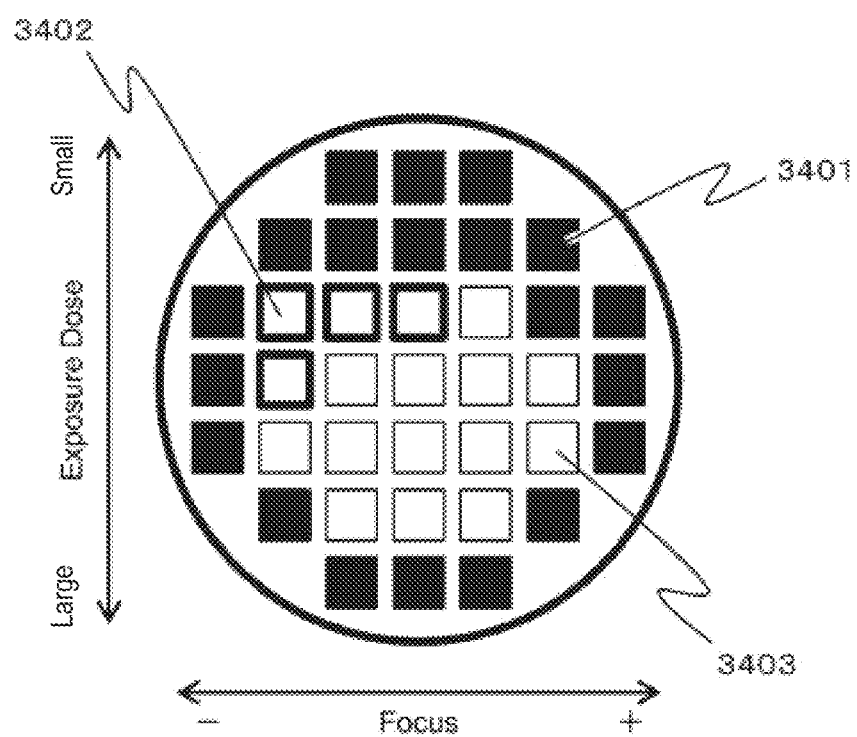
FIG. 34 illustrates a measurement result presenting method in the dimension measuring device according to the third embodiment.

FIG. 34 illustrates a measurement result presenting method for the dimension measuring device according to the present embodiment, illustrating a case in which the dimension measuring device according to the present embodiment is applied for the evaluation of an FEM wafer for analyzing a process window.

In FIG. 34, the rectangular regions that are painted over, such as a shot region 3401, indicate the presence of a location determined to be a "defect" by a dimension evaluation value-based evaluation in an evaluation using an SEM image corresponding to the exposure conditions corresponding to the relevant region. The rectangular regions drawn with bold frames, such as a shot region 3402, indicate the absence of a location determined to be a "defect" by the dimension evaluation value-based evaluation while indicating the presence of a location determined to have an edge extraction parameter abnormality in the evaluation using the SEM image corresponding to the exposure conditions corresponding to the relevant region. The other rectangular regions, such as a shot region 3403, indicate the presence of neither a location determined to be a "defect" by the dimension evaluation value-based evaluation nor a location determined to have an edge extraction parameter abnormality in the evaluation using the SEM image corresponding to the exposure conditions corresponding to the relevant region. When the optimum exposure conditions are estimated in view of such measurement results, the process window is defined assuming that, in addition to the portions similar to the shot region 3401, the portions similar to the shot region 3402 are "inappropriate", whereby the reliability of the optimum exposure condition estimation result can be increased.

Thus, in addition to the evaluation based on the dimension evaluation value, the edge extraction parameter per se is added to the evaluation index. In this way, in addition to the presence or absence of a clear defect that can be determined by contour line shape comparison, locations with relatively high risk of defect development, such as a location where the side wall shape is different from other regions or a location where the state of resist residue at a bottom portion is different from other regions, can be detected.

FIG. 34 illustrates an example of the measurement result presenting method, and the measurement result presenting method is not limited to the above even when limited to the purpose of FEM wafer evaluation. For example, as long as the risk level can be grasped for each exposure condition, the shot region 3401 may be drawn with a red frame, the shot region 3402 may be drawn with a yellow frame, and the shot region 3403 may be drawn with a green frame for presentation.

Thus, according to the present embodiment, the edge extraction parameter suitable for dimension measurement is determined for each reference edge, and the dimension between patterns is measured using an edge extracted with the use of the edge extraction parameter. In this configuration, even for the purpose of measuring the dimension between patterns, the influence of noise or small roughness can be decreased, whereby the measurement value reliability can be increased.

Further, in addition to the evaluation based on the dimension evaluation value, the edge extraction parameter per se is used as an evaluation index. In this way, in addition to the presence or absence of a defect that can be determined by contour line shape comparison, the "locations with relatively high risk of defect development that cannot be detected solely based on a dimension evaluation value", such as a location where the side wall shape is different from other regions or a location where the state of resist residue at a bottom portion is different from other regions, can be detected.

In the present embodiment, in the process of step S3205, the inter-pattern dimension measurement unit 3114 determines the dimension evaluation value between the length-measuring contour line for dimension measurement and the design pattern after the length measuring edge for dimension measurement and an edge on the design pattern are associated with each other. However, the embodiment of the present invention is not limited to the above. For example, the dimension evaluation value may be determined without associating the length measuring edge for dimension measurement with the edge on the design pattern. Specifically, initially, a distance conversion image is generated based on the information about the position of the edge on the design pattern. The generation of the distance conversion image may be implemented by known method. Then, with reference to the pixel value of the distance conversion image corresponding to the position of the length measuring edge for dimension measurement, the distance to the edge on the design pattern closest to the length measuring edge is determined as an EPE value corresponding to the length measuring edge. Thereafter, statistics such as an average value, a standard deviation, and the maximum value of EPE corresponding to each of the length measuring edges for dimension measurement may be determined as dimension evaluation values depending on the purpose of evaluation, and a ROI may be set as needed when the dimension evaluation value is determined and only the length measuring edges for dimension measurement that are present in the ROI may be processed, as in the above-described process of step S3205. Thus, the dimension evaluation value is determined without associating the length measuring edge for dimension measurement and the edge on the design pattern with each other. By adopting such configuration, a dimension evaluation value can be determined in a shorter processing time than when the dimension evaluation value is determined after the both are associated with each other.

When the dimension evaluation value is determined without associating the length measuring edge for dimension measurement and the edge on the design pattern with each other, the possibility of erroneous association increases in the region in which the design pattern is densely present, whereby the reliability of the dimension evaluation value decreases. Accordingly, the present modification may be preferably applied for dimension measurement under a condition such that the design pattern is not densely present, such as when the SEM image is acquired by imaging at a higher magnification ratio.

The method of generating the length-measuring contour line in step S3202 is not limited to the illustrated example. For example, as according to the technology disclosed in the international publication WO2011/152106A1, the position or direction for brightness profile acquisition may be determined on the basis of the image contour line and the design pattern. Also, the method of determining the image contour line is not limited to the illustrated example. For example, a region dividing approach may be used for the determination.

Fourth Example

Fourth Embodiment

In the following, a fourth embodiment will be described with reference to FIG. 34 to FIG. 38. The present embodiment represents an example of a dimension measuring device that is simply calibrated so as to decrease the influence of machine difference between different dimension measuring devices or of temporal variation due to the state of the dimension measuring device on the measurement value, and to obtain a dimension close to the reference dimension.

The shape of the brightness profile may be varied by a machine difference between devices or by temporal variation in the state of the device. For example, the manner of expansion of the shape of the profile may differ from one device to another due to difference in resolution. Thus, when a common edge extraction parameter is used, the measurement value obtained using an edge extracted with the edge extraction parameter may have mutually different values.

The inventor, based on the assumption that the cause of the problem lies in the use of the same edge extraction parameter for determining the edge position in all devices or all device states, proposes the present embodiment as an example by which the problem can be solved. In the present embodiment, the problem is solved by the following configuration. A common reference wafer having a standard pattern is used to determine an edge extraction parameter conversion function in advance by a prior calibration process. At the time of measurement, a predetermined edge extraction parameter designated by the dimension measuring recipe or the operator of the operation terminal is changed by the previously obtained edge extraction parameter conversion function, and then an edge is extracted.

The details will be described in the following.

[Configuration of Dimension Measuring Device According to Fourth Embodiment]

Figure 35:
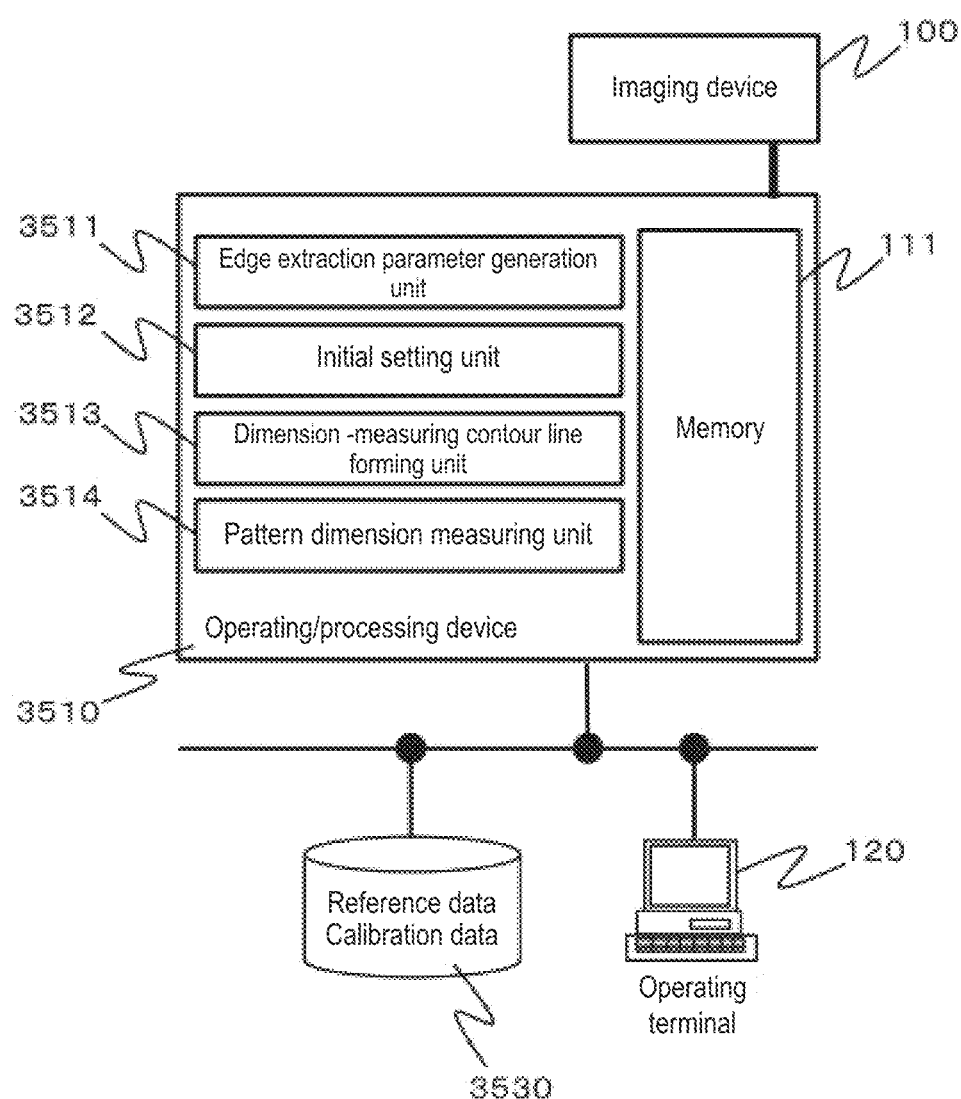
FIG. 35 illustrates a configuration of the dimension measuring device according to a fourth embodiment.

FIG. 35 illustrates a configuration of a dimension measuring device according to the present embodiment. In FIG. 35, portions similar to those of FIG. 1 are designated with similar signs in FIG. 1, and their detailed description will be omitted.

Figure 36:
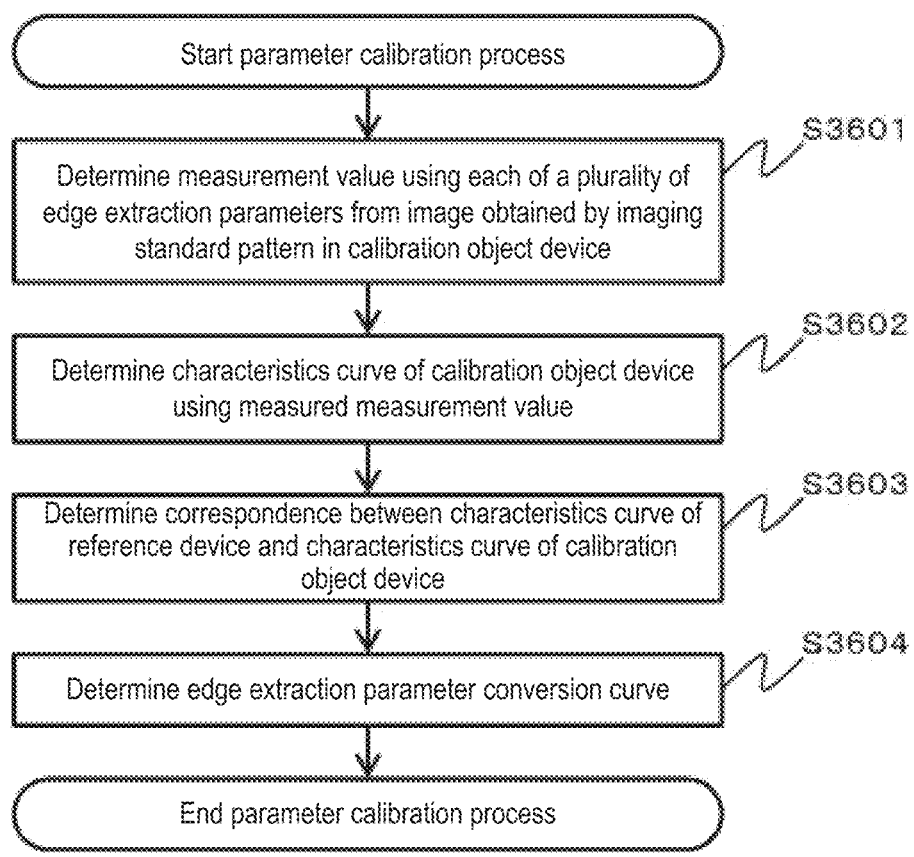
FIG. 36 is a flowchart of an operation of a parameter calibration unit included in the operating device of the dimension measuring device according to the fourth embodiment.
Figure 38:
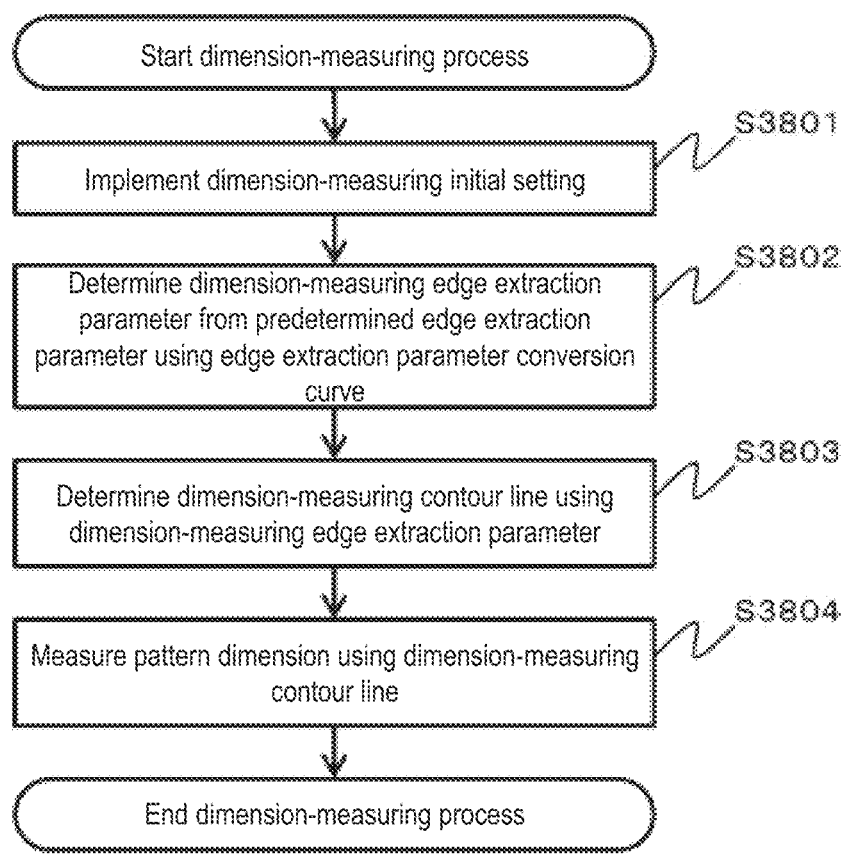
FIG. 38 is a flowchart of an operation of the dimension measuring device according to the fourth embodiment.

A operating/processing device 3510 according to the present embodiment includes the memory 111; an edge extraction parameter generation unit 3511 that executes the parameter calibration process and the like of FIG. 36; an initial setting unit 3512 that executes the process of step S3801 and the like of FIG. 38; a dimension measuring contour line forming unit 3513 that executes the process of step S3802 to S3803 and the like of FIG. 38; and a pattern dimension measurement unit 3514 that executes the process of step S3804 and the like of FIG. 38. Based on the SEM image input from the imaging device 100, the operating/processing device 3510 measures the dimension of the pattern formed on the sample 101g. Information necessary for the process executed in the operating/processing device 3510, such as "how the dimension of which portion of the pattern present at which position on the sample is to be measured", is stored in the memory 111 in the operating/processing device 3510 as a dimension measuring recipe. The recipe includes an operating program for causing the dimension measuring device to be automatically operated. The recipe may be stored in the memory 111 or an external storage medium for each type of sample as the object of measurement, and is read as needed.

The operating/processing device 3510 is also connected to the operation terminal 120. In response to an input from the operator via the input means of the operation terminal 120, the operating/processing device 3510 modifies the content of the measurement process as needed, or displays a measurement result and the like on the display device of the operation terminal 120. These functions are implemented by a graphical interface called "GUI", for example.

In the storage device 3530, there are stored a reference device characteristics curve (a curve expressing the relationship between the edge extraction parameter and the dimension measurement value when the standard pattern on the reference wafer is measured) that is created in advance, and an edge extraction parameter conversion curve that is created in the parameter calibration process of FIG. 36 and that is referenced in the dimension measurement process of FIG. 38.

[Operation of Edge Extraction Parameter Generation Unit 3511 of the Fourth Embodiment]

FIG. 36 is a flowchart of an operation of the edge extraction parameter generation unit 3511 included in the operating device of the dimension measuring device according to the present embodiment.

As the parameter calibration process is started, the edge extraction parameter generation unit 3511, initially in step S3601, images the standard pattern on the reference wafer using the imaging device 100 as the object of calibration. From the obtained image, the edge extraction parameter generation unit 3511 determines a measurement value using known technique (such as a threshold value method) with respect to each of a plurality of edge extraction parameters. The measurement value may be determined for all values that the edge extraction parameters may take, or the measurement value may be determined by selecting some of the edge extraction parameters.

As the standard pattern used for calibration, a longitudinal (direction perpendicular to the electron beam scan direction) line pattern may be used, or a hole pattern may be used. When the longitudinal line pattern is used, calibration is performed preferentially with respect to the lateral direction dimension for which dimension accuracy can be easily ensured in SEM, and such that a dimension close to the reference dimension can be obtained. When the hole pattern is used, calibration is performed both longitudinally and laterally in an averaged manner and such that a dimension close to the reference dimension can be obtained. In order to decrease the influence of noise, roughness and the like, a plurality of identical-shape patterns may be disposed and an average value of their measurement values may be used for calibration.

Then, in step S3602, the edge extraction parameter generation unit 3511, using the measurement value determined in step S3601, determines a characteristics curve of the imaging device 100 as the object of calibration using known technology. For example, the characteristics curve is determined by broken line approximation from a set of pairs of the edge extraction parameters and the measurement values obtained in step S3601.

The edge extraction parameter generation unit 3511 then determines in step S3603 correspondence between the characteristics curve of the reference device and the characteristics curve of the device as the object of calibration. For example, a dimension value of a standard pattern is determined from the edge extraction parameter value of the reference device using the characteristics curve of the reference device, and an edge extraction parameter of the device as the object of calibration that achieves the dimension value is determined using the characteristics curve of the calibration object device. The association may be determined for all values that the edge extraction parameters may take, or for several selected edge extraction parameters.

Thereafter, the edge extraction parameter generation unit 3511 in step S3604 determines the edge extraction parameter conversion curve using known technology. For example, the edge extraction parameter conversion curve may be determined by broken line approximation from a set of pairs of the edge extraction parameters of the reference device obtained in step S3603 and their corresponding edge extraction parameters of the calibration object device. After the process of step S3604, the edge extraction parameter generation unit 3511 ends the parameter calibration process.

FIG. 37 illustrates an operation of the edge extraction parameter generation unit included in the operating device of the dimension measuring device according to the present embodiment, particularly the process of step S3603 to step S3604. The parameter calibration process is a process for the purpose of determining an edge extraction parameter conversion curve for converting the edge extraction parameter of the reference device into the edge extraction parameter of the calibration object device.

Figure 37A:
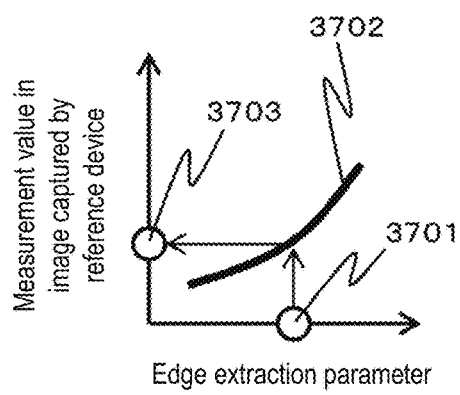
FIGS. 37A-37C illustrate an operation of the parameter calibration unit included in the operating device of the dimension measuring device according to the fourth embodiment.

Initially, with respect to the edge extraction parameter 3701 of the reference device, the characteristics curve of the reference device 3702 that has been created and stored in the storage device 3530 in advance is referenced, and a measurement value 3703 in an image obtained by the reference device that corresponds to the edge extraction parameter 3701 of the reference device is determined (see FIG. 37(a)).

Figure 37B:
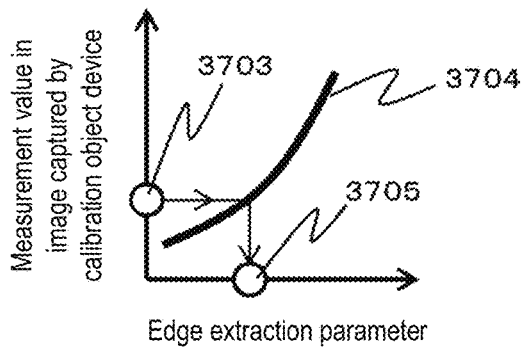
Figure 37C:
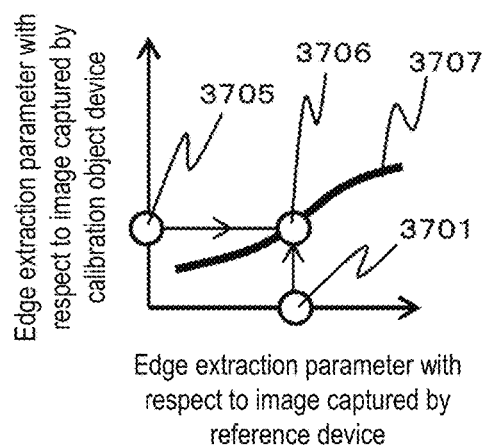

Then, from the measurement value 3703 in the image captured by the reference device, the characteristics curve of the calibration object device 3704 determined in step S3601 to step S3602 is referenced, and an edge extraction parameter of the calibration object device 3705 that corresponds to the measurement value 3703 in the image captured by the reference device is determined (see FIG. 37(b)). With respect to the edge extraction parameter 3701 of the reference device, the edge extraction parameter of the calibration object device 3705 is associated, whereby a point 3706 of the reference device edge extraction parameter conversion curve 3707 that corresponds to the edge extraction parameter 3701 is determined (see FIG. 37(c)).

The above process is performed for all of the edge extraction parameters of the reference device, whereby the entirety of the edge extraction parameter conversion curve 3707 can be obtained.

[Process Flow of Dimension Measurement Process of the Fourth Embodiment]

FIG. 38 is a flowchart of an operation of the dimension measuring device according to the present embodiment.

As the dimension measurement process is started, initially, in step S3801, the initial setting unit 3512 performs initial setting of the SEM image as the object of measurement. The process executed by the initial setting unit 3512 in step S3801 is similar to the process of step S2701 executed by the initial setting unit 2611 in the second embodiment. In the following description of the present embodiment, the SEM image that has been subjected to preprocessing as needed will be simply referred to as "SEM image".

Then, the dimension measuring contour line forming unit 3513 in step S3802 references the edge extraction parameter conversion curve stored in the storage device 3530 (i.e., "calibration data"), and determines the edge extraction parameter for dimension measurement using a predetermined edge extraction parameter that is either designated by the dimension measuring recipe stored in the memory 111 and the like of the operating/processing device 3510, or input from the operator via the input means of the operation terminal 120.

In step S3803, the dimension measuring contour line forming unit 3513, using the edge extraction parameter for dimension measurement determined in step S3801, determines the length-measuring contour line for dimension measurement by the known technique used at the time of calibration.

In step S3804, the pattern dimension measurement unit 3514, using the contour line for measuring dimension determined in step S3803, measures the dimension of a pattern. After the process of step S3804, the operating/processing device 3510 ends the dimension measurement process.

Thus, according to the present embodiment, the influence on the measurement value due to machine difference between dimension measuring devices or temporal variation in the state of the dimension measuring device can be decreased, and the dimension measuring device can be simply calibrated so that a dimension close to a reference dimension can be obtained.

The data structure of the edge extraction parameter conversion curve is not limited to the illustrated examples. The data structure of the edge extraction parameter conversion curve may be retained as information such that an edge extraction parameter of the calibration object device that corresponds to the edge extraction parameter of the reference device can be determined. For example, the data structure may be retained as a look-up table. Alternatively, a broken line or approximation curve parameter may be retained.

The edge extraction parameter conversion curve may be determined for each of the imaging parameter of the reference device and the calibration object device. The edge extraction parameter conversion curve may be retained in the form of a table having the imaging parameter of the reference device and the imaging parameter of the calibration object device as search keys. Then, a required edge extraction parameter conversion curve may be suitably selected and used. In this configuration, a dimension close to a reference dimension can be obtained even when different imaging parameters are used.

If the influence of spherical aberration of an electronic optical system cannot be disregarded, the edge extraction parameter conversion curve may be determined as a function of the position of passage through an objective lens. Specifically, after edge extraction parameter conversion curves are determined at several positions similarly to the present embodiment, and then interpolation may be performed using known technology so as to determine an edge extraction parameter conversion curve as a continuous function with respect to the position. By adopting such configuration, even when the influence of spherical aberration of the electronic optical system cannot be disregarded, a dimension close to a reference dimension can be obtained.

The method of determining the edge extraction parameter conversion curve is not limited to the illustrated examples. For example, instead of determining via a measurement value, contour line shapes may be compared. Specifically, the edge extraction parameter conversion curve may be determined by associating, with respect to a contour line that has been determined from an image captured by the reference device using a predetermined edge extraction parameter, an edge extraction parameter such that a contour line that achieves a minimum EPE value can be extracted from an image captured by the calibration object device. By adopting such configuration, an edge extraction parameter conversion curve that may be preferably used when measuring a two-dimensional shape can be determined. In this case, a reference contour line (the result of extraction of a length-measuring contour line from an image of the standard sample captured by the reference device) is stored in the storage device 3530 as reference data.

Fifth Example

Fifth Embodiment

In the following, a fifth embodiment will be described with reference to FIG. 39 to FIG. 42. The present embodiment represents an example of a pattern inspecting device that may be preferably used in identifying pattern location candidates that tend to be defective, using a plurality of image data obtained by imaging inspection object patterns under different exposure conditions or in different steps.

In the field of semiconductor manufacturing, in order to determine a permissible range of variation in focal distance and the amount of exposure during pattern transfer, and determine a process window, an optimum focal distance, and the amount of exposure and the like, a focus exposure matrix (FEM) wafer is used. The FEM wafer is a wafer on which the same pattern is printed while varying the focal point position and the amount of exposure in a matrix from one shot (one unit of exposure) to another. During evaluation for determining the process window, for example, with respect to each image obtained by imaging an evaluation object pattern corresponding to each shot, a contour shape determined from an edge extracted using a predetermined edge extraction parameter and a contour shape determined from design data are compared to determine EPE. Then, the quality of the shot is determined based on an evaluation using values of the EPE, such as an average value, standard deviation, and the maximum value.

The present embodiment proposes a pattern inspecting device for detecting a location of a pattern with a shape that tends to be easily crumbled by a change in exposure condition. In the pattern inspecting device, by using a plurality of images obtained by imaging an evaluation object pattern present at corresponding positions on the FEM wafers are used, the behavior of a pattern when only the amount of exposure is varied with a constant focal distance, or the behavior of a pattern when only the focal distance is varied with a constant amount of exposure is compared. By detecting the pattern location with the shape that tends to be easily crumbled by a change in exposure condition, namely, the location with small process margin, mask pattern improvements can be made by feeding back the information.

In order to detect the location with the pattern that is readily crumbled by a change in exposure condition, it is necessary to observe a change in pattern shape by two-dimensional shape comparison. However, when the exposure conditions are different, a pattern deformation on the wafer appears not only as a change in local shape but also as a dimension change. Thus, in a method that has conventionally been used for evaluation for determining the process window, even when the configuration is such that a distribution of EPE is observed on a screen, local amounts of deformation may become lost in global amounts of deformation, resulting in the problem of difficulty in capturing a change in shape.

The inventor, considering that the cause of the problem is that the method of "evaluation based on comparison of the contour shape determined from an edge extracted using a predetermined edge extraction parameter and the contour shape determined from design data, with respect to all of images obtained by imaging an evaluation object pattern corresponding to each shot" is not suitable for the purpose of detecting a subtle difference in pattern shape, proposes the present embodiment as a solution example. The details will be described in the following.

Figure 39:
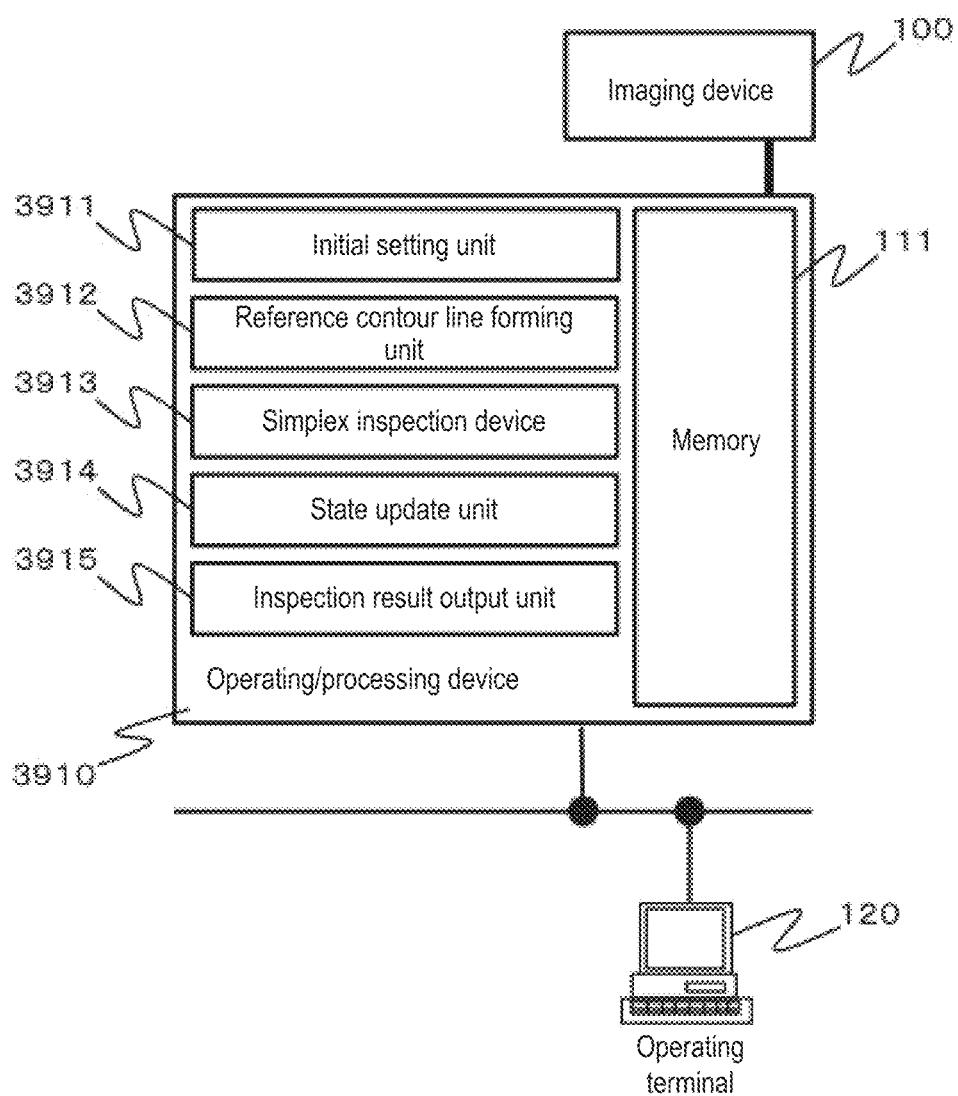
FIG. 39 illustrates a configuration of a pattern inspecting device according to a fifth embodiment.

FIG. 39 illustrates a configuration of a pattern inspecting device according to the present embodiment. In FIG. 39, portions similar to those of FIG. 1 are designated with similar signs in FIG. 1, and their detailed description will be omitted.

Figure 40:
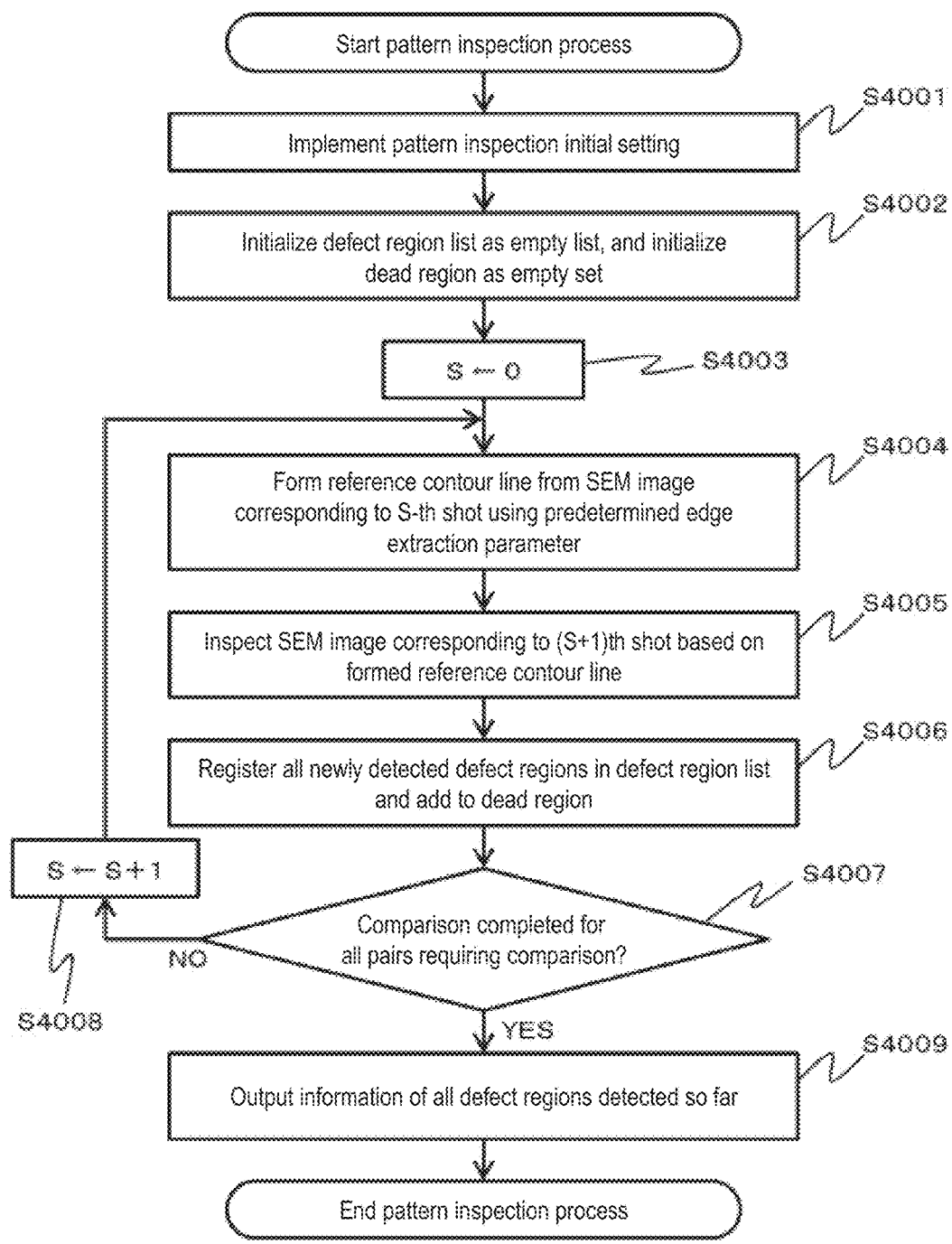
FIG. 40 is a flowchart of an operation of the pattern inspecting device according to the fifth embodiment.

An operating/processing device 3910 according to the present embodiment includes the memory 111; an initial setting unit 3911 that executes the process of step S4001 and the like of FIG. 40; a reference pattern forming unit 3912 that executes the process of step S4004 and the like of FIG. 40; a simplex inspection unit 3913 that executes the process of step S4005 and the like of FIG. 40; a state update unit 3914 that executes the process of step S4002 to S4003 and step S4006 to S4008 and the like of FIG. 40; and an inspection result output unit 3915 that executes the process of step S4009 and the like of FIG. 40. Based on a plurality of SEM images input from the imaging device 100, the pattern formed on the sample 101g is inspected. Information necessary for the processes executed in the operating/processing device 3910 are stored in the memory 111 in the operating/processing device 3910 as an inspection recipe. The recipe includes an operating program for causing the pattern inspecting device to be automatically operated. The recipe may be stored in the memory 111 or an external storage medium for each type of sample as the object of inspection, and read as needed.

The operating/processing device 3910 is also connected to the operation terminal 120. As needed, in response to an input from the operator via the input means of the operation terminal 120, the operating/processing device 3910 modifies the inspection process content or displays an inspection result and the like on the display device of the operation terminal 120. These functions are implemented by a graphical interface called "GUI", for example.

FIG. 40 is a flowchart of an operation of the pattern inspecting device according to the present embodiment.

As the pattern inspection process is started, in step S4001, the initial setting unit 3911 implements initial setting for pattern inspection. Specifically, all of SEM images obtained by imaging an evaluation object pattern on the FEM wafer corresponding to each shot are read, and preprocessing is implemented as needed with respect to the SEM images. The preprocessing includes, for example, a smoothing process for noise removal. The preprocessing may be suitably implemented using known technology.

Then, in step S4002, the state update unit 3914 initializes a defect region list as an empty list, and further initializes a dead region as an empty set.

The defect region list includes information about regions that are finally output as defect regions. For example, in the list, for each region determined to be a defect, the coordinates of the upper-left corner of a circumscribed rectangle of the region determined to be a defect, the width and height of the circumscribed rectangle, and image information and the like in the circumscribed rectangle are registered in association with information indicating "with respect to which SEM image the determination of a defect has been made in the inspection".

The dead region is a region outside the object of inspection in the inspection in step S4005. The region that has once been determined to be a defect due to the influence of exposure condition variation from the optimum exposure condition is subject to a rapid degradation in pattern shape as the exposure condition is further varied. The dead region according to the present embodiment is provided to prevent the inspection process as a whole from being made unstable by including such region as the object of inspection.

Thereafter, in step S4003, the state update unit 3914 sets the value of the counter S, which is a counter for identifying a reference shot, to "0".

In step S4004, using a predetermined edge extraction parameter, the reference contour line forming unit 3912 forms a reference contour line from the SEM image corresponding to the S-th shot. As in the second embodiment, for the purpose of smoothing the generated contour line, the contour line may be formed using a different edge extraction parameter for each edge. As the predetermined edge extraction parameter, a value described in the inspection recipe stored in the memory 111 of the operating/processing device 3910, or a value input from the operator via the input means of the operation terminal 120 may be used.

In step S4005, the simplex inspection unit 3913, based on the reference contour line formed in step S4004, inspects the SEM image corresponding to the (S+1)th shot. The process of step S4005 may be implemented similarly to the pattern inspection process in the pattern inspecting device according to the first embodiment. Because the S-th shot and the (S+1)th shot have close exposure conditions, the pattern shapes are similar at normal portions. Thus, by forming a contour line (length-measuring contour line) using an appropriate edge extraction parameter for each reference edge, only a portion with a different shape can be detected as a defect during the inspection.

In step S4006, the state update unit 3914 registers information concerning all newly detected defect regions in the defect region list, and further adds the all newly detected defect regions to the dead regions.

In step S4007, the state update unit 3914 determines whether the comparison has been completed for all of the pairs requiring comparison, by comparing the value of the counter S with the number of the SEM images (which will be described later) as the object of inspection. If the comparison has been completed for all of the pairs requiring comparison (step S4007: YES), the operating/processing device 3910 proceeds to the process of step S4009. If there is a pair for which the comparison has not been completed (step S4007: NO), the state update unit 3914 proceeds to step S4008 and increases the value of the counter S by "1". Thereafter, the operating/processing device 3910 returns to step S4004 and continues the processing.

In step S4009, the inspection result output unit 3915, with reference to the defect region list, outputs the information about all of the defect regions that have been detected so far. After the process of step S4009, the operating/processing device 3910 ends the pattern inspection process. As the defect region information, in addition to the position and dimension, image information in the region and the like, information about "in the inspection of the SEM image corresponding to what number shot the defect region has been determined" (namely, the value of "S+1" in the flowchart of FIG. 40) is also output. By providing such information, the margin with respect to a change in the exposure condition can be observed for each defect region.

Figure 41:
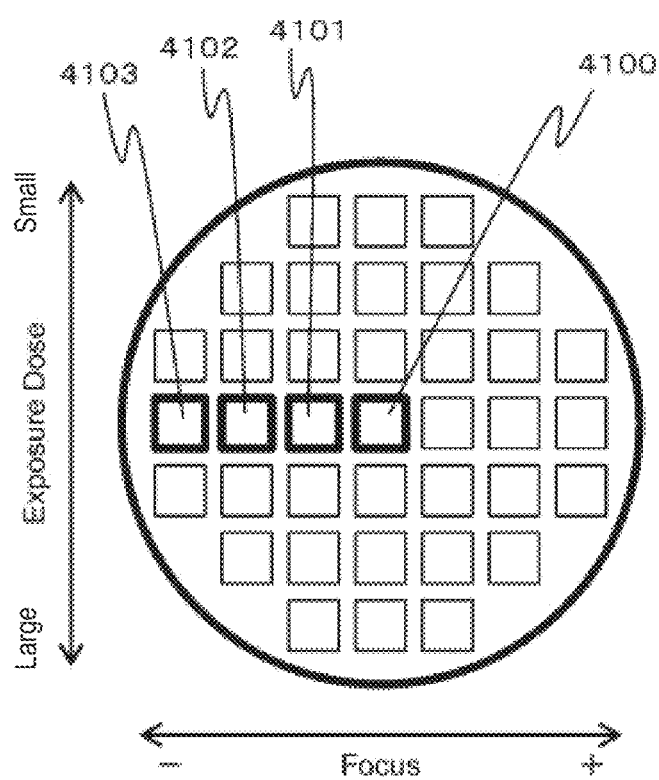
FIG. 41 illustrates an inspection object designating method in the pattern inspecting device according to the fifth embodiment.

FIG. 41 illustrates an inspection object designating method in the pattern inspecting device according to the present embodiment. In the present embodiment, the operator of the operation terminal 120 inputs, on a wafer map for an FEM wafer, for example, information for identifying an SEM image 4100 corresponding to a shot with an optimum focal point position and an optimum amount of exposure, and, of the SEM images to be evaluated, information for identifying an SEM image 4103 at a position spaced apart the most from the SEM image 4100, using an appropriate graphical user interface (GUI) implemented on the operation terminal 120. The operating/processing device 3910, based on the input information and using the initial setting unit 3911, searches for the shortest path connecting the SEM image 4100 and the SEM image 4103. The operating/processing device 3910 then sets the SEM image 4100, an SEM image 4101, an SEM image 4102, and the SEM image 4103 including SEM images on the shortest path as the object of inspection in the pattern inspection process. The shortest path search may be performed by creating a graph connecting, via sides, vertexes corresponding to the SEM images at four vicinity positions, using the SEM images on the FEM wafer corresponding to each shot as the vertexes, using known technology. In the pattern inspection process according to the present embodiment, as will be described later (see FIG. 42), inspection is implemented, in the order along the shortest path and using adjacent SEM images as a pair, with reference to an SEM image closer to the SEM image corresponding to the shot with the optimum focal point position and the optimum amount of exposure.

The information input from the operation terminal 120 may be limited to information for identifying the SEM image 4100 corresponding to the shot with the optimum focal point position and the optimum amount of exposure. With respect to all SEM images on the wafer map of the FEM wafer, the shortest path from the SEM image 4100 may be searched for, and then the pattern inspection process may be implemented along the shortest path.

FIG. 42 illustrates an inspection method in the pattern inspecting device according to the present embodiment.

Figure 42A:
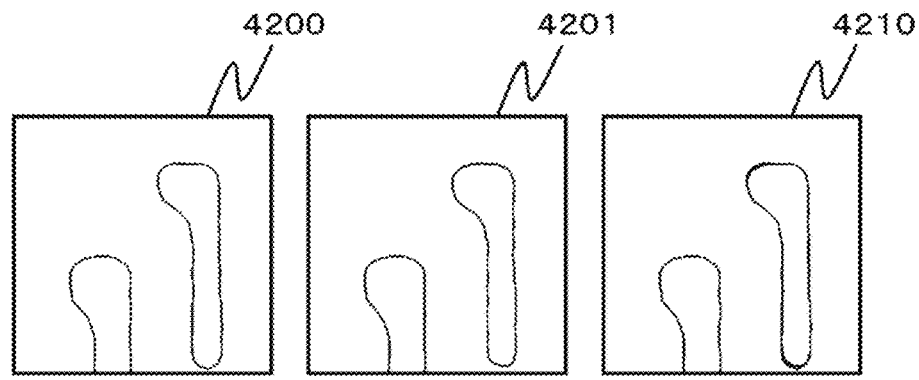
FIGS. 42A-42C illustrate an inspection method in the pattern inspecting device according to the fifth embodiment.

FIG. 42(a) illustrates an example of the process flow of FIG. 40 where the value of S is "0"; namely, the case where the SEM image 4100 and the SEM image 4101 are compared. This is an example where, when a predetermined edge extraction parameter is used, a contour line illustrated by an image 4200 is extracted from the SEM image 4100, while a contour line illustrated by an image 4201 is extracted from the SEM image 4101. In this case, when the contour line extracted from the SEM image 4101 using the contour line extracted from the SEM image 4100 as a reference contour line is drawn superposed on the reference contour line, the state of an image 4210 is obtained, indicating that no defect has been detected.

Figure 42B:
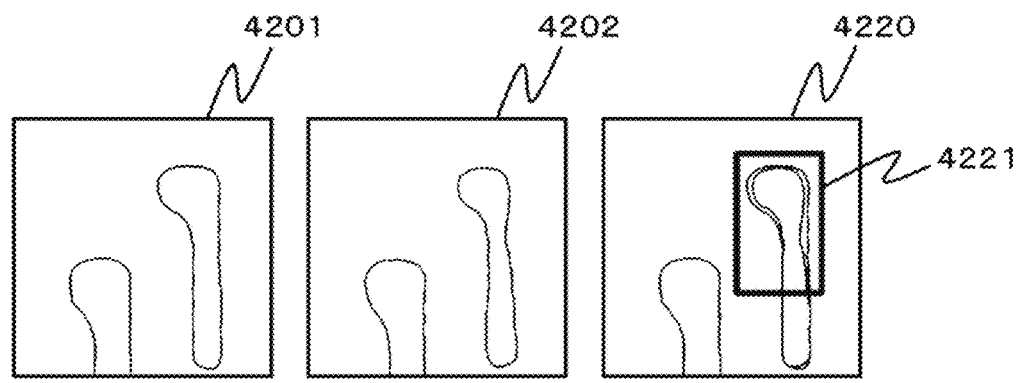

FIG. 42(b) illustrates an example of the process flow of FIG. 40 where the value of S is "1"; namely, where the SEM image 4101 and the SEM image 4102 are compared. This is an example where, when a predetermined edge extraction parameter is used, a contour line illustrated by an image 4201 is extracted from the SEM image 4101, while a contour line illustrated by an image 4202 is extracted from the SEM image 4102. In this case, when the contour line extracted from the SEM image 4102 using the contour line extracted from the SEM image 4101 as a reference contour line is drawn superposed on the reference contour line, the state of an image 4220 is obtained, where a region 4221 is extracted as a defect. Thus, information concerning the region 4221 is registered in the defect region list, and the region 4221 is further added to the dead regions.

Figure 42C:
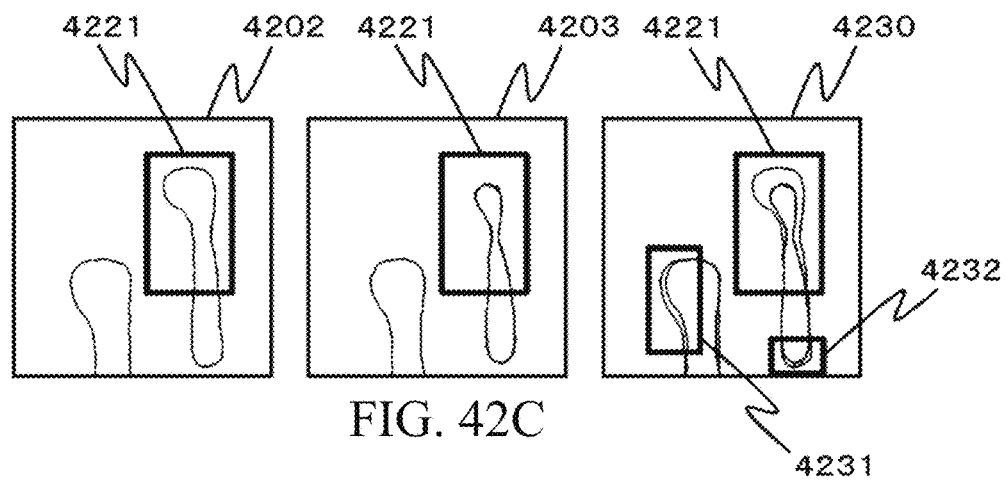

FIG. 42(c) illustrates an example of the process flow of FIG. 40 where the value of S is "2"; namely, where the SEM image 4102 and the SEM image 4103 are compared. This is an example where, when a predetermined edge extraction parameter is used, a contour line illustrated by an image 4202 is extracted from the SEM image 4102, while a contour line illustrated by an image 4203 is extracted from the SEM image 4103. In this case, when the contour line extracted from the SEM image 4103 using the contour line extracted from the SEM image 4102 as a reference contour line is drawn superposed on the reference contour line, the state of an image 4230 is obtained, where a region 4231 and a region 4232 are extracted as defects. However, with regard to a region 4221, because it is a dead region, no defect determination is made. Accordingly, information concerning the region 4231 and the region 4232 is registered in the defect region list, and further the region 4231 and the region 4232 are added to the dead regions.

Thus, according to the present embodiment, inspection is performed by comparing the contour line shapes of the dies of adjacent shots, where contour lines formed using an edge extraction parameter suitable for comparison are used. In this way, local deformation can be detected without being lost in global pattern thickening or thinning.

Further, the region determined to be a defect is set as a dead region for the next inspection, and the SEM image corresponding to each shot is successively evaluated in a direction such that the difference from the optimum condition is increased while the dead region is successively updated. In this configuration, not only the pattern location with the highest risk of defect development, but also a pattern location having a relatively low but a certain degree of the risk of defect development can be automatically analyzed. Thus, mask pattern improvements can be made more efficiently.

When the exposure condition variation range is small and there is only a slight global pattern thickening or thinning, the SEM images corresponding to all shots may be inspected using a reference contour line determined from the SEM image having the optimum exposure condition or a reference contour line determined from the design data.

As in the modification of the second embodiment, a plurality (three or more) of length measuring edges may be determined from the same brightness profile in units of the reference edge, and a plurality of (namely, three or more) length-measuring contour lines may be formed by linking corresponding length measuring edges for evaluation. In this configuration, while the evaluation concerning the respective contour lines is performed each independently, the determination of a defect region is made upon determining a defect region in any one of the length-measuring contour lines, and information about which contour line was used in the inspection in which the defect region was determined is also output.

Modification

While the embodiments of the present invention have been described above, the present invention is not limited to the embodiments. The various configurations of the foregoing embodiments and modifications may be suitably combined and used as needed. In addition, the embodiments may be modified as follows, for example, without departing from the gist of the present invention.

For example, while in the embodiment the SEM image as the object of inspection or measurement is acquired from the imaging device 100, the configuration of the embodiment of the present invention is not limited to the above. For example, in a configuration, the SEM image may be acquired from a storage device such as a hard disk in which the SEM image is stored in advance, or from another system via a network and the like. In another configuration, in addition to the SEM image, information about imaging conditions and the like corresponding to the SEM image may be acquired and utilized for inspection or measurement. In yet another configuration, the design data may also be acquired from another system via a network and the like instead of from the storage device. While in the embodiment the inspection or measurement result is output to the display device of the operation terminal, the embodiment of the present invention is not limited to the above. For example, in a configuration, the inspection or measurement result may be output to a storage device such as a hard disk, or to another system via a network and the like.

In the embodiment, because a threshold value method is used for determining the length measuring edge, a value corresponding to the threshold value for the threshold value method is used with regard to the edge extraction parameter value, too. However, the embodiment of the present invention is not limited to the above. For example, when, as a length measuring edge determination method, a first derivation profile is observed to determine the edge position, a value concerning a first derivation value may also be used for the edge extraction parameter value too.

In the embodiment, as the contour line used for inspection or measurement, a length-measuring contour line is used. However, the embodiment of the present invention is not limited to the above. For example, an obtained length-measuring contour line may be discretized to obtain a set of edges defined in pixel units, and then the edge set may be used for inspection or measurement. In this case, as the information about edges with which each pixel is provided, information about a line segment extending across the pixel (such as sub-pixel accuracy position information about a certain point on the line segment, and vector information indicating the direction of the line segment) may be provided so as to increase the accuracy of the edge position used for inspection or measurement.

Thus, according to the present invention, an edge extraction parameter for extracting an edge from image data obtained by imaging an inspection or measurement object pattern is generated using a reference pattern as a reference for the inspection or measurement and the image data. Then, the inspection or measurement is performed based on the generated edge extraction parameter and using the edge determined from the image data. Thus, during inspection or measurement using the position of the edge extracted from the image data obtained by imaging a pattern as the object of inspection or measurement, the influence of noise and the like can be decreased, and the reliability of an inspection or measurement result can be increased.

REFERENCE SIGNS LIST

100 Imaging device
101 SEM
102 Control device
110 Operating/processing device
111 Memory
112 Initial setting unit
113 Edge extraction parameter generation unit
114 Contour line forming unit
115 Inspection unit
120 Operation terminal
130 Storage device
140 Simulator

The invention claimed is:

1. A pattern inspecting and measuring device that performs inspection or measurement of an inspection or measurement object pattern using a position of an edge extracted, using an edge extraction parameter, from image data obtained by imaging the inspection or measurement object pattern,
the pattern inspecting and measuring device comprising:
a processing device and a non-transitory memory storing a program, wherein the program, when executed by the processing device, causes the processing device to:
acquire the image data of inspection or measurement target pattern,
generate a brightness profile of the image data, at each position of multiple different positions on a reference pattern as a reference for the inspection or a measurement, in a direction intersecting with the edge of the reference pattern,
define an interval for extracting edge extraction parameter of the brightness profile with respect to the edge position of the different object pattern based on the edge of the reference pattern,
set the threshold value for each different position, depending on the difference of the position between the edge of the reference pattern in the defined range and the position that extracts from brightness profile,
extract a new edge for each different position from the brightness profile using a threshold value set for each different position of the object pattern,
compare the edge of the reference pattern and the pattern edge which generates based on the extraction of the new edge and the edge of the reference pattern, and
output the comparison results.

2. The pattern inspecting and measuring device according to claim 1,
wherein:
the reference pattern is configured to include a plurality of reference edges as a point of reference when extracting the edge; and
the pattern inspecting and measuring device generates an edge extraction parameter corresponding to each of the reference edges.

3. The pattern inspecting and measuring device according to claim 2, wherein:
the reference edges are configured to belong to any of pattern figures reflecting a shape of the inspection or measurement object pattern; and
the pattern inspecting and measuring device generates the edge extraction parameter in such a way that edge extraction parameters corresponding to respective reference edges that belong to the same pattern figure are equal to each other.

4. The pattern inspecting and measuring device according to claim 2,
wherein the pattern inspecting and measuring device generates the edge extraction parameter in such a way that edge extraction parameters corresponding to the respective reference edges are equal to each other.

5. The pattern inspecting and measuring device according to according to claim 1, wherein the pattern inspecting and measuring device outputs a statistic concerning the generated edge extraction parameter, or concerning the generated edge extraction parameter.

6. The pattern inspecting and measuring device according to claim 1,
wherein the pattern inspecting and measuring device inspects the inspection or measurement object pattern using the generated edge extraction parameter as an evaluation index.

7. The pattern inspecting and measuring device according to claim 1,
wherein the pattern inspecting and measuring device inputs a minimum value and a maximum value of values that may be taken by the edge extraction parameter,
and generates the edge extraction parameter in such a way that the edge extraction parameter has a value not smaller than the minimum value and not greater than the maximum value.

8. The pattern inspecting and measuring device according to claim 1,
wherein the pattern inspecting and measuring device inputs a maximum value of deviation from a reference value for the edge extraction parameter,
and generates the edge extraction parameter in such a way that an absolute value of a difference between the edge extraction parameter and the reference value is not greater than the maximum deviation.

9. The pattern inspecting and measuring device according to claim 1,
wherein the pattern inspecting and measuring device generates the reference pattern based on a position of an edge extracted from the image data using a previously given second edge extraction parameter.

10. The pattern inspecting and measuring device according to claim 1,
wherein the pattern inspecting and measuring device generates the reference pattern based on an edge position extracted from second image data obtained by imaging a second inspection or measurement object pattern different from the inspection or measurement object pattern in manufacturing process.

11. The pattern inspecting and measuring device according to claim 1,
wherein the pattern inspecting and measuring device generates the reference pattern based on an edge position extracted from second image data obtained by imaging a second inspection or measurement object pattern different from the inspection or measurement object pattern in an exposure condition.

12. The pattern inspecting and measuring device according to claim 1,
wherein the inspection or measurement is performed using information about a distance between the position of the edge and a position on the reference pattern corresponding to the edge position.

13. The pattern inspecting and measuring device according to claim 1,
wherein the reference pattern as a reference for the inspection or measurement is configured to include a plurality of reference edges as a point of reference when extracting the edge,
the pattern inspecting and measuring device implements, with respect to a portion of the reference edge in which the edge corresponding to the reference edge is not present, a process of determining the edge used for the inspection or measurement using a contour line determined with the use of the image data.

14. The pattern inspecting and measuring device according to claim 1,
wherein:
the pattern inspecting and measuring device performs inspection or measurement of an inspection or measurement object pattern formed on the sample using image data obtained by imaging a band-like region on a sample by a charged particle beam scan; and
the charged particle beam scan is performed in a direction inclined with respect to a direction perpendicular to a longitudinal direction of the band-like region.

15. The pattern inspecting and measuring device according to claim 1,
wherein:
the reference pattern as a reference for the inspection or measurement is configured to include a plurality of reference edges as a point of reference when extracting the edge; and
with respect to a profile generated at a position of each of the reference edges, an edge is determined using three or more mutually different edge extraction parameters to form a contour line corresponding to each of the edge extraction parameters, and the inspection or measurement is performed using the three or more contour lines that are formed.

16. A non-transitory computer-readable medium storing executable instructions, the executable instruction when executed by an operating device included in a pattern inspecting and measuring device performs a method for inspection or measurement of an inspection or measurement object pattern using a position of an edge extracted, with the use of an edge extraction parameter, from image data obtained by imaging the inspection or measurement object pattern, the method comprising:
acquiring the image data of inspection or measurement target pattern,
generating a brightness profile of the image data, at each position of multiple different positions on a reference pattern as a reference for the inspection or a measurement, in a direction intersecting with the edge of the reference pattern,
defining an interval for extracting edge extraction parameter of the brightness profile with respect to the edge position of the different object pattern based on the edge of the reference pattern,
setting the threshold value for each different position, depending on the difference of the position between the edge of the reference pattern in the defined range and the position that extracts from brightness profile, extracting a new edge for each different position from the brightness profile using a threshold value set for each different position of the object pattern, comparing the edge of the reference pattern and the pattern edge which generates based on the extraction of the new edge and the edge of the reference pattern, and outputting the comparison results.

\* \* \* \* \*